US009573807B1

(12) United States Patent
Kaufman et al.

(10) Patent No.: US 9,573,807 B1
(45) Date of Patent: Feb. 21, 2017

(54) MANAGED PRINT SERVICE AUTOMATED AND INTEGRATED SYSTEM

(75) Inventors: Michelle Therese Weaver Kaufman, St. Louis, MO (US); Joachim Landes, Newberg, OR (US); Mark White Montgomery, Weldon Spring, MO (US); Travis Edward Cottrell, St. Charles, MO (US); Bernard Raphael Kister, Chesterfield, MO (US); Ronald Harold Alphin, Imperial, MO (US); Douglas Lee Johnson, Sedona, AZ (US)

(73) Assignee: Distribution Management, Inc., St. Charles, MO (US)

( * ) Notice: Subject to any disclaimer, the term of this patent is extended or adjusted under 35 U.S.C. 154(b) by 1077 days.

(21) Appl. No.: 13/272,088

(22) Filed: Oct. 12, 2011

Related U.S. Application Data

(60) Provisional application No. 61/392,521, filed on Oct. 13, 2010.

(51) Int. Cl.
*G06Q 10/00* (2012.01)
*B82Y 25/00* (2011.01)
*G01R 33/09* (2006.01)
*G11B 5/39* (2006.01)

(52) U.S. Cl.
CPC ............. *B82Y 25/00* (2013.01); *G01R 33/093* (2013.01); *G11B 5/3929* (2013.01); *Y10T 428/1114* (2015.01); *Y10T 428/1143* (2015.01)

(58) Field of Classification Search
None
See application file for complete search history.

(56) References Cited

U.S. PATENT DOCUMENTS

| 5,077,582 | A | 12/1991 | Kravette et al. |
| 5,305,199 | A | 4/1994 | LoBiondo et al. |
| 5,333,286 | A | 7/1994 | Weinberger et al. |
| 5,361,265 | A | 11/1994 | Weinberger et al. |
| 5,603,060 | A | 2/1997 | Weinberger et al. |
| 6,009,284 | A | 12/1999 | Weinberger et al. |
| 6,275,664 | B1 | 8/2001 | Wolf et al. |
| 6,282,383 | B1 | 8/2001 | Weinberger et al. |
| 6,529,692 | B1 | 3/2003 | Haines et al. |
| 6,782,495 | B2 | 8/2004 | Bernklau-Halvor et al. |

(Continued)

*Primary Examiner* — Fateh M Obaid
(74) *Attorney, Agent, or Firm* — CreatiVenture Law, LLC; Dennis J M Donahue, III

(57) ABSTRACT

A managed print service (MPS) system is used to analyze the costs associated with creating hardcopies on document output devices in end user customer environments, develop proposals to optimize the placement and use of document output devices based on the end user customer's desired workflow, and manage the resulting optimized document output device fleet in the replenishment of supplies. MPS providers can also use the system to manage break/fix services to maintain the uptime, or availability, of the fleet of document output devices. The system provides a predictive supplies replenishment module that accounts for variations in user behaviors when determining whether a replacement supply is needed and identifies replacement supplies according to multiple trigger thresholds that are based on calculations of the remaining days of the supplies in the devices. The system also provides device-specific routing labels for different supply parts that are sent to the same shipping address.

22 Claims, 47 Drawing Sheets

(56) References Cited

U.S. PATENT DOCUMENTS

| | | |
|---|---|---|
| 6,965,931 B2 | 11/2005 | Helms |
| 7,043,523 B2 | 5/2006 | Haines et al. |
| 7,127,433 B2 * | 10/2006 | Baker .......................... 705/400 |
| 7,383,474 B2 * | 6/2008 | Sekizawa ...................... 714/57 |
| 7,417,753 B2 | 8/2008 | Weinberger et al. |
| 2002/0002492 A1 * | 1/2002 | Okazawa ...................... 705/14 |
| 2002/0097444 A1 * | 7/2002 | Shibata ........................ 358/402 |
| 2004/0249655 A1 * | 12/2004 | Doeberl et al. .................. 705/1 |
| 2008/0186871 A1 | 8/2008 | Trevino et al. |
| 2008/0273224 A1 | 11/2008 | Maulsby et al. |
| 2009/0112738 A1 * | 4/2009 | Nagata ............................ 705/28 |
| 2009/0147299 A1 | 6/2009 | Tetu |

* cited by examiner

Managed Print Model Search

| Model | Device Type | List Price | # of Entries | Source |
|---|---|---|---|---|
| HP LaserJet 4250 Series | Laser Printer | 899.0000 | 3036 | DMINE |
| HP LaserJet 4200 Series | Laser Printer | 999.0000 | 1485 | DMINE |
| HP LaserJet 4050 Series | Laser Printer | 1099.0000 | 1400 | DMINE |
| HP LaserJet 4100 | Laser Printer | 1099.0000 | 1293 | DMINE |
| HP LaserJet P2015 | Laser Printer | 349.0000 | 1216 | DMINE |
| HP LaserJet 4000 | Laser Printer | 1099.0000 | 1147 | DMINE |
| HP LaserJet 1320 | Laser Printer | 399.0000 | 993 | DMINE |
| HP LaserJet P3005 | Laser Printer | 549.0000 | 883 | DMINE |
| HP LaserJet P4015 | Laser Printer | 1199.0000 | 705 | DMINE |
| HP LaserJet 4350 Series | Laser Printer | 1649.0000 | 663 | DMINE |
| HP LaserJet 2300 | Laser Printer | 599.0000 | 497 | DMINE |
| HP LaserJet 2420 | Laser Printer | 549.0000 | 459 | DMINE |
| HP LaserJet 1022 | Laser Printer | 299.9900 | 452 | DMINE |
| HP LaserJet 4300 | Laser Printer | 1399.0000 | 446 | DMINE |
| HP LaserJet 1200 | Laser Printer | 299.0000 | 413 | DMINE |
| HP LaserJet P2055dn | Laser Printer | 399.0000 | 409 | DMINE |
| HP LaserJet P1505n | Laser Printer | 249.9900 | 396 | DMINE |
| HP LaserJet 2100 | Laser Printer | 699.0000 | 354 | DMINE |

742 items found

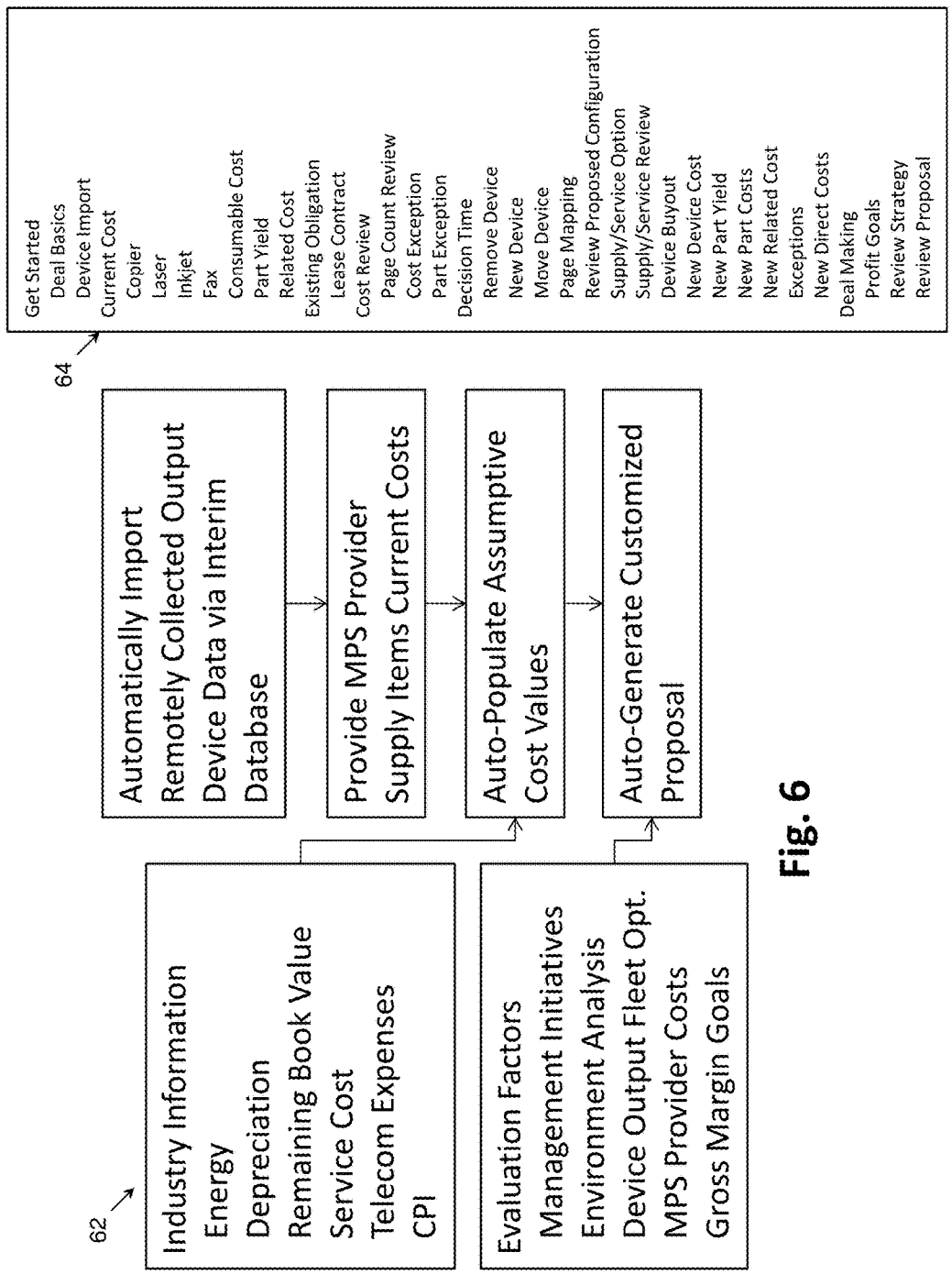

Imported Devices

The purpose of this screen is to pull into the Proposal One Tool all devices and their usage and other relevant data from the data collection software (Print Fleet or FM Audit) for the period of time selected. In addition, this screen assigns a device type, if recognized, and if unrecognized users can select from the drop down menu provided. Import all devices for this Customer for the Database
Enter a period for which to capture data for (if the date fields are left empty then the import routine takes all the data that is available.)
Meter reads are available from 2/20/2010 To 8/25/2011

Start Date: _____  End Date: _____

Import

Last Import: By dealer@myprintermanager.com On 8/19/2011 9:10:01 AM

Apply Filter
Device Type: (ALL)  IP Address: _____  Serial #: _____  Device Location: _____

Show: Duplicates  All  Include Ignored Devices  Exclude Local Devices

Apply Filter | Clear Filter

Imported Devices
Ignore All

Submit | Discard

| Device | Device Type | Serial # | IP Address | Local | Ignore | Invalid | Notes |
|---|---|---|---|---|---|---|---|
| 1 2 | | | | | | | |
| HP Color LaserJet CP4005 1F26<br>Laser Printer<br>S#: JPRLB66413 | Laser Printer | JPRLB66413 | 10.1.31.38 | ☐ | ☐ | ☐ | ✚ ✕ |
| hp color LaserJet 9500 2024<br>Laser Printer<br>S#: JPNJB04069 | Laser Printer | JPNJB04069 | 10.1.32.36 | ☐ | ☐ | ☐ | ✚ ✕ |
| hp LaserJet 4250 1F23<br>Laser Printer<br>S#: USBXS24064 | Laser Printer | USBXS24064 | 10.1.31.35 | ☐ | ☐ | ☐ | ✚ ✕ |

Current Part/Consumable Cost

The purpose of this screen is to show all unique consumables used or defined for use by device. The user can choose to utilize provided assumptive values, or to override with the actual customer costs (price the end-user currently pays for the items). Consumables that are not currently loaded in the Proposal One tool will be blank and require user input.

Apply Filter
Part #:

Apply Filter | Clear Filter

Part Costs

Submit | Discard

| Part # | Description | Compatible | Ship-To Location | System Street Price $ | Street Price $ | Invalid | Notes |
|---|---|---|---|---|---|---|---|
| C4118 | HP LaserJet 4000/4050 Series Maintenance Kit (120V)(Includes Fuser Assembly, Transfer Roller, 6 Pick-up/Separation Rollers, MP Tray/Tray 1 Pickup Roller, Vinyl Gloves & Instruction Manual) (200,000 Yield) | ☐ | Primary | $266.00 | $266.00 | | ✎ ✗ |
| C4127X | HP 27X LaserJet 4000/4050 Series Ultraprecise Print Cartridge (10,000 Yield)(75/Pallet) | ☐ | Primary | $157.98 | $157.98 | | ✎ ✗ |

Fig. 12

Ship-To Locations

The purpose of this screen is to view and add any necessary additional ship-to locations for the environment to account for variations in energy or consumable supplies cost. Note this is for physical shipping addresses only and not specific device locations (example: 1st floor, office #, etc.)

Deal Locations

Add Ship-To Location | Submit | Discard

| Title | $/kwh | Invalid | Notes |
|---|---|---|---|
| Primary | $0.0000 | | ✎ ✗ |
| DC | $0.2000 | | ✎ ✗ |

Current Related Costs

The purpose of this screen is to list any indirect or Related costs that the end user incurs as it relates to printing in their current environment. Please note these are monthly amounts.

| Description | Monthly Cost $ | Notes |
|---|---|---|
| IS Staffing | $500.00 | ✏ ✗ |
| Admin Staffing | $140.00 | ✏ ✗ |
| Other | | ✏ ✗ |

Submit | Discard

Fig. 16

Current Lease Contracts

The purpose of this screen is to review devices that are currently under a lease contract and to enter detailed information about the existing lease(s).

Apply Filter
IP Address: [ ]
Serial #: [ ]
Device Location: [ ]
Ship-To Location: [ ]
Device Type: [ALL]

☐ Include Ignored Devices

Lease Contracts
☐ Select All

| | Device | Start Date | # Months | Rate | Equipment Fee | Total Lease Price | Standard Payment | |
|---|---|---|---|---|---|---|---|---|
| ☐ | HP Color LaserJet CP4005 1525 Laser Printer S/N JPR1 R6641S | | | | | | | ✏ ✗ |
| ☐ | Dell XPS XXXX XXXXX XXXXXX | 10/1/2008 | 36 | | $400.00 | $175.00 | | |
| ☐ | Canon IM898 98 1h 12" Copier | 10/1/2008 | 36 | | $500.00 | $175.00 | $1,175.00 | ✏ ✗ |

Map Page Count for device

The purpose of this screen is to account for any pages that will be mapped from existing devices to other or new devices. The grid on the left side of the screen lists all devices that are existing (keep as well as replace). The grid on the right hand side lists all existing devices that were not marked as removed as well as any new devices. This allows users to map page volume from one printer to another. Pages can be moved from one to many other devices (and vice versa) or from one to only one other device.

Devices that can have pages mapped away
Apply Filter
IP:    Serial #:    Location:    Ship-To: (ALL)

Type: (ALL)    ☑ Include completely mapped Devices    [Apply Filter] [Clear Filter]

| ☐ | Device | Device Decision | Mono Pgs | Color Pgs |
|---|--------|-----------------|----------|-----------|
| 1 2 | | | | |
| ☐ | HP Color LaserJet CP4025 1F25<br>Laser Printer<br>S/#: JPRLB66413 | Keep | 1549 | 5196 |
| ☐ | hp color LaserJet 9500 2024<br>Laser Printer<br>S/#: JPNJB04069 | Remove | 2086<br>Undo | 81722<br>Undo |
| ☐ | hp LaserJet 4250 1F23 | Keep | 8064 | 0 |

Devices to map pages to
Apply Filter
IP:    Location:    Ship-To: (ALL)

Type: (ALL)    [Apply Filter] [Clear Filter]

| ☐ | Device | New ▼ | Mono Pgs | Color Pgs | Recommended pages |
|---|--------|-------|----------|-----------|-------------------|
| 1 2 | | | | | |
| ☐ | HP LaserJet M4345 MFP<br>Laser Printer | ☑ | 5000 | 0 | 20000 |
| ☐ | Konica Minolta bizhub /51<br>Copier | ☑ | 10000 | 0 | 30000 |
| ☐ | HP Color LaserJet | ☐ | 1650 | 11609 | 8000 |

[Map Pages >]    [Submit] [Discard]

Fig. 22

Split Page Volume

| Device | Pages to Map Mono | Mapped Pages Mono |
|--------|-------------------|-------------------|
| DeviceName<br>Laser Printer<br>S/#: JPR_B66413<br>Max Page Count: 20000<br>Current Page Count: 6745 | 1549 | DeviceName<br>Laser Printer<br>Max Page Count: 20000<br>Current Page Count: 5000<br>DeviceName<br>Copier<br>Max Page Count: 30000<br>Current Page Count: 10000 |

[Apply] [Cancel]

Fig. 23

Hardware & Page Count Mapping Review

The purpose of this screen is to review decisions made thus far in regards to removing, moving, adding, and mapping pages for devices.

Mapped Pages

| Device | Device Decision | Mono Pgs Orig | Mono Pgs | Color Pgs Orig | Color Pgs | Mapping |
|---|---|---|---|---|---|---|
| HP Color LaserJet CP4005 1F26<br>Laser Printer<br>S#: JPRLB66413 | Keep | 1549 | 1650 | 5195 | 11609 | |
| hp color LaserJet 9500 2024<br>Laser Printer<br>S#: JPNJB04069 | Remove | 2182 | 2086 | 95940 | | 91722 96 mono pages mapped to HP Color LaserJet CP4005dn (S#:JPRLB66413)<br>4218 color pages mapped to HP Color LaserJet CP4005dn (S#:JPRLB66413) |
| hp LaserJet 4250 1F23<br>Laser Printer<br>S#: USBXS24064 | Keep | 3084 | 3084 | | | |

Fig. 24

Supply & Service Decision, Step 1: Buy Type Decision

The purpose of this screen is to make decisions about the configuring for the new proposed environment. Use radio buttons and text boxes to enter desired decisions.
Note: The Consumable Part selection is made by SN when "CPI SN" Buy Type is chosen. This selection may include a mix of both OEM and Compatible consumable parts. This section includes a listing of devices that are navigated using the 'Next' and 'Previous' buttons of the directions below.

Buy Type | CPI Supplies | A La Carte Parts | Services | Incentives | Reviews

Apply Filter
IP:                  Serial #:                 Location:                 Ship-To: (ALL)         Device Type: (ALL)
                                                                                        Apply Filter | Clear Filter Buy Type
Batch Edit   Select All                                                 Previous | Next | Discard
                                                                                                Finalize

| Edit | Device | Buy Type | Toner Supply Decision | Consumables Part Decision |
|---|---|---|---|---|
| 1 2 | HP Color LaserJet 2605dn 1F94<br>Laser Printer<br>DOPGLU265DN_1F94 S#4 S#: CNH07801W3 | ○ CPI SN<br>○ CPI Reseller<br>○ A La Carte | ○ Compatible<br>OEM | |
| | HP Color LaserJet 3800 1F3B<br>Laser Printer<br>S#: JPWCX056911 | CPI SN<br>○ CPI Reseller<br>A La Carte | ○ Compatible<br>OEM | ○ Compatible<br>OEM |
| | HP Color LaserJet C3525 2064<br>Laser Printer<br>S#: CNC822B4S | CPI SN<br>○ CPI Reseller<br>○ A La Carte | ○ Compatible<br>OEM | Compatible<br>○ OEM |

Supply & Service Decision, Step 3: Part# Decision for A La Carte Devices

The purpose of this screen is to make decisions about the offering for the new proposed environment. Use radio buttons and text boxes to enter desired decisions. This section includes a series of screens that are navigated using the "Next" and "Previous" buttons or the direct links below.

| Buy Type | CPI Supplies | A La Carte Parts | Services | Break/Fix | Review |

Apply Filter
IP:                          Serial #:                          Location:                          Ship-To: (ALL) [▼]    Device Type: (ALL) [▼]

Apply Filter    Clear Filter

Supply Decisions for A La Carte Devices
Batch Edit    Select All

Previous    Next    Discard

| Edit | Device | Supplies | Toner/Consumable Parts | | Invalid |
|---|---|---|---|---|---|
| | HP Color LaserJet CP3525 2084<br>Laser Printer<br>S#: CNCC93J04S | Toner: Compatible<br>Consumable Part: OEM | Black Toner/Ink/Wax | 500-CE250X | |
| | | | Cyan Toner/Ink/Wax | 500-CE251A | |
| | | | Magenta Toner/Ink/Wax | 500-CE253A | |
| | | | Yellow Toner/Ink/Wax | 500-CE252A | |
| | | | Black/Mono Developer Unit | | |
| | | | Black/Mono Imaging Drum (opc) | | |
| | | | Charge Roll Kit | | |
| | | | Color Imaging Drum (opc) | | |
| | | | Cyan Imaging Drum (opc) | | |
| | | | Document Feed Kit | | |
| | | | Fuser Kit | | |
| | | | Magenta Developer Unit | | |
| | | | Magenta Imaging Drum (opc) | | |

New Device Costs

The purpose of this screen is to list new devices and associated costs for the proposed solution.

End Of Term Buyout Option: $1 Out [▼] Notes: 🖉 ✗

New Device Costs

[ Batch Edit ]  Select All                                                                                                          [ Update Totals ] [ Submit ] [ Discard ]

| Edit | # Device | Device Type | Device Model | Status | Cost $ | Street Price $ | Shipping $ | Setup Supplies $ | Stock Supplies $ | Extra $ | Total Costs | MSRP $ | Total MSRP $ | Equip. GP% | Inv. |
|------|----------|-------------|--------------|--------|--------|----------------|------------|------------------|------------------|---------|-------------|--------|--------------|------------|------|
|      | 1        | Laser Printer | HP LaserJet M4345 MFP | Refurbished | $1,500.00 | $2,500.00 | $100.00 | $150.00 |  |  | $1,750.00 | $6,000.00 | $5,000.00 |  | $1 Out MSRP |
|      | 1        | Copier | Konica Minolta bizhub 751 | New | $12,500.00 | $27,000.00 | $100.00 | $150.00 |  |  | $12,800.00 | $25,000.00 | $35,000.00 |  | $52,500.00 |

2 row(s)

| Equipment: |  | Total Cost |
|---|---|---|
| New Equipment |  | $12,800.00 |
| C6 Refurbished Equipment |  | $0.00 |
| Refurbished Equipment |  | $1,750.00 |
| Sub Totals |  | $14,550.00 |
| Grand Totals (Includes financed Direct Costs) |  | $14,750.00 |

|  | Total MSRP |
|---|---|
|  | $35,000.00 |
|  | $0.00 |
|  | $5,000.00 |
|  | $40,000.00 |

| FMV MSRP | $43,750.00 |
| | $0.00 |
| | N/A |

Deal MSRP For Financing: $55,000.00

New Part Yield

The purpose of this screen is for the user to review listed consumable yields, and change or provide more information where necessary.

Apply Filter
Part #:

Part Yields

| Batch Edit | Select All | | | Apply Filter | Clear Filter |
| --- | --- | --- | --- | --- | --- |
| | | | | Submit | Discard |
| Edit | Part # | Description | | Yield | Invalid |
| | 150-T620 | T620/622 Toner (OEM# 12A6835 & 12A6765) (30,000 Yield) (Compliant) (Lexmark Engines Only) | | 30000 | |
| | CE484A | HP Color LJ CM3530 MFP/CP3525 Series Fuser Maintenance Kit (110V) (150,000 Yield) | | 150000 | |

Fig. 34

New Part Cost

The purpose of this screen is to input or correct, if necessary, the cost of the supplies to the dealer as well as the expected GP%. currently available prices can be imported from SN by clicking either "Load Special SN Prices" or "Load Std SN Prices" button. The standard pricelist costs are the discounted / contracted HP OEM pricing. In order to be eligible for this pricelist (once the contract is live) there must be a minimum one year OEM contract in place. The standard pricelist also contains the Private Label Compatible pricelist. If you wish to use a pricelist other than what is listed above please click the Load Spec'al SN Prices button and enter the appropriate pricelist id. Contact the SN DPS team and the appropriate pricelist id will be given to you.

You can also import a list of costs you wish to use independent of Supplies Network's pricing by clicking the "Import Default Part Cost" button. Once imported, apply the costs by using the "Apply Default Part Cost" button.

Apply Filter
Part #:

New Part Costs

| Batch Edit | Select All | | Load Std. SN Price | Load Special SN Price | Import Default Part Cost | Apply Default Part Cost | Apply Filter | Clear Filter |
| --- | --- | --- | --- | --- | --- | --- | --- | --- |
| | | | | | | | Submit | Discard |
| Edit | Part # | Description | | | | Dealer Cost | GP % | Invalid |
| | 150-T620 | T620/622 Toner (OEM# 12A6835 & 12A6765) (30,000 Yield) (Compliant) (Lexmark Engines Only) | | | | $350.00 | 10.00 % | |
| | CE484A | HP Color LJ CM3530 MFP/CP3525 Series Fuser Maintenance Kit (110V) (150,000 Yield) | | | | $150.00 | 10.00 % | |
| | CE252A | HP Color LJ CM3530 MFP/CP3525 Toner Collection Unit (36,000 Yield) (2/6-Pallet) | | | | $150.00 | 10.00 % | |

Fig. 35

New Related Costs

The purpose of this screen is to enter in any related costs associated with the new proposed environment (likely this will be a lower amount than the current environment, as the program should save the customer money) or related costs.

| | | Submit | Discard |
| --- | --- | --- | --- |
| Description | Monthly Cost | Notes | |
| IS Staffing | $250.00 | | 🖉 ✕ |
| Admin Staffing | $100.00 | | 🖉 ✕ |
| Other | $2.00 | | 🖉 ✕ |

Fig. 36

New Exceptions

The purpose of this screen is to review any outstanding exceptions as it pertains to the proposed environment. Problems include missing Device Decisions, Part Cost, and Yield problems.

Apply Filter
IP Address:                Device Location:              Serial #:              Ship-To Location:   Device Type:
                                                                                (ALL)               (ALL)
                                                                                        Apply Filter    Clear Filter

| Device | Exception |
|---|---|
| 1 | |
| hp color LaserJet 9500 2024<br>Laser Printer<br>S#: JPWJEQ4065 | 2086 (Mono and 91722 Color page(s) remaining on device to be removed. |
| hp LaserJet 4250 1F1A<br>Laser Printer<br>S#: CNRXR47795 | Over utilized (189 %). |
| HP LaserJet M1522nf MFP 1F80<br>Laser Printer<br>(989 Xerox Copy Room) S#: CND89QR066 | Over utilized (180 %). |

Fig. 37

New Direct Costs

The purpose of this screen is to enter in any Direct costs associated with the new proposed environment (likely it will be a lower amount than the current environment as the program should save the customer money on Direct costs).

New Direct Costs

Submit   Cancel

| Cost Type | Units | Cost $ | Bill Freq | Cost Total | Finance | Price $ | Price Total | Notes |
|---|---|---|---|---|---|---|---|---|
| Training | 2 Hour(s) | $100.00 /Hour | One-Time | $200.00 | | | | |
| Network Setup | 2 Hour(s) | $100.00 /Hour | One-Time | $200.00 | | | | |
| Assessment | 1 Hour(s) | $0.00 /Hour | One-Time | $0.00 | | | | |
| Installation | 1 Hour(s) | $0.00 /Hour | One-Time | $0.00 | | | | |
| Hardware Move | 1 Move(s) | $0.00 /Move | Annually | $0.00 | | $0.00 /Move | $0.00 | |
| Free PrintIntelligence | 1 User(s) | $0.00 /User | Monthly | $0.00 | | $0.00 /User | $0.00 | |
| DocSolid - Installation | 1 | $0.00 | One-Time | $0.00 | | $0.00 | | |
| DocSolid - Maintenance | 1 | $0.00 | Annually | $0.00 | | $0.00 | $0.00 | |
| DocSolid - Fee | 1 MFP(s) | $0.00 /MFP | Monthly | $0.00 | | $0.00 /MFP | $0.00 | |
| Other Direct 1 | 1 Unit(s) | $0.00 /Unit | Monthly | $0.00 | | $0.00 /Unit | $0.00 | |
| Other Direct 2 | 1 Unit(s) | $0.00 /Unit | Monthly | $0.00 | | $0.00 /Unit | $0.00 | |
| Other Direct 3 | 1 Unit(s) | $0.00 /Unit | Monthly | $0.00 | | $0.00 /Unit | $0.00 | |

Device Configuration Cost Review

This screen lists out all devices that are being proposed in this scenario. Costs are shown per device; no prices yet since we have not defined markups for services.

Apply Filter

IP:  Serial #:  Location:  Ship-To: (ALL) ▼  Device Type: (ALL) ▼

Apply Filter  Clear Filter

Resulting Configuration

| Device | Device Decision Type | Buy Type ▲ | Mono Pages | Color Pages | New Monthly Cost | New Mono Cost | New Mono CPI | New Mono Cost | New Color Cost | New Color CPI |
|---|---|---|---|---|---|---|---|---|---|---|
| HP Color LaserJet CP3525 2084 *Laser Printer* SN: CNCC92J843 | Keep | ALa Carte | 5257 | 60666 | $4,300.26 | $109.25 | $0.0175 | $4,191.01 | | $0.0691 |
| HP Color LaserJet 3600 1F2B *Laser Printer* SN: JPNKCXQ3511 | Keep | CP Reseller | 2011 | 12441 | $419.58 | $24.12 | $0.0105 | $389.45 | | $0.0200 |
| Konica Minolta bizhub 751 *Copier* | New | CPI Reseller | 10000 | | $90.50 | $90.50 | $0.0091 | | | |
| HP Color LaserJet CP4005 1-26 *Laser Printer* SN: JPRLB86413 | Keep | CP SN | 1650 | 11600 | $815.41 | $26.83 | $0.0163 | $788.58 | | $0.0679 |
| hp LaserJet 4250 1F23 *Laser Printer* SN: USBXS24864 | Keep | CPI SN | 8084 | | $50.60 | $50.60 | $0.0063 | | | |

Fig. 38

Deal Financials

The purpose of this screen is to allow users to enter desired margins on financed deals as well as review summary information provided specific to the proposed solution. For non-financed deals only the latter applies.
Deal Length must be specified regardless of finance information.
Deal Financials

| Markup Information | Finance Information |

| | |
|---|---|
| Global GP %: | |
| Toner Supplies OEM GP %: | |
| Toner Supplies Compatible GP %: | |
| Consumable Part OEM GP %: | |
| Consumable Part Compatible GP %: | |
| Services & Break/Fix Service GP %: | 35.00 % |

| | Update | Discard |

Deal/Finance Length (months): 36

Dealer Summary:

End-user Total Cost:                              $114,027.92

Pages Included:
  Total:    4144657
  Mono:     3451033
  Color:     693634

Equipment Finance Charges                           $828.46
Dealer Service & Supply Cost                     $75,086.65
Ongoing Costs:                                       $0.00
EDS Page Fee:

Type:                                                N/A
Initial Charge:                                      N/A
Monthly Charge:                                      N/A
Charge/Page:

Monthly Dealer Profit:                           $38,112.81

Fig. 39A

Markup Information | Finance Information $1 buyout lease rates

| Finance Terms | $1,000.00 - $4,999.99 | $5,000.00 - $14,999.99 | $15,000.00 - $24,999.99 | $25,000.00 - $49,999.99 | $50,000.00 - $99,999.99 | $100,000.00 - $250,000.00 |
|---|---|---|---|---|---|---|
| 12 | 0.0990 | 0.0965 | 0.0954 | 0.0944 | 0.0942 | 0.0940 |
| 24 | 0.0529 | 0.0502 | 0.0501 | 0.0499 | 0.0497 | 0.0496 |
| 36 | 0.0368 | 0.0341 | 0.0339 | 0.0338 | 0.0336 | 0.0334 |
| 39 | 0.0343 | 0.0322 | 0.0320 | 0.0317 | 0.0315 | 0.0313 |
| 42 | 0.0335 | 0.0308 | 0.0301 | 0.0300 | 0.0297 | 0.0296 |
| 48 | 0.0309 | 0.0273 | 0.0269 | 0.0268 | 0.0266 | 0.0265 |
| 60 | 0.0289 | 0.0229 | 0.0222 | 0.0221 | 0.0217 | 0.0215 |
| 63 | 0.0260 | 0.0217 | 0.0214 | 0.0213 | 0.0212 | 0.0207 |

Max Financeable Amt: $55,000.00
Initial Equipment Cost: $14,750.00
Obligation Payoff:
EDS Initial Charge: $2,150.00

Dealer Profit: based on New Equipment GP% in Device Cost Screen $7,538.46
Resulting Equipment GP%: 35.00 %
$ Amt to Finance: $24,438.46
Rate Factor: 0.0339

Monthly Finance Payment: $828.46

Fig. 39B

Deal Financials

The purpose of this screen is to allow users to enter desired margins on financed deals as well as review summary information provided specific to the proposed solution. For non-financed deals only the latter applies.
Deal Length must be specified regardless of finance information.
Deal Financials

Markup Information

| | |
|---|---|
| Global GP %: | 0.00 % |
| Toner Supplies OEM GP %: | |
| Toner Supplies Compatible GP %: | |
| Consumable Part OEM GP %: | |
| Consumable Part Compatible GP %: | |
| Services & Break/Fix Service GP %: | |

Update    Discard

Deal/Finance Length (months):

Dealer Summary:

| | | |
|---|---|---|
| End user Total Cost: | | $6,990.48 |
| | Pages Included: | |
| | Total: 266428 | |
| | Mono: 222401 | |
| | Color: 44027 | |
| Equipment Finance Charges | | $7,200.30 |
| Dealer Service & Supply Cost | | $0.00 |
| Ongoing Costs: | | |
| EDS Page Fee: | Type: N/A | |
| | Initial Charge: N/A | |
| | Monthly Charge: N/A | |
| | Charge/Page: | |
| Monthly Dealer Profit: | | ($209.82) |

Fig. 39C

Strategy

The purpose of this screen is to show a comparison between the end user's current environment and the new proposed environment along with projected savings. This screen also reviews the dealer's costs to implement the proposed solution.

Strategy

| | Current Price | New Proposed Price | Dealer Costs |
|---|---|---|---|
| Supplies: | $172,260.93 | $113,199.46 | $75,086.65 |
| Existing Lease: | $900.00 | | |
| New Lease Payment: | | $828.46 | $828.46 |
| Service: | $1,628.50 | | |
| Ongoing Costs: | | $0.00 | $0.00 |
| Total Invoice Cost: | $174,789.43 | $114,027.92 | $75,915.11 |
| Depreciations: | $1,167.17 | $1,035.81 | |
| Energy | | | |
| Telecom: | | | |
| IS Staffing: | $500.00 | $250.00 | |
| Admin Staffing: | $140.00 | $130.00 | |
| Other Costs: | | $0.00 | |
| Total Operation Cost: | $176,596.60 | $115,443.73 | |
| Proposed Savings: | Monthly: | $60,731.51 | |
| | Annually: | $729,138.12 | |
| | Contract Length (35 months): | $2,127,414.36 | |

Included Page Counts:

| | |
|---|---|
| Mono: | 3451033 |
| Color: | 693634 |
| Total: | 4144667 |

Resulting CPI Values:

| | |
|---|---|
| Mono CP Cost: | $0.0164 |
| Color CP Cost: | $0.1418 |

Non-Financed One-Time Upfront Costs

| | |
|---|---|
| Training | $200.00 |
| Total One-Time Upfront Cost: | $200.00 |

Fig. 40

Proposals

The purpose of this screen is to allow users to select and tailor all relevant components of the Proposal and Non-Disclosure Agreement Schedules with meter reads are available for downloading. Select a specific date for which you would like the meter reads or leave the Date blank to retrieve Devices without meter readings. Selecting a date will also update the documents with the date selected as the date the Proposal was created.

8/10/2011

- Non-Disclosure Agreement
- Proposal
- Remaining Device Schedule
- New Device Schedule
- CPI Agreement Generate Documents

Fig. 41

| Supply Name | Toner | Lower Threshold | Upper Threshold | Min Pct | Item | Modified By | Modified On |
|---|---|---|---|---|---|---|---|
| Black Toner/Ink/ | ▷ | 16.0000 % | 32.0000 % | | C9720A | ss | 04/29/2010 07:30 |
| Cyan Toner/Ink/w | ▷ | 16.0000 % | 32.0000 % | | C9721A | ss | 04/29/2010 07:30 |
| Magenta Toner/An | ▷ | 16.0000 % | 32.0000 % | | C9723A | ss | 04/29/2010 07:30 |
| Yellow Toner/Ink/ | ▷ | 16.0000 % | 32.0000 % | | C9722A | ss | 04/29/2010 07:30 |

68a → Lower Threshold
68b → Upper Threshold

Device: HP Color Laser Jet 4600 Series (ID:863308)
General | Consumer Replaceable Supplies Add Help | Device DCS Data | Orders Report | Submit | Apply | Discard

| Device | | End User | | Result |
|---|---|---|---|---|
| Contract Status | CPI Device | Action To Take | Notification Sent To | Quote |
| ATRS | TRUE | EmailToDealer | C6 Team | None |
| ATRS | TRUE | EmailToC6Team | C6 Team | None |
| ATRS | TRUE | EmailToRep | C6 Team | None |
| ATRS | TRUE | Wait for Pull | C6 Team | None |
| ATRS | FALSE | EmailToDealer | BundledNotificationEmails, BundledOrderContact, BundledOrgContact | None |
| ATRS | FALSE | EmailToC6Team | BundledNotificationEmails, BundledOrderContact, BundledOrgContact | None |
| ATRS | FALSE | EmailToRep | BundledNotificationEmails, BundledOrderContact, BundledOrgContact | None |
| ATRS | FALSE | Wait for Pull | Pulled by Dealer | None |
| In-Market, Out-of-Market, No Contract | TRUE | EmailToDealer | C6 Team | Create |
| In-Market, Out-of-Market, No Contract | TRUE | EmailToC6Team | C6 Team | Create |
| In-Market, Out-of-Market, No Contract | TRUE | EmailToRep | C6 Team | Create |
| In-Market, Out-of-Market, No Contract | TRUE | Wait for Pull | C6 Team | Create |
| In-Market, Out-of-Market, No Contract | FALSE | EmailToDealer | BundledNotificationEmails, BundledOrderContact, BundledOrgContact | Create |
| In-Market, Out-of-Market, No Contract | FALSE | EmailToC6Team | C6 Team | Create |
| In-Market, Out-of-Market, No Contract | FALSE | EmailToRep | SN Rep | Create |
| In-Market, Out-of-Market, No Contract | FALSE | Wait for Pull | Pulled by Dealer | None |
| Dealer Monitored | Any | Any | None | None |

MANAGED PRINT SERVICE AUTOMATED AND INTEGRATED SYSTEM

CROSS-REFERENCE TO RELATED APPLICATIONS

This application claims priority from U.S. Provisional Patent Application No. 61/392,521 filed on Oct. 13, 2010.

STATEMENT REGARDING FEDERALLY SPONSORED RESEARCH

Not Applicable.

APPENDIX

Not Applicable.

BACKGROUND OF THE INVENTION

Field of the Invention

The present invention relates to a supply management system for a network of document output devices requiring replenishment supply parts for replacing consumable materials, and more particularly a managed print services (MPS) system for analyzing, optimizing and managing the network of document output devices.

Related Art

Inventory tracking systems for monitoring consumable supplies for document output devices have been known for decades, such as the monitoring and ordering system described in U.S. Pat. No. 5,305,199. Over the years, improvements continue to be made to the ordering and replenishment of consumable supplies. Centralized tracking systems now monitor supply part inventories that are consumed throughout fleets of machines based on usage data that the systems receive from the networked document output devices. Automatic or semi-automatic ordering is provided via interactive communication systems. Order confirmation, projected shipment dates and shipment confirmations can be provided from the reorder sites. These systems can also provide inventory monitoring customized to local networks. Systems provide assistance in the ordering of supplies and also generate pricing data for an entire fleet of devices, such as described in U.S. Pat. Nos. 7,043,523 and 7,127,433, respectively.

Most supplies replenishment processes require the end user to identify a supply needs to be replenished, determine the appropriate replacement supply part number, determine how to place the order, then manage a manual process of tracking the replenishment. Often, this means the consumable supply item is depleted before a replacement supply is ordered and arrives, usually resulting in the machine operators maintaining a significant amount of safety stock which is subject to shrinkage. Other times, the machine operators reorder the incorrect supply which increases supply chain costs significantly.

For resellers and MPS providers who offer to "manage" the end user's supplies replenishment remotely, they only have rudimentary supplies percentage information, which may be limited to only some brands and models and which is not an accurate way to determine when the supply is requiring replenishment. Those resellers and MPS providers who merely rely on a supply items' "percent remaining" readings taken from document output devices have no automated way to determine whether a supply truly needs to be replaced. For example, a supply can fall below a threshold percent remaining value which triggers an order and shipment of the replacement supply by a current MPS provider's system. After the replacement supply is shipped, the system may then receive an increased supply reading over the trigger threshold which causes the system to reset for the next time the supplies drop below the trigger threshold. However, this reset may actually be caused by user behavior (i.e., removing the supply, rocking it, and replacing it), which would have produced a false-positive indication that the replacement supply had been placed in the machine. Before the replacement supply arrives, the low supply could again drip below the trigger threshold which could result in double shipments of the replacement supply.

Additionally, apart from the system provided by the present invention, MPS providers do not have any automated way to check for other supplies that could be close to their replacement trigger threshold. One supply item could reach its replacement trigger threshold in the beginning of a week and another three supply items could reach their replacement trigger thresholds by the end of the week or in the next week. Without a predictive supply replenishment system that is based on the days remaining of the supply items, current MPS systems do not provide an optimized solution for efficiently resupplying the document output devices.

Another problem with current managed print services is that there is no robust, automated system which allows MPS providers to manage their entire MPS process with a consistent set of data. To best plan for and execute an MPS solution, MPS providers need consistent datasets from the evaluation stage for a potential new customer, into the creation of a deal with MPS solution proposals that can be automatically generated and revised based on these datasets, and through to the services provided for a selected MPS solution that is designed for the particular customer and which assists the MPS provider with automatic notices based on dataset updates.

SUMMARY OF THE INVENTION

The present invention is a managed print service (MPS) system that is implemented in a computer system having a processor and a database. Data collection systems obtain device-specific data from document output devices and transmit the data over a communications network to the MPS computer system which receives the datasets through a communication interface. The computer processor has a reconciling module that transforms the collection systems' multiple data formats into a standardized device-specific dataset that is stored in the computer's memory storage according to the database parameters.

The computer processor preferably has a service evaluation module and a supply replenishment module. The service evaluation module is used to analyze the costs associated with creating hardcopies on document output devices in end user customer environments, develop proposals to optimize the placement and use of document output devices based on the end user customer's desired workflow. The supply replenishment module manages the resulting optimized document output device fleet in the replenishment of supplies. The supply replenishment module preferably includes predictive supplies replenishment logic that accounts for variations in user behaviors when determining whether a replacement supply is needed and identifies replacement supplies according to multiple trigger thresholds that are based on calculations of the remaining days of the supplies in the devices.

The processor also preferably has a routing label module, a service monitoring module, and a service ticketing module. With the routing label module, the system provides device-specific routing labels for different supply parts that are sent to the same shipping address. MPS providers can also use the system to manage break/fix services to maintain the uptime, or availability, of the fleet of document output devices.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4 is a search screen listing printer models stored in the interim database.

FIGS. 5A-5D are listings of printer model details stored in the interim database.

FIG. 6 is a flowchart of the process performed by the service evaluation module.

FIG. 7 is a listing of the steps available in the assessment, modeling and proposal tool.

FIGS. 8-41 are screen shots of the interactive steps provided on a display screen by the assessment, modeling and proposal software tool.

FIG. 43 is a listing of replacement trigger threshold values.

FIGS. 44A and 44B are listings of collection services messages available to the interim database.

FIG. 45 is a listing of a missing notification.

FIG. 46 is a listing of tracked notifications.

FIG. 52 are screenshots of a login and welcome screens for an interactive website portal.

FIG. 54 is a listing of service ticket items for capturing in a knowledge base.

DETAILED DESCRIPTION OF THE PREFERRED EMBODIMENTS

The following description of the preferred embodiment(s) is exemplary in nature and is in no way intended to limit the invention, its application, or uses.

Managed Print Service Automated & Integrated System (MPS AIS)

In general, the MPS AIS is a software tool, a system and process, that enables managed print service (MPS) providers to seamlessly analyze the costs associated with creating hardcopies on document output devices in end user customer environments, develop proposals to optimize the placement and use of document output devices based on the end user customer's desired workflow, and manage the resulting optimized document output device fleet in the replenishment of supplies. MPS providers can also use MPS AIS manage break/fix services to maintain the uptime, or availability, of the fleet of document output devices. Generally, document output devices that are within managed print service systems are printers, copiers, fax machines, or any other document production machines that require supply replenishments and preferably communicate through a computer network 36. Accordingly, the system and method of the present MPS AIS invention is used in analyzing, optimizing and managing a network of devices requiring replenishment of consumable materials.

Figure 1:
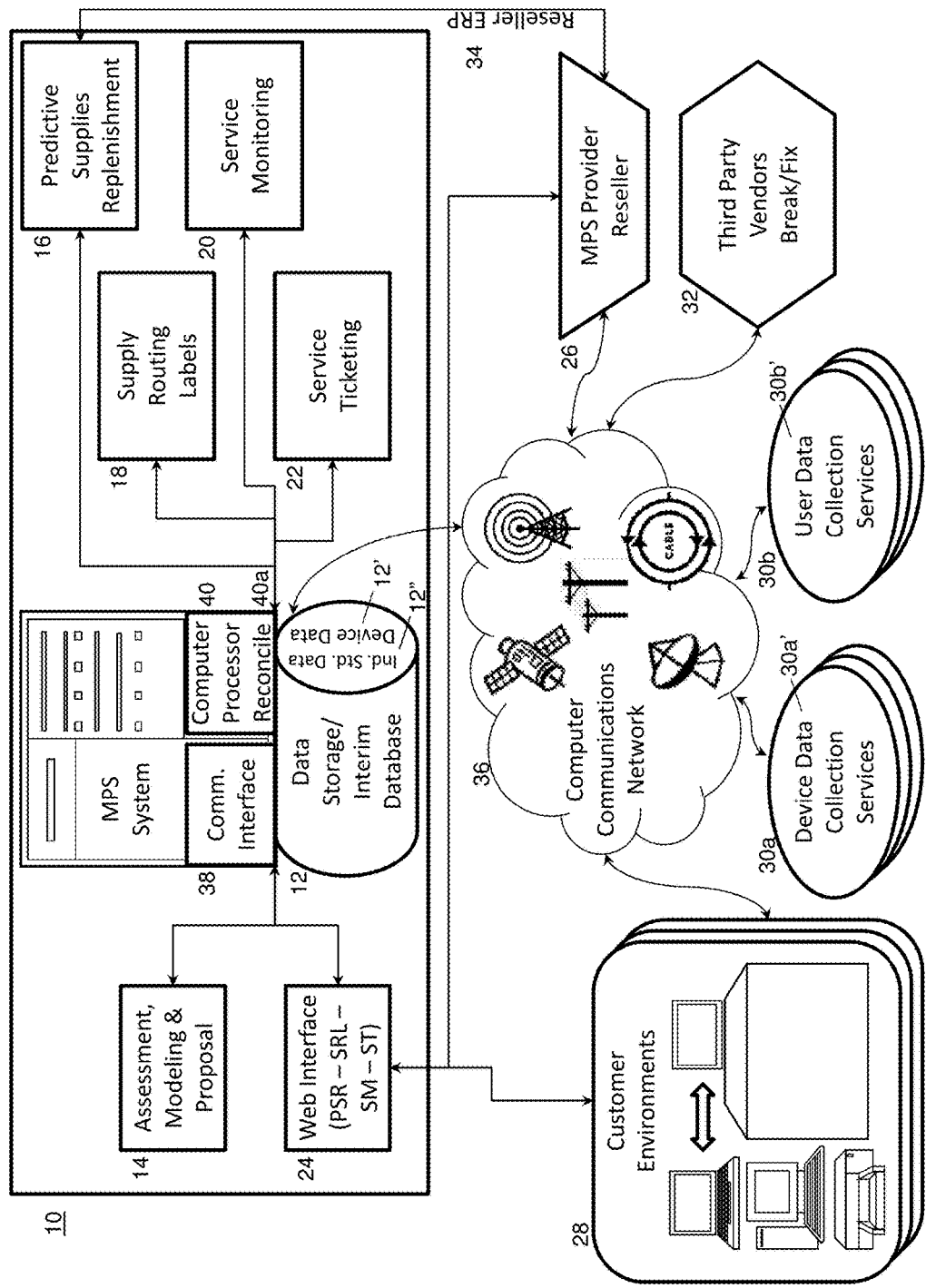
FIG. 1 is a diagram of the managed print service system according to the present invention.

As particularly shown in FIG. 1, the MPS AIS system 10 of the present invention is used within a network of document output devices 28. While the MPS tool can be used as a stand-alone system within a single enterprise, it can also be used in any customer environment, including multiple enterprises with one or more MPS providers 26, including dealers, resellers distributors, and other third party service providers 32, OEMs and after-market providers of supplies for document output devices. The enterprises and MPS providers can have their own user accounts within the MPS AIS tool of the present invention. The MPS AIS tool has a communications network interface 38 which receives device-specific data 30*a'* and end user-specific data 30*b'* from existing data collators 30*a*, 30*b* through the network 36. The collators 30 collect the data from the document output devices 28*a* and the end user data 28*b* and arrange the data according to their own dataset formats.

The MPS AIS tool resolves the multiple formats of collators and the various document output devices into a standardized set of device-specific data 12' that it stores in its interim database along with industry-standard data 12" such as the "assumptive" costs described in detail below. The database 12 has a logical correlation 12*a* which categorizes the document output devices according to the various user accounts and data storage 12*b* for maintaining the data. To create the standardized data, the MPS AIS tool's computer processor 40 has a reconciling module 40*a* that transforms the various dataset formats into the standardized set of device-specific data which is stored in the Interim Database (ID) 12 and used in the other modules of the tool. The database is accessed for the standardized set of device-specific data and industry-standard data that it stores for each one of the individual document output devices within the MPS AIS, and as explained in detail below, the database uniquely identifies each one of the document output devices and also categorizes the document output devices according to a variety of relationships, such as user account, brand, model, shipping address.

The MPS AIS tool's processor preferably includes an integrated set of processing modules, including a service evaluation module 14, a supply replenishment module 16, a routing label module 18, a service monitoring module 20 and a service ticketing module 22. The MPS AIS tool also provides an interactive web interface 24 for distributors, resellers and other MPS providers 26, as well as end users and third party break/fix vendors, to directly access the various modules provided by the tool. These modules are described in detail below with regard to the various services that are supported by the MPS AIS tool.

According to one aspect of the MPS AIS invention, the Assessment Modeling and Proposal (AMP) software tool uses the service evaluation module 14 with a financial build logic that replaces missing device-specific data with industry-standard data from the ID without any manual entry. The financial build logic also evaluates financing terms on a cost-per-image (CPI) basis, and provides alternative scenarios according to a change in said document output devices.

According to another aspect of the MPS AIS invention, the Predictive Supply Replenishment module 16 uses shipping efficiency logic for the user accounts. The data stored in the ID for the document output devices includes replenishment-required limit and a higher replenishment-optional limit. The shipping efficiency logic identifies document output devices of a user account which have reached the replenishment-optional limit when at least one document output device of said user account has reached said replenishment-required limit. This innovative shipping efficiency logic can result in previously unrealized cost savings by grouping document devices that are close to being ready for replenishment with those that are in imminent need of replenishment.

The MPS AIS tool also includes a supply routing label module 18 which produces supply routing labels 50 for replacement parts according to a supply correlation logic 52. In addition to linking a postal shipping address 54 to a particular user or various document output devices, the ID preferably stores and links device location identifiers 56a and asset identifier numbers 56b with each one of the document output devices. These device locations and asset numbers are used for routing supply labels that can be fixed to the replenishment supply. The shipping address for a given user may be used for multiple document output devices, such as when supplies are sent to a central mail room. In this type of situation, the routing supply label improves the efficiency and timeliness of the internal routing of the supplies to the particular document output device. When a user has multiple shipping addresses, the supply correlation logic identifies the supplies according to the shipping address as well as the user account throughout the entire shipping process.

Yet another aspect of the MPS AIS tool is the service monitoring module 20 which includes key alert logic that evaluates a number of alert parameters that the collators may receive from the document output devices and send to the ID. When the errors are communicated to the MPS AIS tool, the key alert logic classifies the errors for the document output devices according to the alert parameters which can then be formed into Proactive Service Alerts (PSA) for the system's service ticketing system as appropriate.

The service ticketing module 22 in the MPS AIS is used to create and track the status of break/fix service issues. The module allows internal creation and input from certified help desk personnel who can manage the service work with third party vendors who respond to end user requests to repair devices. The module also allows the third party vendors to input status updates, reports and notes directly into the system via the interactive web interface. Tickets and status reports are also viewable to MPS providers or end users at anytime through interactive website.

The interactive web interface 24 uses the standardized set of device-specific data without needing to access the data collators. The interactive web interface displays supplies replenishment status of all devices in a given end user's enterprise, including predictive dates of upcoming supplies replenishments, those in transit, and recent history of supplies deliveries. In addition, users can access an interactive knowledge base to diagnose document output device issues or initiate service requests. In addition, MPS providers can manage their customer environments via this web interface by updating device information and tracking service issues. Accordingly, the interactive web interface serves as a control panel as well as an information dashboard for the MPS providers and device users.

It will be appreciated that these components can work together as an integrated system. From the description of the various modules, it is apparent that the interim database (ID) is core to the integrated systems approach of the present invention. Data is pushed into the ID, and information and analysis is pulled for use by each of the components. As more data is deposited into the ID, more robust analysis is available for the components, creating a system that is more valuable the more it is used.

Interim Database (ID)

Figure 2:
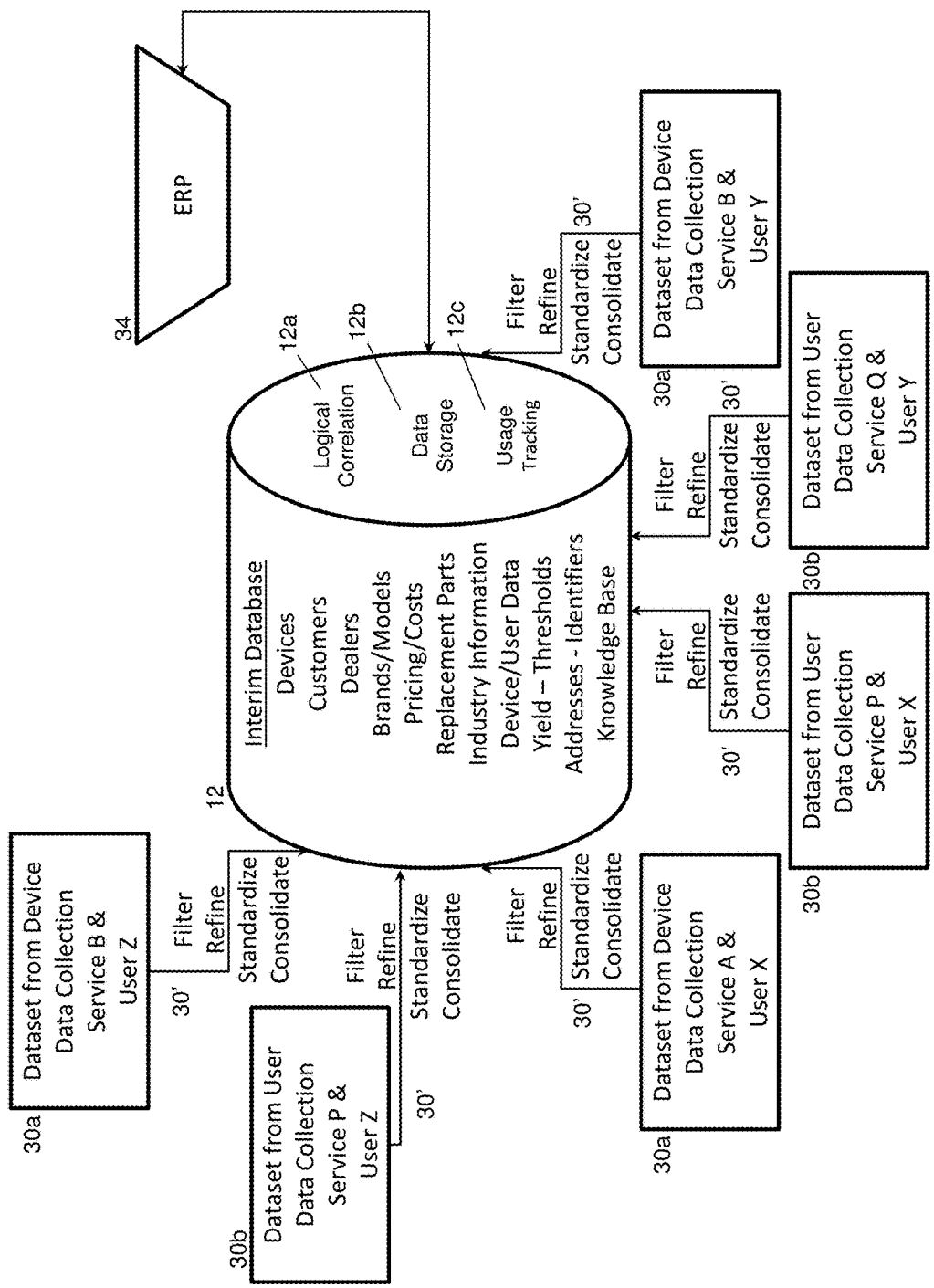
FIG. 2 is a block diagram of the interim database for the present invention.

The primary purpose of the Interim Database (ID) 12 is to rationalize the data field structures coming from remote device data collection software, such as the PrintFleet and FMAudit collators, and end user behavior management software, such as the Preo collator, and rigorously cleanse the data for use in the rest of the system. In FIG. 2, the ID is shown in a functional block diagram in relation to the remote device data collection services (A, B, P, Q), end user behavior management services (X, Y, Z) and the ERP system 34. The standardization of the datasets enables the AMP software to easily pull device data from the ID without any interaction with the remote device and end user data collection software tools. It also enables end users to map the identification and location of their devices directly into the ID through the web interface so that the device identifier/locater can be printed on the supply routing labels. Algorithms for Predictive Supply Replenishment and algorithms and queries for Proactive Service Alerts are also run on data stored in the ID. Each of these tools in the MPS AIS tool is discussed in detail below with reference to their interaction with the ID. Accordingly, the Interim Database collects, organizes, cleanses, and rationalizes data fields from multiple software solutions and serves as a central component of the MPS AIS tool.

One example of the rationalization of the datasets pertains to the naming of the particular document output devices. Multiple data sources may have the same model of printer listed but with a slightly different textual name. The present system provides a way in the interim database to determine that such models are actually the same and merge them together so logic about the model (average repair costs, energy costs, etc) do not need to be maintained in more than one location. Another rationalization example pertains to the naming of supply parts. Multiple data sources and devices within those data sources may refer to a given supply by a different name from time to time. The interim database has rules to determine whether two different supply names are actually the same supply. The proper identification of supply parts allows MPS providers and users to optimize their decisions about when to replenish the supplies for their fleets of document output devices.

The Interim Database solves a number of problems related to currently known remote data collection software tools, and enables many of the features of the system described herein. First, by rationalizing the data fields from multiple data collection software tools, the specific remote data collection tool used in a given end user environment can vary without any impact on the other modules and components. Accordingly, the selection of the remote data collection software tool can be made based on current state-of-the-art at the time for a given end user customer environment, and does not limit the MPS provider to a specific remote data collection software solution. Second, the Interim Database rationalizes additional data variables from other software solutions (such as end user behavior software) to augment data from remote data collection software solutions to create a more comprehensive and complete view of the end user's environment. Third, the Interim Database can be updated via the web interface without the MPS provider or the end user customer being required to directly log into any of the remote data collection software tools. This greatly improves workflow processes necessary to load and maintain data necessary to deliver services such as the supply routing labels.

By rationalizing the data fields from multiple remote data collection software tools into the ID, the overall ability of the MPS AIS is improved for analyzing and acting on data because it can do so independently from the source of the data. This decoupling of the MPS AIS tool from the data collators also improves the flexibility for the end user to install the optimum remote data collection software tool for their particular environment without compromising the integrity of the analysis, algorithms, and queries performed on the data.

Collators that can be used to gather device information are generally available, such as Print Fleet and FMAudit. The structure of the information gathered and the quality of the data gathered varies widely depending on the features of the collator products, and can vary for each collator products from model to model. On a real-time basis, the MPS AIS processing logic standardizes the structure of the information and cleanses questionable data before storing the sanitized information in the Interim Database. In addition, using print behavior data collection software such as data collected by the Preo collator, the system can pull not just device information but also information about the user actions related to printing on the document output devices, such as the size of the jobs, the type of software that executed the jobs, the type of paper selected for the jobs, and other information pertaining to the attributes of the jobs. This data combined with the device information provides valuable insight into the device as well as the behavior of the user which is used in the MPS AIS tool for the assessment period and throughout the life of the document output devices.

Data can be obtained using a web service or through a SQL server database. For example, when pulling data from FM Audit, the system uses the FM Audit web service to pull the device information. This web service is available regardless of where the server is hosted so it can be called multiple times each day the FM Audit servers that are hosted for the dealers or any MPS provider. Therefore, even though a dealer may have its own server, the MPS AIS process can function with its device data as well as functioning with its own hosted solution. When pulling data from Print Fleet, the MPS AIS process can either reach directly into the SQL Server database to pull device information or can use a web service to pull device information depending on the needs and wishers of the server's owner.

Figure 3:
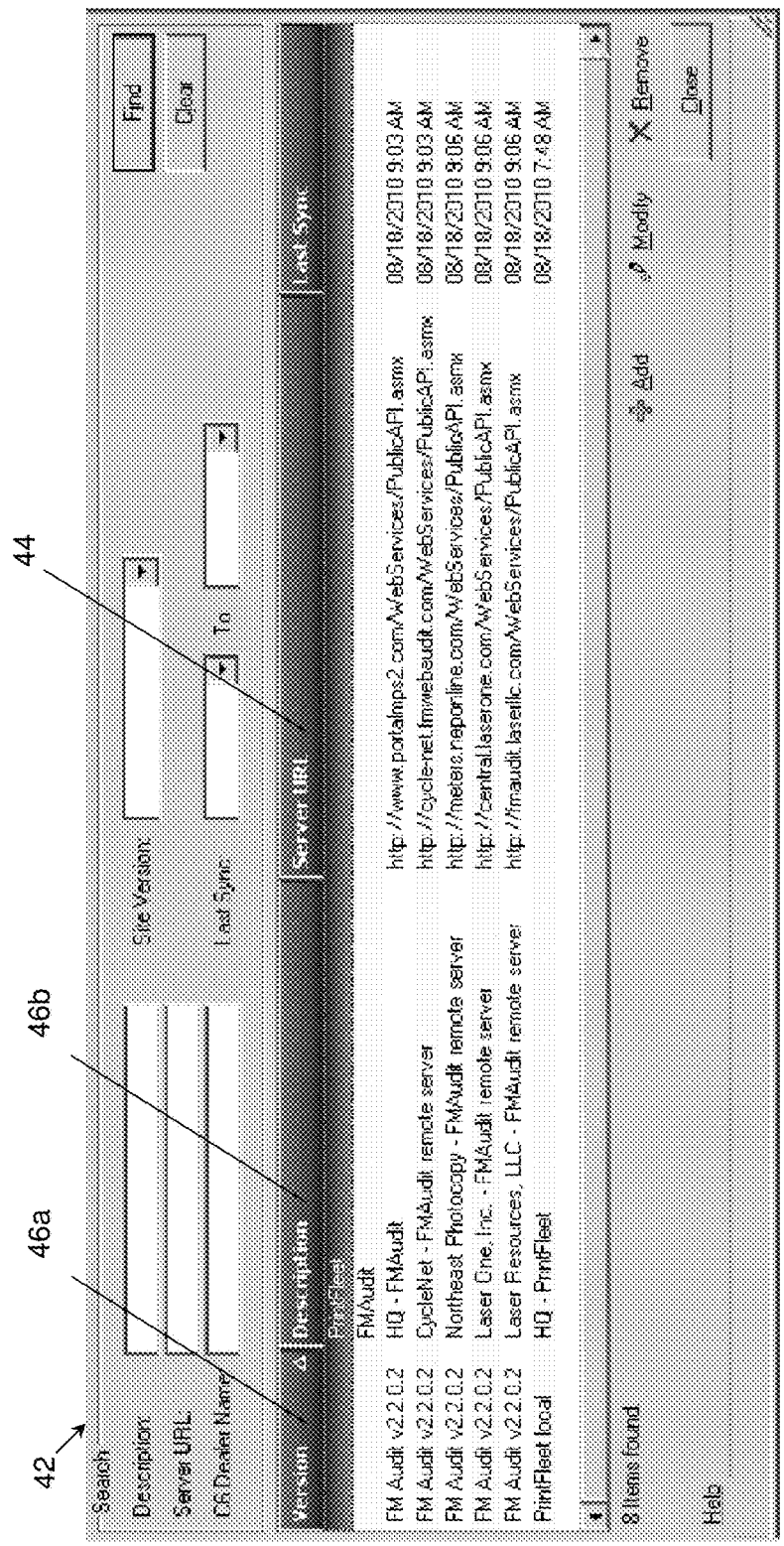
FIG. 3 is a search screen listing data sources for populating datasets in the interim database.

To manage the pulling of data via web services from remote installations (as well as the system's own servers), the system can use an ERP module that defines and stores the server URL and encrypted username and password needed to call the web service. An operating service, such as a Windows-based platform, runs on a backend system that periodically pulls in updated information by cycling through the sources and making web service calls. Appropriate error handling and alerting happens if any one of the servers is unavailable. This method of gathering data permits scaling the number of devices and accounts that are being served. For example, another data source can be loaded into the ERP module in the situation where the maximum number of devices on the Print Fleet server is reached or if another server is desired for any other reason. Several server URL identifiers 44 are shown on a manage print data source screen 42 in FIG. 3 along with corresponding version 46*a* and description information 46*b* about the data collators 30.

Another aspect of the interim database is the development of a wealth of data about device models and the ability to search the list of models stored in the database. Oftentimes, the same model is reported and named in different ways from various data sources. When pulling in data, the system reviews the listings and "merges" together models that are loaded separately but which are really are the same, thereby providing a standardized nomenclature for the devices and avoiding duplicate records. This cleansing of the data also lets the system accurately evaluate a particular model's performance across the entire ID because there is a clear single identifier of each model. The information for various printer models are stored in the database, as shown by the managed model search screen 48 in FIG. 4. With the collected information, the system can identify models that consistently have performance issues and target them for replacement or price quotes for servicing these machines accordingly. The system can also track actual usage of machines with the recommended maximum monthly usage for devices, the expected lifetime usage for devices and the phase out dates for particular devices and can target individual devices exceeding those thresholds for replacement. Accordingly, the system includes usage tracking logic 12*c* which compares the periodic usage amounts for the document output devices relative to the lifetime usage amounts for the corresponding document output device models and estimates the phase out dates for the devices according to these comparisons.

Figure 5A:
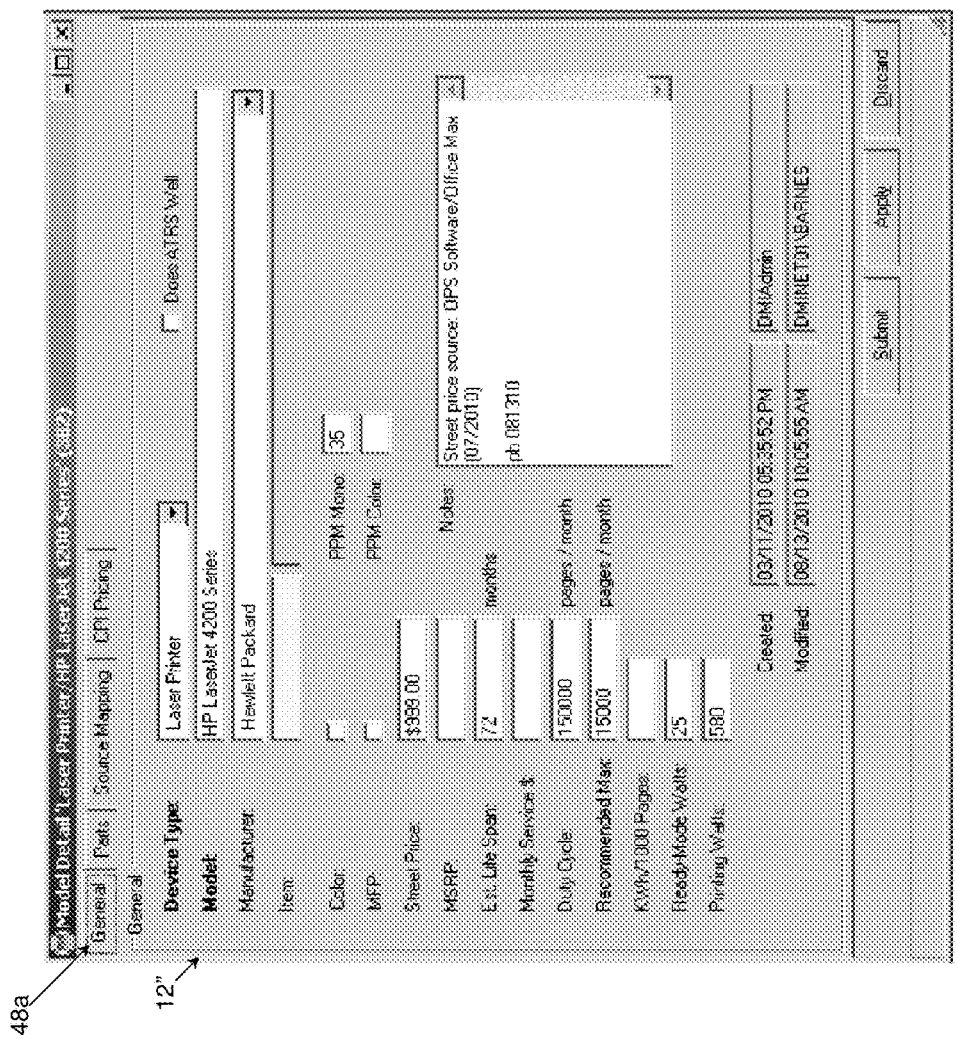
Figures 5B, 5C:
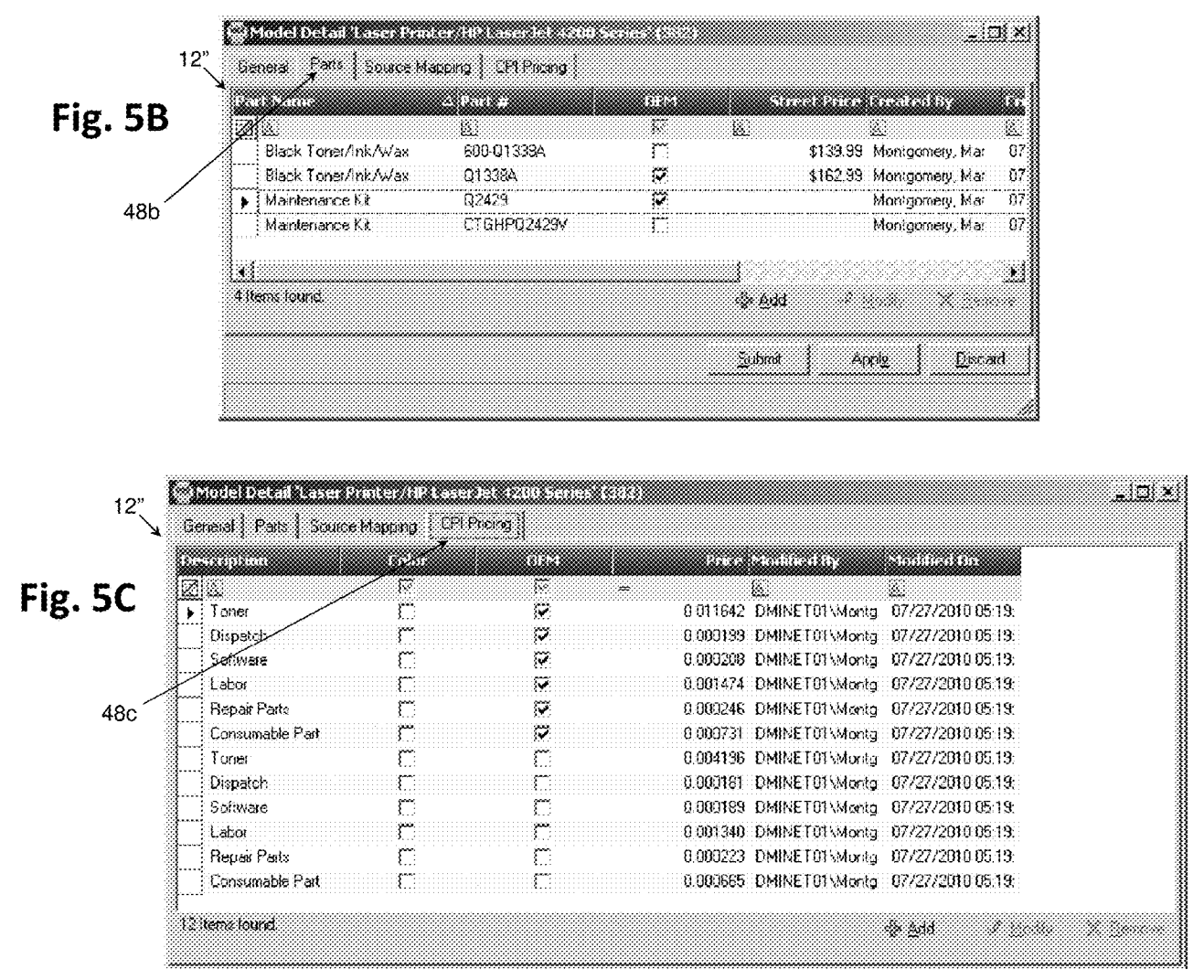
Figure 5D:
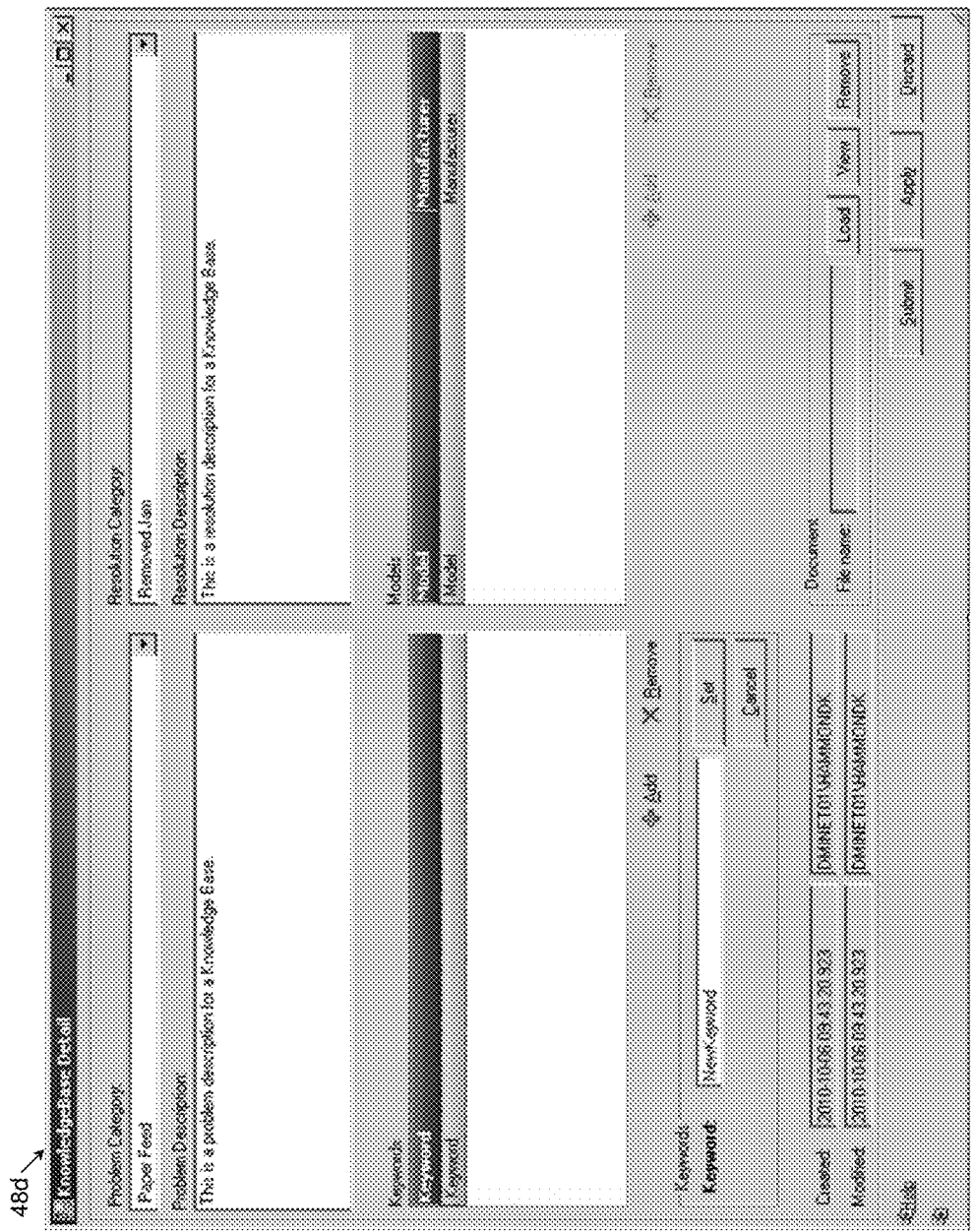

Industry-standard cost values at the model level are set in the interim database as "assumptive" cost values 12". Listings of printer model details that are stored in the interim database are shown in FIGS. 5A-5D. As shown in FIG. 5A by the general information screen 48*a* for a printer model, the assumptive values can include MSRP and/or resale price ("street price"), estimated lifespan, recommended maximum monthly print pages, ready-mode power requirement, printer-use power requirement, and other information. The supply parts for the document output devices are also stored in the interim database with each model. As shown in FIG. 5B by the parts information screen 48*b*, parts can be listed for the OEM brand as well as other brands that are compatible with the particular printer model. The default CPI prices for the devices are also stored in the ID, as shown in FIG. 5C by the CPI pricing screen 48*c*. A knowledge base 48*d* of data about error codes and problems with devices are also stored in the interim database for each model, as shown in FIG. 5D.

Assessment, Modeling, and Proposal Software (AMP)

The primary purpose of the assessment, modeling, and proposal (AMP) tool is to provide a single tool to MPS providers to use for all of the major steps required to thoroughly analyze, strategize, propose, and document an MPS engagement with end user clients. The general process of the financial build logic 62 for this software tool is generally illustrated in FIG. 6. Generally, AMP software automatically pulls remotely collected output device data via the Interim Database, provide the MPS provider's current costs for supply items, auto-populate all "assumptive" cost values, and auto-generate a customized proposal based on a number of factors (management initiatives, environment analysis, device output fleet optimization, MPS provider costs and gross margin goals, etc.). Information, documents and notes that would be distributed across different systems and not usable together in other systems because of different formats are now collected together and organized in the interim database according to a standardized format which allows the AMP tool to use all of the information stored within the same system.

The outline of the AMP process 64 is listed in FIG. 7 and the details of the interactive steps provided by the AMP tool's display screens are shown in FIGS. 8-33. As will be apparent from the detailed description below, the AMP tool pulls in the end user's output device data collected remotely from other software solutions (housed and managed in the interim database, ID, discussed above), enables the MPS provider to enter relevant end user cost data and related files (copies of invoices, photos from environment walkthroughs, interview notes, etc.), and organizes this information to understand the end user customer's costs. The AMP tool can be used to propose solutions that would improve the cost and efficiency of document output in the user's environment and can model the solutions under a variety of scenarios, with all proposal and financial documentation created for each scenario. Accordingly, the AMP tool of the present invention provides a complete analysis with real-time MPS provider supplies cost information, having the ability to seamlessly load remote data collection software data regardless of the brand of this remote data collection software. This functionality does not exist in current tools that analyze, model, and propose solutions to manage end user output device environments, such as DocuAudit and Compass.

Since the device and user information is gathered and aggregated in the interim database, the MPS provider does not have to manually run reports out of each device and end user software program and manually load this information into the tool. The MPS provider has real time access to their supplies and services pricing in the tool, eliminating the need to manually load these costs into the tool. Also, the tool enables the MPS provider to build all of their financials, including financing of equipment and services, into a consolidated cost-per-image (CPI) model.

Beginning with the analysis of the current document output device fleet, MPS providers can use the AMP tool to gather all information about the existing fleet, including device-specific information (page coverage, page production, service errors, etc.) and end user behavior services gained via the data collection, all costs associated with each device (device costs, supplies costs, service costs, IT support time, energy consumption, etc.), as well as qualitative data gathered from physical walkthroughs of the end user customer's physical environment and interviews. Although the software utilized to collect information may vary, the AMP software pulls the device information from the Interim Database (ID). As discussed above, the ID rationalizes the data field structures coming from remote device data collection software (i.e., PrintFleet or FMAudit) or end user behavior management software (i.e., Preo) and rigorously cleanses the data which enables the AMP software to easily pull device data from the ID without any interaction with the remote device and end user data collection software tools.

The AMP software can also access the database of "assumptive" cost values that are available to the MPS provider. Assumptive cost values are based on industry information that is periodically collected and updated and is regularly maintained so that it is available for the AMP analysis. For costs the MPS provider is unable to acquire directly from the end user customer, assumptive cost values can be used to approximate environment costs. Once all costs are collected (actual and assumptive), the MPS provider then can analyze the existing environment and move, remove, and/or add output devices to optimize the overall output device fleet based on the end user customer's management initiatives and document workflow needs. The software allows all pages to be "mapped" to the proposed document output fleet, ensuring accurate costing of the new output device fleet. Multiple proposal scenarios can be modeled for a single end user customer without resetting core device data.

In the development of proposal scenarios, the AMP software can access the MPS provider's current supplies pricing from the systems ERP system when the MPS provider uses their own standard pricing. Additionally, the MPS provider can also import specific pricing data into the preparation of a deal from another source, such as when there is a unique pricing schedule for a particular end user. All output device costs (buy out of existing leased output devices as well as new output device costs, including delivery, set up, and training) are loaded into the software, along with selected services for each device (data collection, supply replenishment, supply routing label, proactive service alerts, service desk, etc.), finance terms and MPS provider gross margins to create proposals for the end user customer with a "blended" cost per image (one for monochrome output, one for color output) that is inclusive of all costs necessary to manage the optimized output device fleet. The proposal and all financial documents for the end user customer are also created directly from the AMP software, merging data fields with variable text fields, creating a highly customized proposal and financial documents for the MPS provider to present to the end user customer.

Once the MPS provider has an agreement with the end user customer to manage their output device fleet, there can be one or more service solutions designed to improve the efficiency of remotely managing the output device fleet. For example, one solution that can be implemented in the present system helps with the timely and efficient replenishment and delivery of supplies (including "consumable" items such as toner, drums, maintenance kits, fusers, etc.) used in the creation of hardcopy documents. As another example, the present system allows for the proactive remote monitoring of output device service alerts necessary to maintain the "uptime" or availability of each output device for generating hardcopy output.

Details of the AMP tool are described with reference screen shots from the interactive software application shown in FIGS. 8-33. The interactive AMP tool website represents a user-visible tool which spans the entire AMP process, from the discovery process of the end-user's environment to a signed contract. The basic site consists of a navigation panel along the left of the screen that is updated as changes are made and a main area that displays information and allows for edits. Data sections that contain large amounts of information in repeating rows are structured in grids to allow for scrolling within the grid as well as a filter section above each grid to allow for filtering the data to only what is important. All grids support column sorting. Batch editing is supported for grids whenever similar data is displayed in grids.

As a web-based system, login privileges to the website can be granted within the MPS provider organization to create or review deals. In addition, access can be granted to selected AMP tool support personnel to enable them to assist the MPS providers in the development of proposals. Password management screens are provided for dealer users. MPS providers may upload their logo to be included in the final output Document. The site allows for editing existing deals as well as adding new deals. Information for a deal can be broken into two parts: Existing Configuration and Proposed New Configuration. The Existing Configuration does not change based on various proposed configurations and has to be entered only once. As shown in FIG. 7, screens related to the existing configuration are listed in the navigation panel underneath several section headings and titles (Getting Started, Current Cost, Existing Obligation & Cost Review).

Every Deal has at least one Deal Scenario which related to specific values in the "Decision Time" and "Deal Making" sections. A deal can have unlimited Deal Scenarios where a user can test out various configurations and save each without having to start over on a deal. A "Scenario" dropdown list appears along the top right corner of the main edit area once a web page is requested that is not part of the current configuration. Users can select different scenarios which result in reloading of the screen with the requested data. The dropdown list also contains options to add or edit scenarios via a popup screen that does allow for copying of existing scenarios as a starting point.

Figures 8, 9:
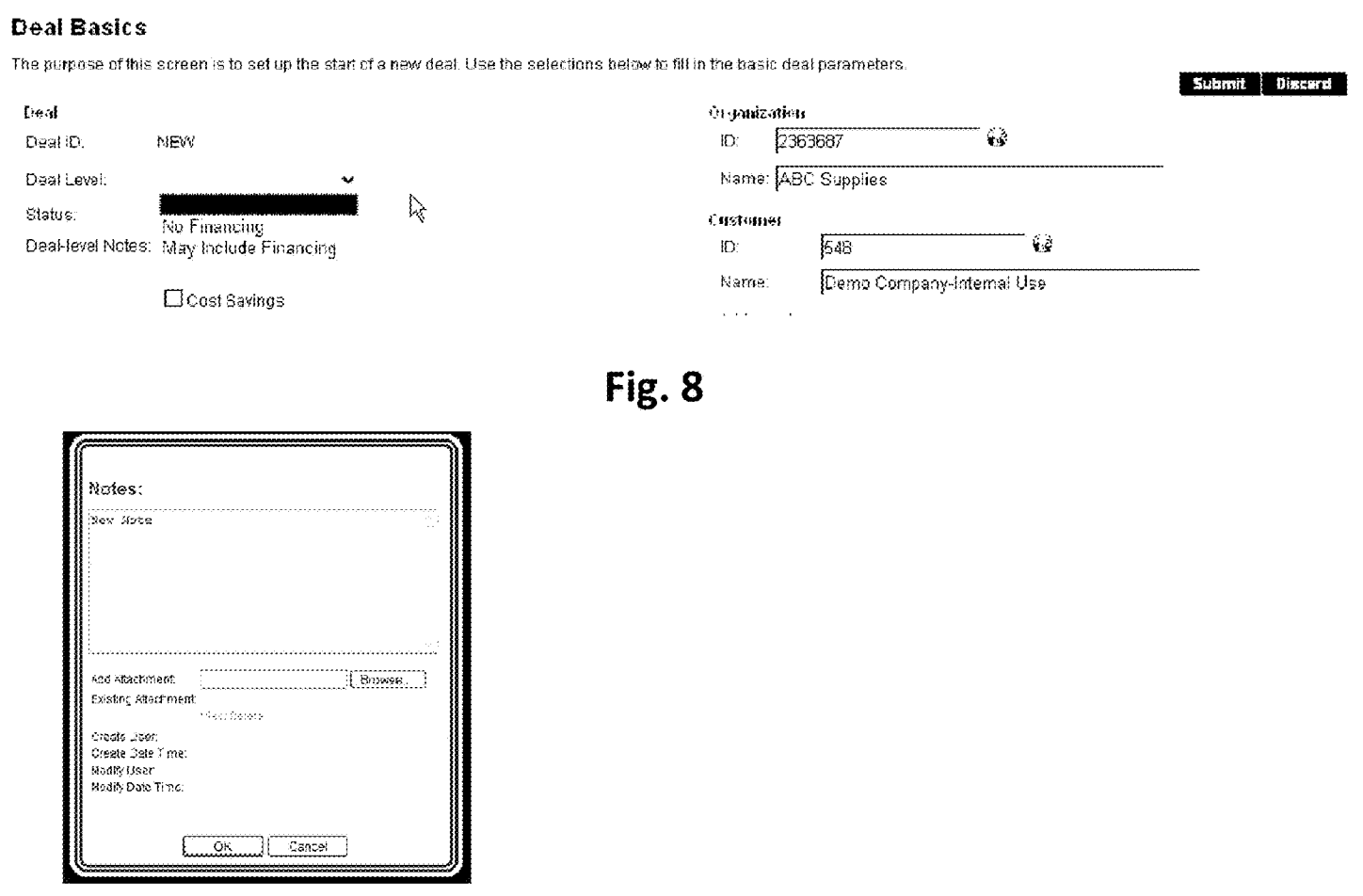

As shown in FIG. 8, a new deal starts with selecting a Deal Level of either "No Financing" or "Include Financing". Different pages and hyper links are made available based on the Deal Level selection. The Status options are "In Work", "Submitted", "Lost", "Won", and "Abandoned" and are used to indicate the current status of the deal, the selection will determine if the user may make future edits. Modifiers allow for additional charges to be applied to a finished deal based on the level of support required by the dealer during the modeling process. The list of Goals allows users to specify the anticipated improvements desired. Checked goals are listed in the final output document along with specific solutions to each goal. Organization (Dealer) and Customer (End User) are selected using popup search screens.

Almost all screens allow for additions on notes to different entities involved in crafting a deal using a common Notes control ("Deal-Level Notes") which displays detail information on the Note entered. As particularly shown in FIG. 9, Notes can consist of multi-line text as well as attached documents of most commonly supported formats. The Notes and their attachments can be added, viewed and deleted.

Existing Deal Devices are added to a deal by importing information from the Interim Database in the device import tab, as shown in FIG. 10. Importing allows for loading of all data for a given End-user or restrictions to a limited time frame. The import process can be repeated multiple times with subsequent imports updating the starting and ending page meter reads. The import processes also initializes existing costs for each device by matching the discovered models to known models in the interim database. The devices is pre-populated with associated supplies, anticipated energy cost (based on # of images processed), expected service costs, and likely depreciation. Imported devices are displayed in a grid with filter options for identifying duplicate records. In addition, devices that are known to not be fully compatible, such as limited as no support devices, can be particularly identified by a red asterisk.

Figures 11A, 11B:
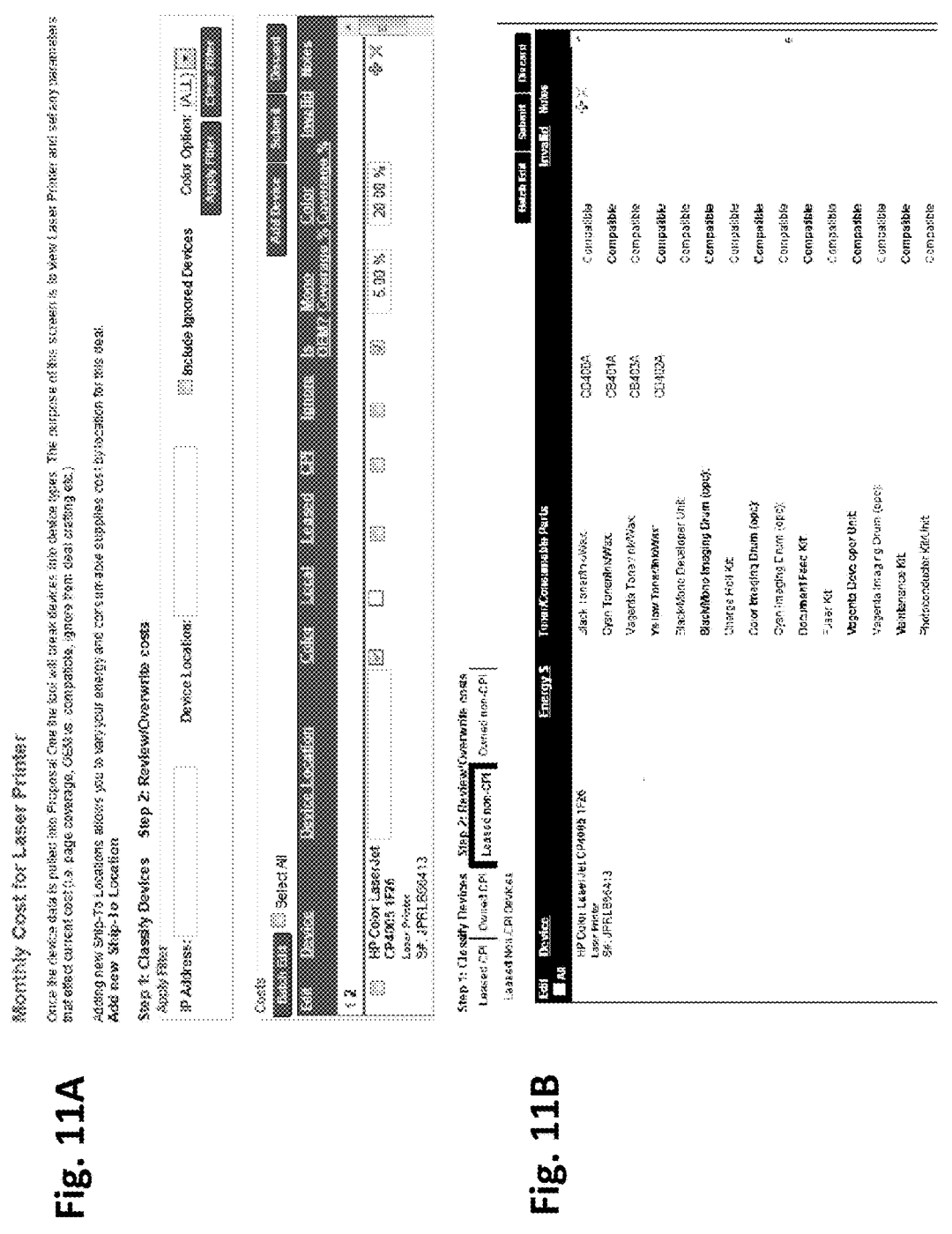

The first step after importing the data is to determine which devices are to be included in the evaluation and any devices that are to be ignored. The next step is the establishment of current monthly cost information for the existing configuration of print devices, as shown in FIG. 11A. Monthly cost is established by different Device Types (Copier, Laser Printer, Inkjet Printer, and Fax) since different devices possess different cost components. Deal Devices are associated with two shipping identifiers. One is "Location" which is a simple text box which permits entering information that identifies the particular device, such as by its physical location (i.e., "Marks Office", "Hallway"). The Location is for informational purposes, and although the Location has no impact on any business logic, it is used by the supply routing label module as discussed in detail below. The "Ship-To Location" identifies the general shipping address of a group of devices, and this may impact costs associated with operating the devices.

All device types start with the same first screen where devices can be marked as Leased versus Owned, covered under an existing charge-per-image (CPI) contract, or marked as being removed from the list of devices to be considered altogether (mark as Ignore). Other options are general settings on the compatible/OEM status of the supplies used in the device ("Is OEM?") as well as the Mono and Color Coverage Percentage of the device. Default values are 5% for Mono Coverage Percentage and 20% for Color Coverage Percentage. The screen also provides the option to add devices that could not be discovered automatically by the Discovery software.

Another step in the current cost establishment allows for editing of assumptive values for energy, depreciation, remaining book value, service cost, telecom expenses (such as for fax operations), and CPI charges associate with CPI devices. As shown in FIG. 11B, the screen is broken into 4 tabs by Leased/Owned and CPI/Non CPI, each tab displaying the applicable information and allowing for editing. Devices covered under a CPI Contract collect information on base charges, page allowances, and overage charges. Non-CPI devices show lists of supplies parts that are applicable to a device type with assumptive part numbers filled in. Users can change part numbers and indicate if the part is an OEM or a Compatible version of the part.

The Monthly Cost screens described above capture part number. The Consumable Cost screen summarizes all parts used in all devices and presents one list with each part used in devices listed. This avoids having to enter the same cost next to each place where the part is used on every device. As shown in FIG. 12, the system Street Price is displayed and used as the default for the Street Price whenever the supplied Part Number of a consumable part can be associated with a known Part Number in an ERP system that is accessible to the present system. Part Numbers may appear more than once to account for differences in Street Price between OEM supplies and after-market compatible versions of the supplies as well as differences in Ship-To locations.

Ship-To locations can differ in energy cost and shipping address. Different energy costs (kWh) lead to different energy costs for the same device. The different shipping address allow for customized pricing of supplies in the proposed configuration based on specific contracts applying to given locations. Varying the Ship-To location on a device also allows the user to account for different costs of the same supply item (examples could be taxes, shipping charges or generally higher costs in urban areas). The Ship-To Location screen shown in FIG. 13A creates and edits defined Ship-To Locations while the "Device Ship-To Location Edit" screen shown in FIG. 13B gives the list of available ship-to locations that can be associated with a device.

Figures 13B, 14:
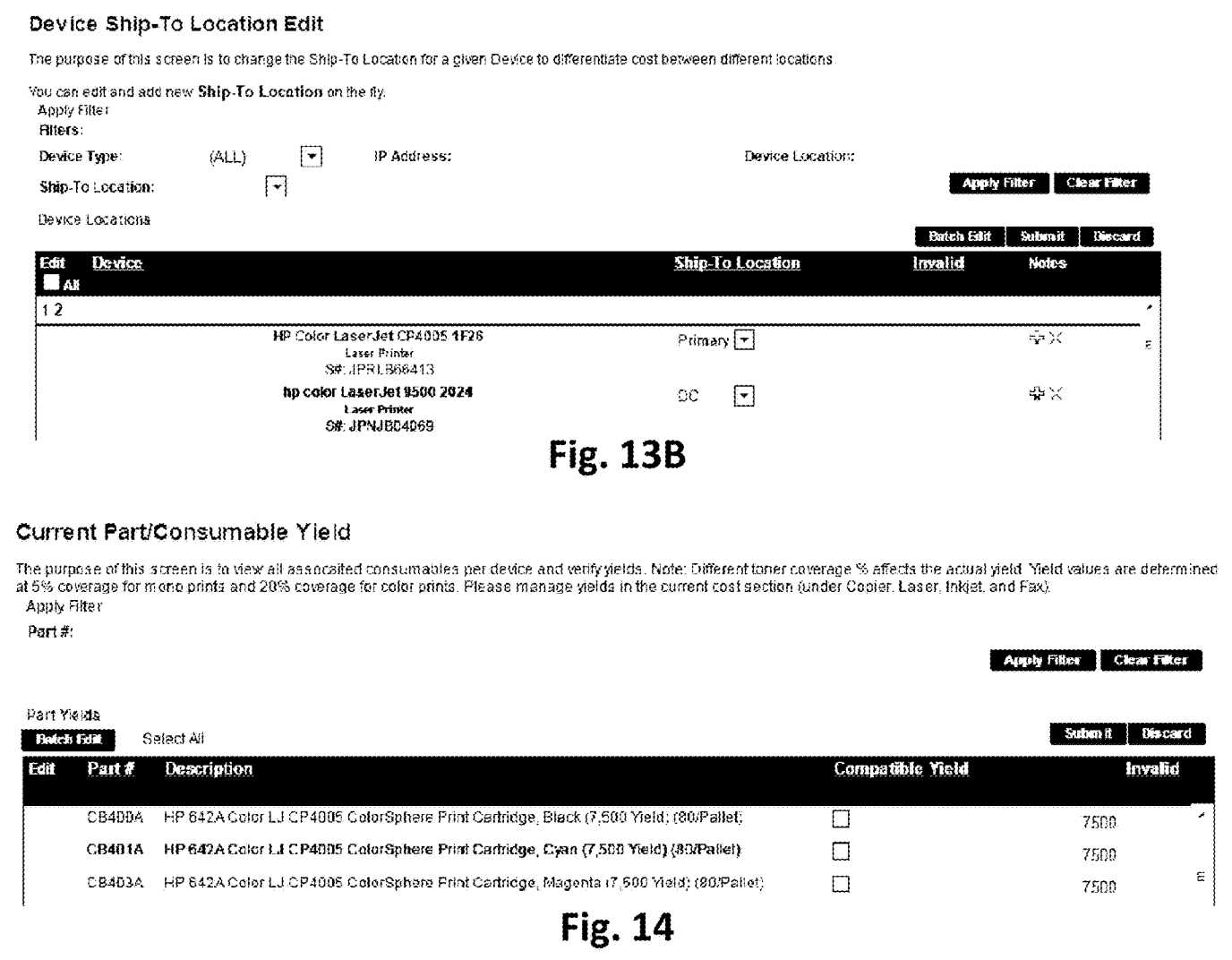

The Current Part/Consumable Yield screen, FIG. 14, lists each consumable part used in the devices and allows for modifications to the page yield associated with the device.

Costs not directly associated with a particular device are tracked on the Current Related Cost screen, FIG. 15. The IS and Admin Staffing cost relates directly to the amount of time spent by the end users departs on maintaining the devices. The "Other" option allows for addition of non-time related expenses with the available Notes option providing space for detail description of the cost.

Devices that were marked as Leased on the Current Monthly Cost screen above have the option to specify lease contract information to be included in the operating and cost savings calculations by providing information in the Current Lease Contracts screen, shown in FIG. 16. The Stream Payoff column is calculated based on the number of months remaining on the contract monthly lease payment plus any other fees.

Figure 17:
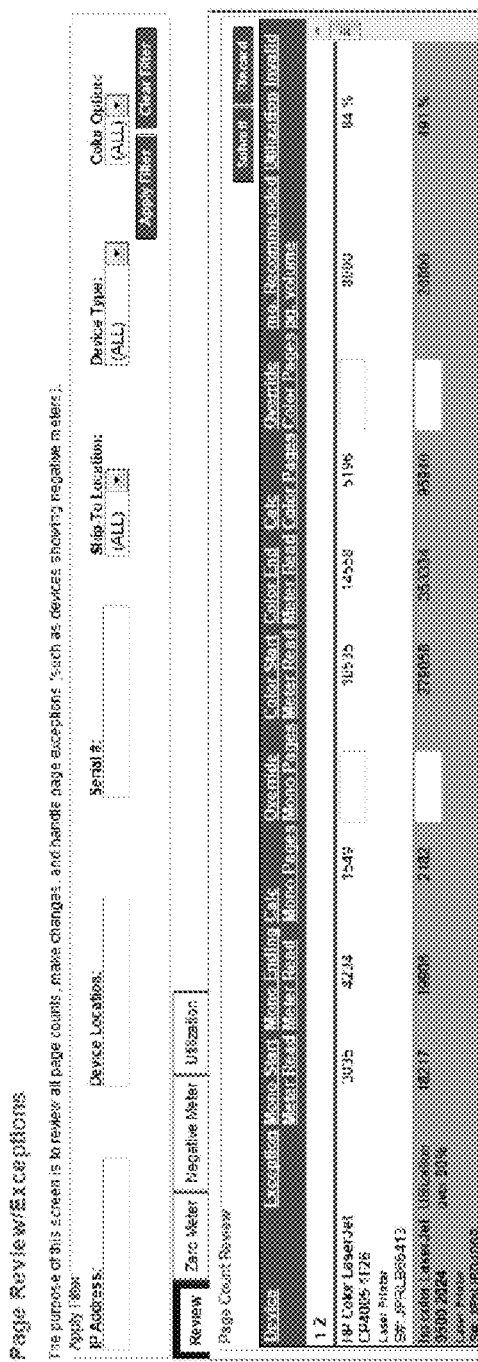

Any inconstancies in meter reads are displayed on the Page Count Review screen, shown in FIG. 17. Inconsistencies are a zero or negative reading as a starting or ending meter read, cases where the ending reading is lower than the starting meter read or where the devices is used in excess of 90% or below 10% of the Recommended Monthly Page Volume. Users can override the calculated monthly pages volume if the value seems suspicious or a better value is known.

The Cost Exception screen lists all devices that have consumable supplies with missing street prices or where the supplied street price is ±20% off the system street price. Corrections are done back on the Consumable Cost Screen. The Part Exception screen lists all Deal Devices that appear to have missing Consumable parts. Not all consumable parts are apply to every Deal Device, it is up to the user to know and understand which parts are really required and need to be added. The exceptions screens are shown together in FIG. 18.

All screens to this point have been presented to enable the user to edit the current configuration of the end user site. This configuration establishes the basis for comparison of the service that Managed Print attempts to provide.

The processes and corresponding screens described below are used in the context of a Decision Time that provides users with an easy option to build different configurations and maximize the benefits for the dealer as well as the end user without having to restart the entire process of entering the basic information about the deal.

Figures 19, 20, 21:
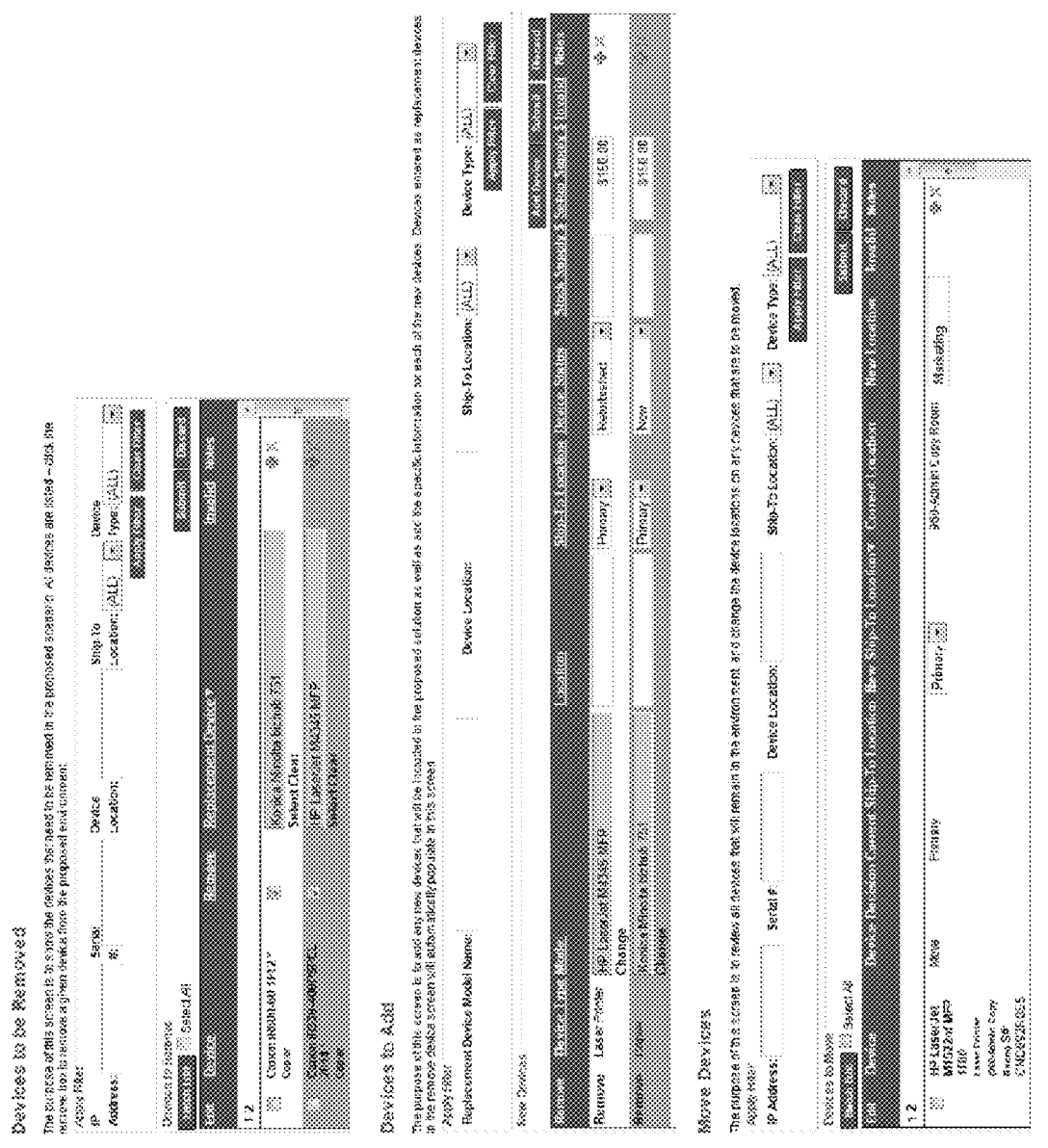

Devices that are no longer required are marked on the Remove Devices screen shown in FIG. 19 as requiring removal by checking the Remove check box. Deals that have a Deal Level of "Include Financing" include the "Replacement Device" column shown above. It allows the user to define a direct replacement device that will receive all images currently produced on the device to be removed as shown in FIG. 19. The MPS provider can select from the model list maintained by the system (most makes and models) along with whether these devices are color or mono and also if they will work well in the program.

Deals with Deal Level of "Include Financing" present the New Device screen shown in FIG. 20. Users can edit and add new Deal Devices for a proposed configuration. Each new device provides the option to indicate the model, location, and ship-To location (if more than one is entered) for the replacement device. The Device Status options are "New", "Refurbished", and "C6 Refurbished" (a preferred refurbishing) and play a role in the maximum financeable amount. The Stock Supply field allows the user to specify the cost of additional stock supplies the end user wants included in the deal as well as the cost of Setup Supplies (if the device is not new).

Right-sizing of a print fleet may require moving devices into different locations to improve efficiency. The move could be based on the Location of the device (from "Hallway" to "Printer Room") or between ship-to locations that affect part and energy cost. A Move Device screen, such as the one shown in FIG. 21, can be used to apply a move to an existing device. A device that remains in the exact location has a Device Status of "Keep" where as a device that experiences a change in Location or Ship-To Location has a Device Status of "Move".

Pages allocated to existing Deal Device can either remain with the device or be mapped away to either a new or other existing deal device, such as shown in FIG. 22 (page mapping tab). Devices can be searched based on IP address, Serial #, Location, and device type. The user can choose to include devices that have already been mapped or not. The left list displays all existing deal devices that meet the filter criteria set above. Columns shown are initial Calculated Mono/Color Page count and Remaining Mono/Color Page count. The particular example depicts a Laser Printer that has 40 pages mapped away with 60 out of 100 original pages remaining. Hovering over the ellipsis ( . . . ) text displays where the pages were moved to. Clicking on "Undo" removes all existing page mappings from the particular deal device. The right grid shows a list of devices that can receive page allocations. The list consists of existing devices that are not to be removed as well as all new deal devices. The columns shown are an indicator if the device is new or existing, how many mono/color pages are currently assigned to the device. The last column shows the number of remaining pages as well as the recommended maximum page count. Selection of one "Map Away" device and one-to-many "Map To" devices or one-to-many "Map Away" and one "Map To" device constitutes a legal combination (as long as no device is selected as both "Map Away" and "Map To") and brings up the Split Page Volume detail where the user specifies in detail how many pages are split between which devices.

The screen shot in FIG. 23 shows an example of a one-to-many mapping screen. The review proposed configuration tab, shown in FIG. 24, gives the MPS provider a narrative of how the pages have been mapped and is completely sortable.

Service and Supply Option decisions are prompted for each device that is included in the proposed configuration, as shown in FIG. 25. The values to set are Buy Type, CPI Supplies, A La Carte Parts, Services, Break/Fix, Review. In all of these tabs MPS providers have the ability to search by IP address, Serial #, location, and device type. The default setting is "CPI SN" (CPI using preferred program) whenever this option is a valid choice for a device.

The Buy Type Tab specifies if the MPS provider is going to buy as a CPI SN, CPI Reseller, or A La Carte. The MPS provider also chooses if the device will use Compatible or OEM consumables. For devices that an MPS provider chooses with the CPI Reseller option, the MPS provider may select if the consumable parts will be OEM or Compatible.

Figure 26:
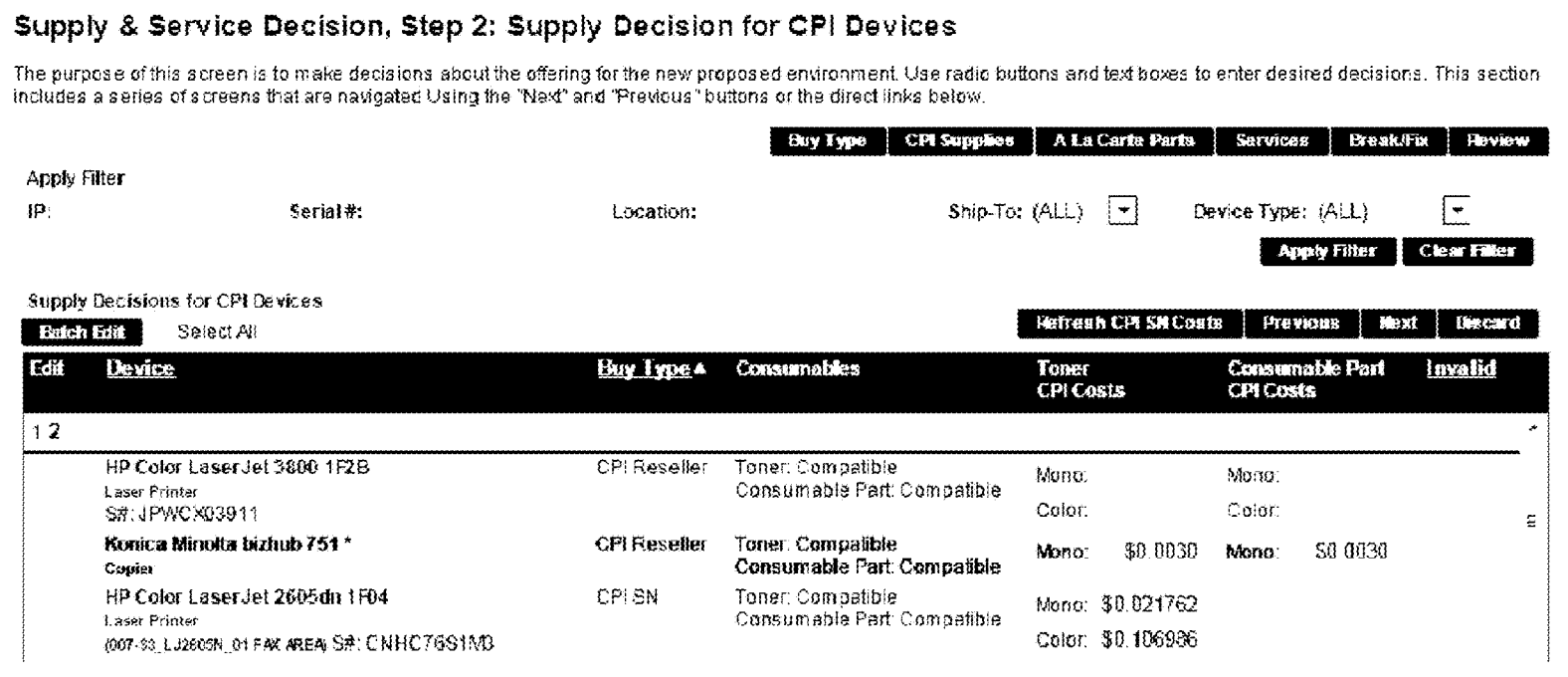

The CPI Supplies Tab, shown in FIG. 26, displays all the devices and the buy type selection, the toner and non toner consumable selections, and the MPS providers CPI toner cost for Mono and Color images. It also allows the MPS provider to input their own costs in for a device that they have chosen to do under the CPI Reseller option.

As shown by the example in FIG. 27, the A La Carte Parts Tab displays all the devices that have been selected using the A La Carte option under buy type. It lists out whether the MPS provider intends to use OEM or Compatible parts for toner and non toner consumables, and it also lists out the SKU's necessary to operate the device with open boxes to add more items or SKU's.

Figures 28, 29:
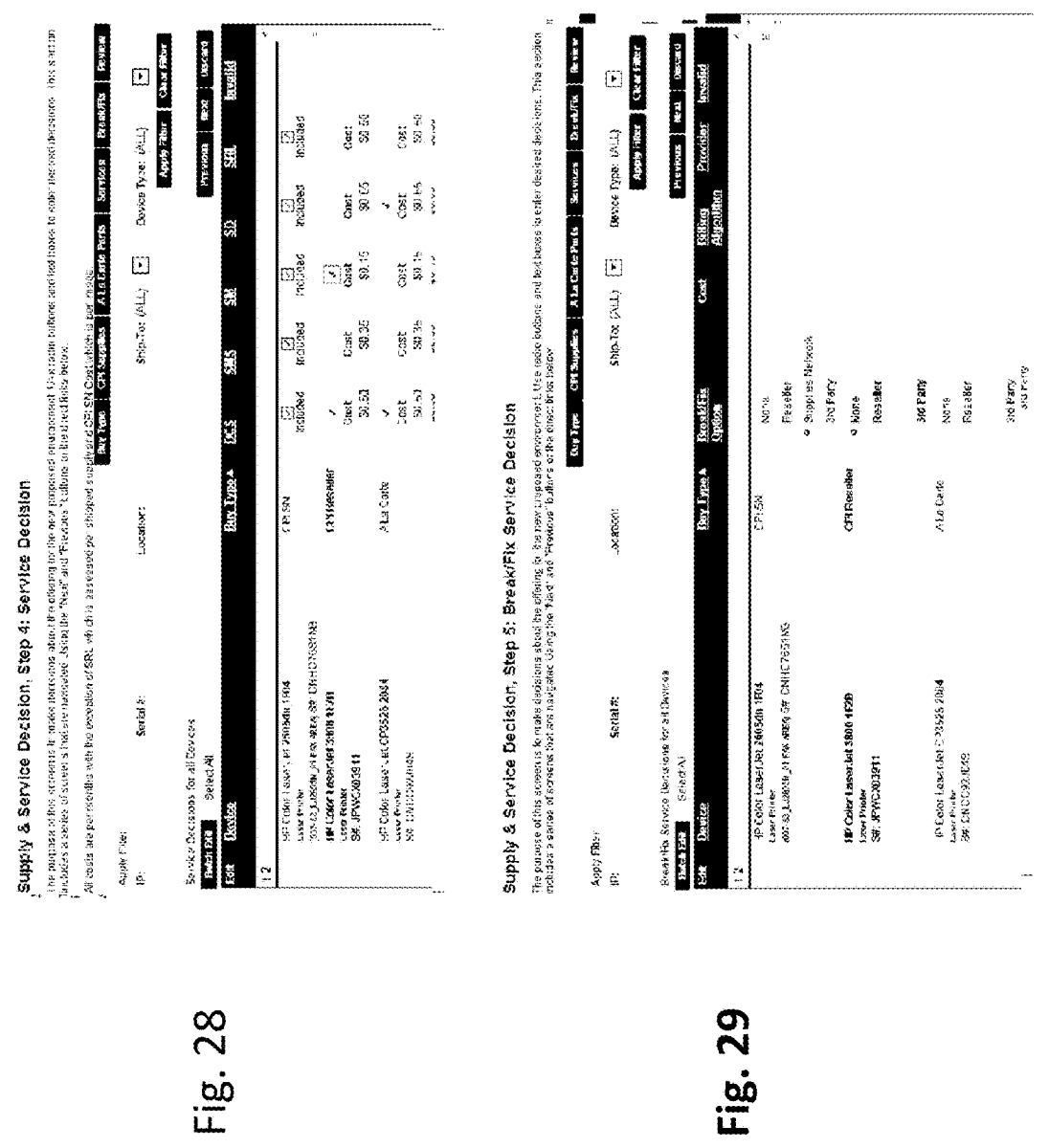

As shown in FIG. 28, the Services Tab displays all devices regardless of buy type. If a device has been selected as CPI SN, all services are automatically checked or include (DCS, SMS, SM, SD, SRL). For the devices that are either chosen as CPI Reseller or A La Carte, the MPS provider has the option to select which service they would like to include in their program along with the monthly charge for that service or per transaction price for the SRL service.

The Break/Fix tab, shown in FIG. 29, lists devices and the corresponding buy type and allows the MPS provider to choose the party that will provide break/fix services for the devices. The options include none, Reseller, Supplies Network (system provider), and $3^{rd}$ Party. If Reseller or 3rd Party is chosen as the selected option, the MPS provider has the ability to enter in their break/fix costs for both mono and color devices and can also choose to enter information either as a CPI value or as a monthly number. The user is also provided a box to identify the particular party that will perform the break/fix service.

Figures 30, 31:
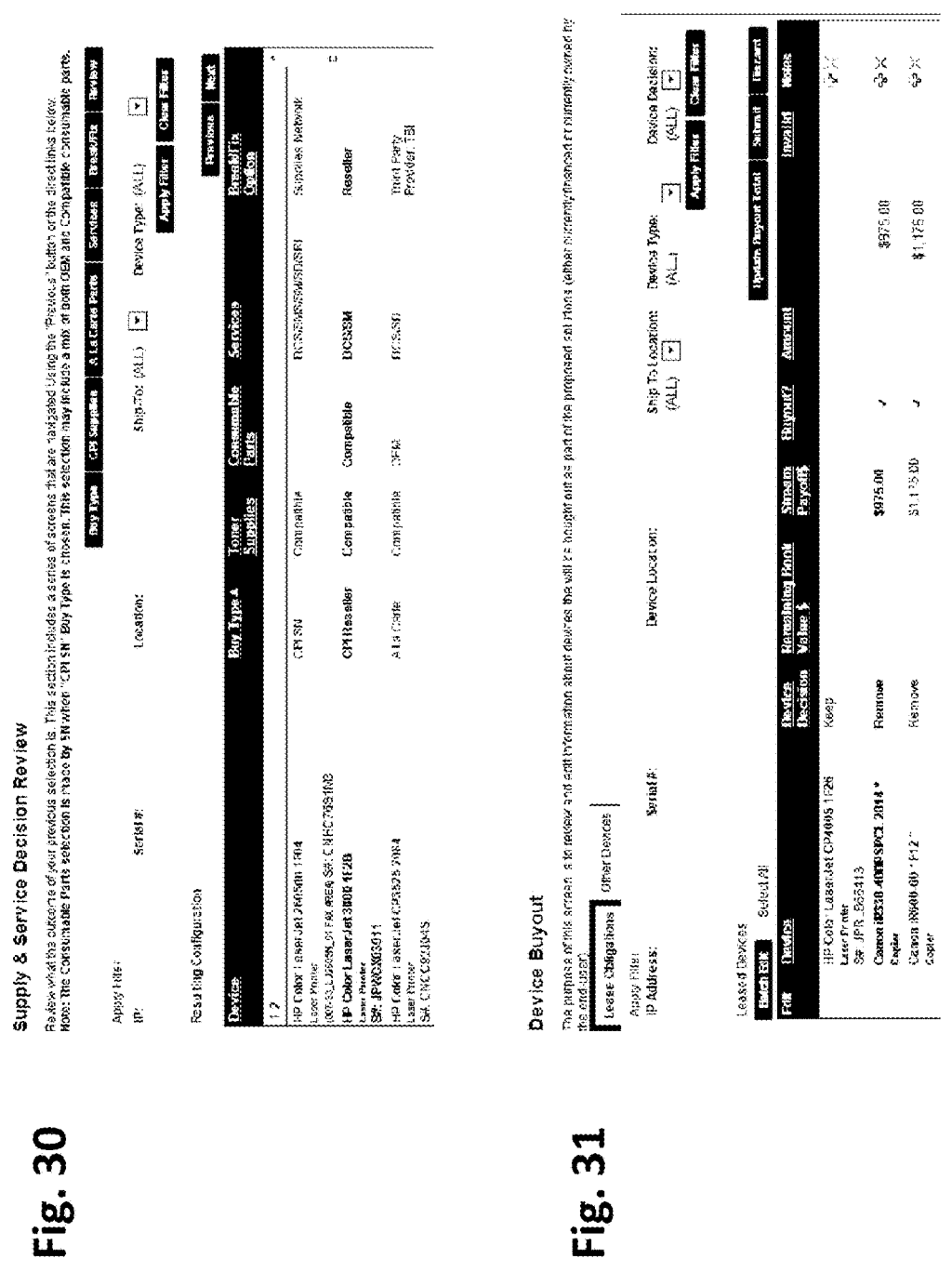

The Review tab displayed in FIG. 30 gives the MPS provider a summary narrative of all the selections they have made by device for the Supply/Service Options tab.

Deals with Service Level "Include Financing" include the Device Buyout screen shown in FIG. 31 to allow for buyout of devices from the proposed configuration. Any amount offered to the dealer is added to the amount requiring financing. The first tab displays leased devices regardless of Device Decision and includes the Stream Payoff amount remaining for the lease. Checking the Buyout checkbox updates the Amount column with the Stream Payoff amount, but the user can override the amount offered. The second tab displays all owned devices and permits the dealer to offer buyout options for other devices at will (devices to not have to be removed to be bought out).

The New Device Cost Screen, FIG. 32, lists all costs associated with acquiring new devices including shipping, and extra costs. It allows the user to granularly add a GP % by device or the user may choose to add GP % under profit goals later in the process. The End of Term Buyout option values are "$1 Out" and "FMV". FMV dictates that the devices are sold to the end user at Fair Market Value at the end of the deal, "$1 Out" means that the end user will acquire the devices for $1 each. Finance rates are impacted by the choice of the End of Term Buyout Option. Deals that contain Refurbished devices may be limited to "$1 Out" as the only option for the End of Term Buyout. The bottom of the screen uses industry averages to calculate the max financeable amount based on new device MSRP.

As shown in FIG. 33, the New Part Yield tab lists consumable SKU's for devices that have been made with the A La Carte selection. It will also allow MPS providers to review and change if necessary the yield associated with those SKU's.

As shown in FIG. 34, the New Part Costs tab displays consumable SKU's for the A La Carte selected devices and allows the MPS provider to load their pricing out of the preferred program system according to their login information. The MPS provider can choose to select a standard program (SN) price or the MPS provider may load a special Price List ID # may be received from their sales rep. In addition, MPS providers have the ability to download a full parts list with prices into the tool with the "import default part cost". MPS providers also have the ability to add a specific GP % by SKU or can wait until profit goals to add GP % to whole deal.

The New Related Costs shown in FIG. 35 is similar to Current related costs, but in most cases the MPS provider would have been able to reduce the current time and costs that it will take to manage their environment due to the nature of the system's "managed print services" automation.

The Exceptions Tab shown in FIG. 36 identifies devices with one or more exceptions, such as failing to associate a monthly page volume, not linking a SKU to an A La Carte Device, failing to associate a cost to any A La Carte SKU's, overworked devices, underutilized devices, and any pages that still need to be mapped.

The New Direct Costs, FIG. 37, accounts for any costs that are not associated to service/supplies or equipment costs to manage the environment (training, network setup, assessments, Preo, etc.). These costs could be one time, monthly or annual costs. The MPS provider may choose to include these costs in the financing to have them included in the final CPI costs or may choose to break out these costs as outside charges.

The Review Print Costs Tab, shown in FIG. 38, lists out all devices included along with disposition of device, buy type, number of monthly mono pages and color pages, new monthly total costs by device, new monthly mono and color costs, and new mono and color CPI's. All of these columns are sortable. These costs are MPS providers raw costs with no GP % associated. This tab allows MPS providers to identify high and low cost devices and may help them to determine if they want to swap or move devices around based on operating costs. At the bottom of this screen, the MPS provider is also given a blended current environment costs.

The Profit Goals Tab, FIG. 39A, allows the MPS provider to start to add GP % to all the selections they have made. They can do an overall GP % with Global GP %, or they can choose to add GP % more granular by OEM vs. Compatible toner and non toner consumables along with break/fix GP %. Also the MPS provider will indicate the deal/finance length (months). At the bottom of the screen the MPS provider will see dealer summary that includes end user costs based on GP % selections and number of pages also broken out by mono and color to be included. Lastly it will indicate dealer monthly profit. The second tab, "Finance Information" displayed in FIG. 39B, indicates lease rates, max financeable amount, equipment costs, obligations/payoffs, dealer profit for equipment and calculate end user monthly lease costs. FIG. 39C shows an abbreviated version of the Profit Goal tab when no financing is include in a deal.

Review Strategy, FIG. 40, compares the current costs calculated based on the Existing Configuration to the New Proposed Price which is based on the dealer costs for the configuration marked up as appropriate. The approach is to display each cost line item to accurately compare what costs change and how the overall savings is composed rather than providing magic number.

The final output of the AMP web site has document templates that are filled with information from the system, as shown in FIG. 41. For example, templates can include a "Non-Disclosure Agreement" or a "Proposal" or some other document. The NDA is a merged file that contains names of all parties involved in the agreement.

The Proposal contains sections that list the goals of the deal as well as the solutions to reach the goals. Other sections contain lists of existing devices along with the ability to populate current meters for implementation based on date selection, new devices to be purchased and how the new configuration reduces the printing costs to end users, and lastly the CPI Agreement which will auto populate based on selections in the tool.

Predictive Supply Replenishment

Figure 42:
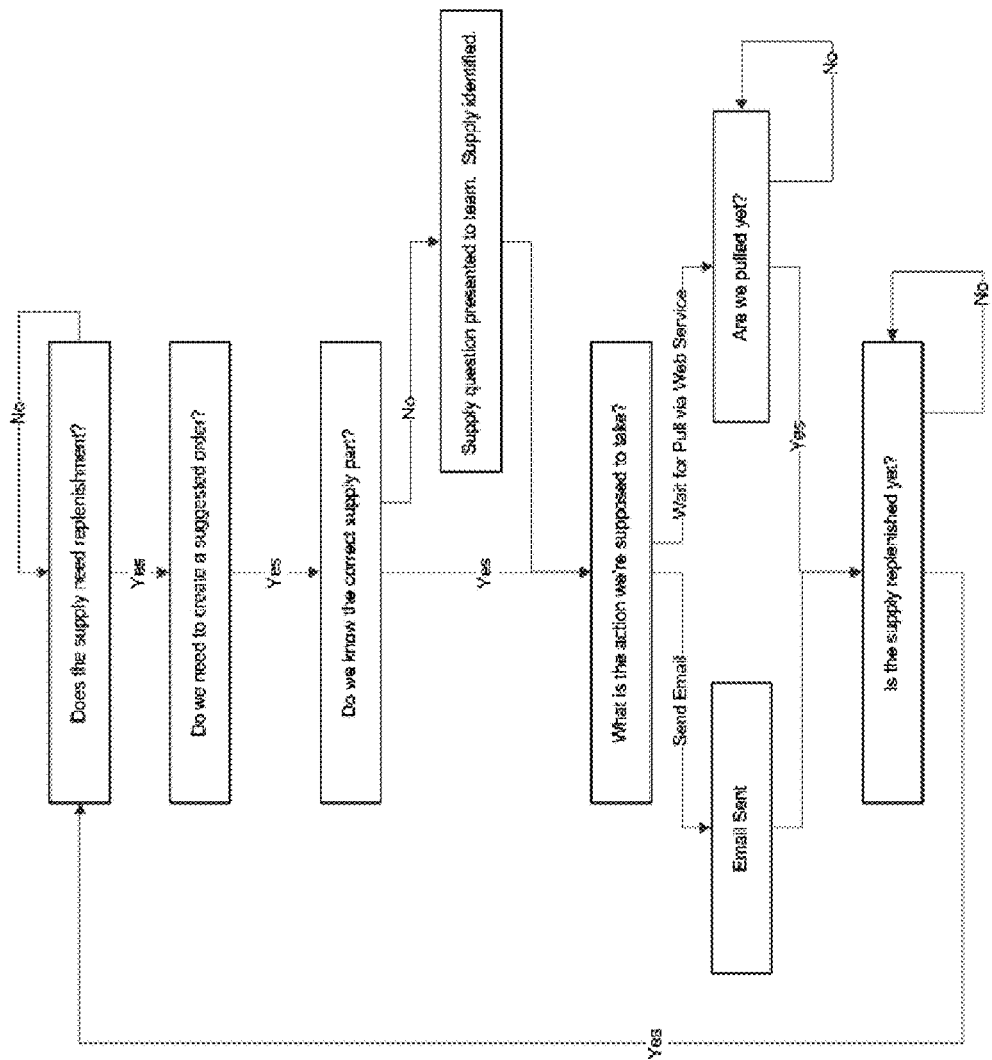
FIG. 42 is a flowchart of the supply replenishment logic.

The Predictive Supplies Replenishment (PSR) process is used to remotely analyze and replenish supplies. As generally shown in FIG. 42, this process uses data collected from output devices located in customer environments via standard data collection software tools as well as end user behavior software tools to evaluate the remaining level of supplies (both toner and non-toner supplies—fusers, maintenance kits, drums, etc.) based on end user usage patterns rather than percentage of supply remaining. This analysis enables the creation of a supplies replenishment notification, often delivered to the MPS provider supplying the supplies to the end user, based on the number of days of supplies remaining allowing for appropriate time in transit.

Predictive Supply Replenishment differs from other replenishment solutions on the market today in that replenishment is determined based on a number of data variables (not just percentage of supply remaining) and end user usage patterns. This combination enables the system to uniquely determine replenishment based on day's remaining of supply in the machine and therefore order and deliver replacement supplies predictably just as they are needed.

In the supplies replenishment lifecycle, the system periodically reviews new data from each device and produces notifications for those that are low on supplies that can either be transmitted to the dealer via email or pulled via a web service complete with full information on the particular consumable part needed. The goal is to generate low supply notifications based on a set number of days before the supply runs out (10 days for example). There are three events that will cause the system to generate a notification for a device: (1) a low supply reading, (2) a text message from the device, or (3) evidence of a replenishment (called after-the-fact notifications). Each of these events are discussed below.

A numeric low supply reading is the best, most reliable of the notifications, because the device has communicated a numeric percentage-remaining figure to the remote data collection software (DCS). In the range of acceptable percentages (0%-100%), the MPS AIS logic checks for erroneous 0% readings that some devices occasionally produce, as well as sporadic 100% misreads. For color devices, the device reports percentage-remaining for each color separately. When referring to low supply readings, "low" means less than or equal to the threshold percentage but greater than zero (not equal to zero, because a reported reading of zero is often bogus). The percentage is defined either for the specific device in the database (or the related ERP system), or for the end user account as a whole (initially 15%, but can be changed).

The system also has the capability of adjusting the thresholds automatically for a device based on its cartridge yield and print volume (usage). Even if a device doesn't warrant a particular higher percentage based on the volume of usage, there may be business reasons to keep the percentage high, such as if the device is sporadically mission-critical. To accomplish this, a minimum percentage on a device can be optionally set. With the minimum percentage set, even if the MPS AIS algorithms evaluate that the percentage should be 12%, if the minimum is set to 20%, the MPS AIS algorithms will not override the manually set percentage.

Figure 47:
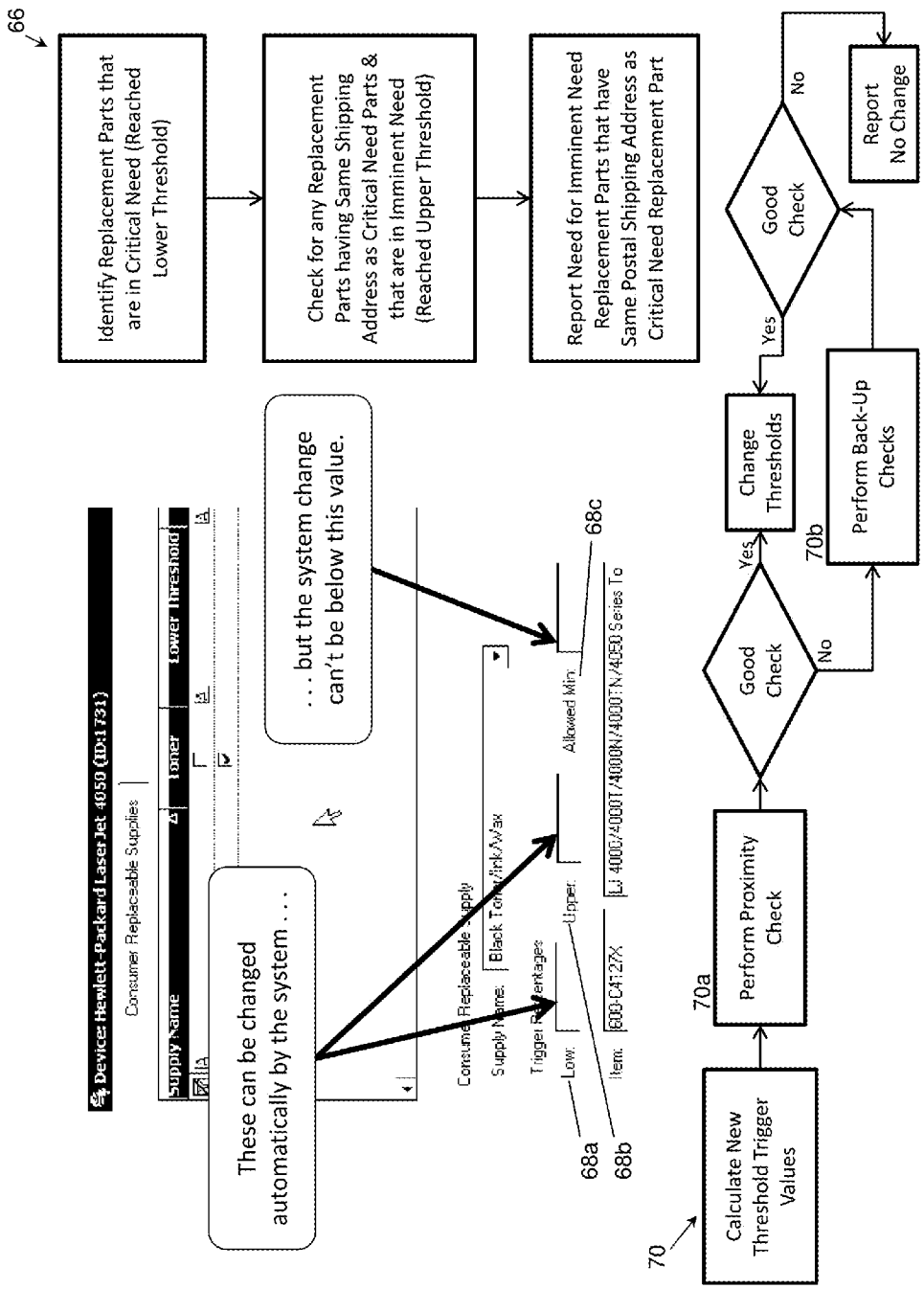
FIG. 47 is a screen showing the calculated trigger values for the upper trigger threshold and the lower trigger threshold and the minimum limit that cannot be overridden.

As shown in FIG. 47, the present invention preferably includes a shipping efficiency logic 66 that uses two trigger threshold percentages: a lower, critical threshold 68$a$ and an upper, secondary threshold 68$b$. The lower threshold indicates that the device is ready for replenishment in the estimated time period. The upper threshold indicates that there will soon be an imminent need for replenishment, based on a longer time period. When a supply level falls to the lower (critical) threshold trigger, such as the supply level of a toner cartridge, a notification is generated for that device and the particular supply (black, yellow, magenta or cyan) regardless of whether any other devices require servicing. Other long life supply replenishment items (fusers, drums, maintenance kits) are also analyzed in this manner. When the supply level falls below the upper threshold trigger (but is still higher than the critical percentage), a notification is generated only if there is already another device for the same ship-to address that needs a notification. This enables the efficient distribution of replenished supplies to the end user customer. Accordingly, based on the shipping efficiency logic, the lower critical threshold serves as a replenishment-required limit and the upper imminent threshold serves as a replenishment-optional limit. Examples of threshold trigger percentages are shown in FIGS. 43 and 47. The calculations used to determine the threshold percentages are discussed below in association with Equations 1 and 2. As discussed below, regardless of the calculated lower threshold value, the system will not use a lower threshold that is less than a set minimum limit 68$c$.

Figure 44A:
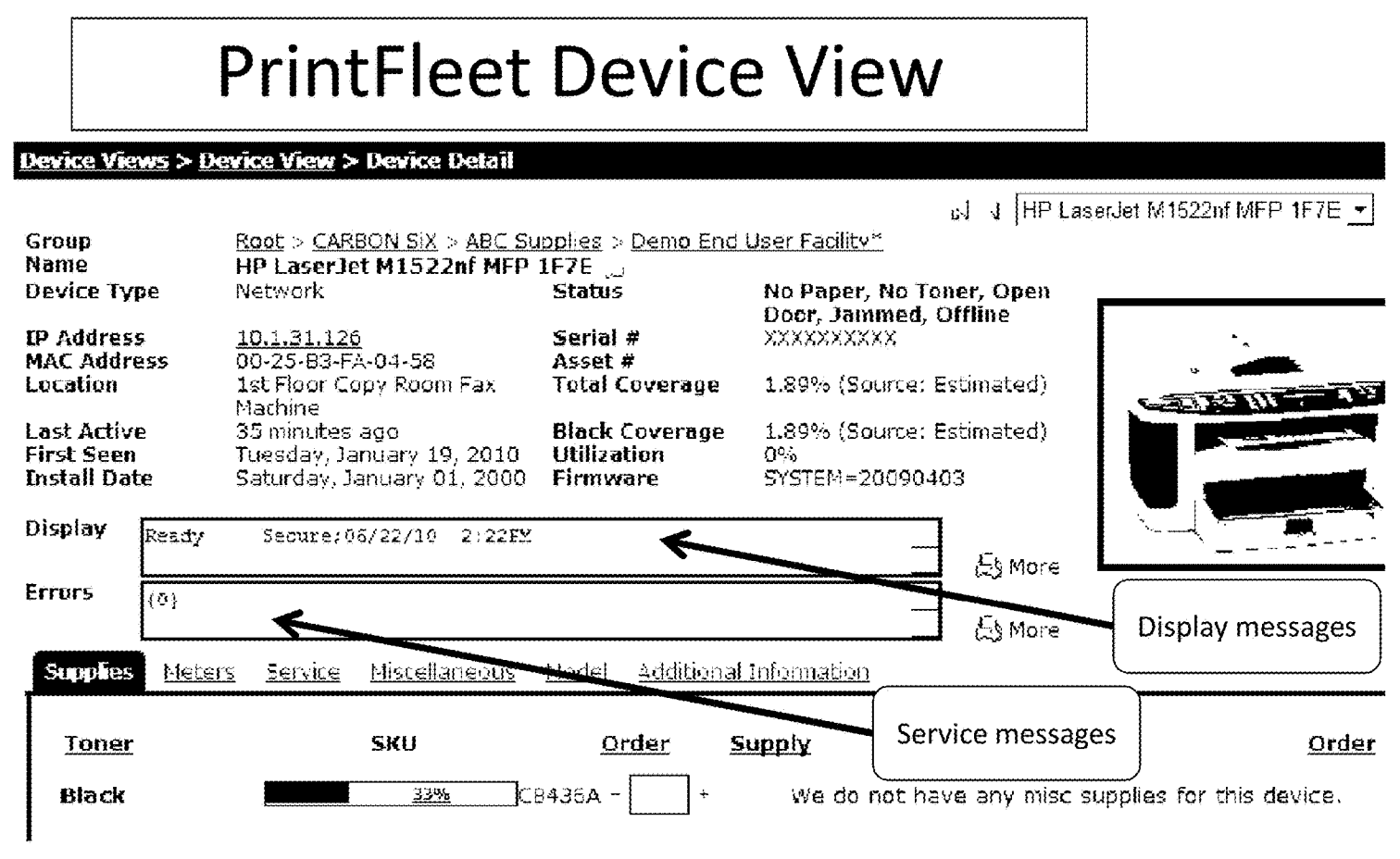
Figure 44B:
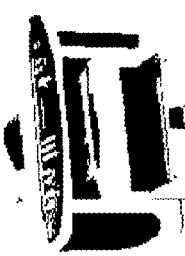

Not all devices communicate toner levels to the data collators with numeric reading, but almost all devices report their LCD display readings, and other devices can communicate error codes or service codes. Therefore, when document output devices do not provide numeric supply level readings, the logic in the present invention evaluates the text message. In such a case, a notification is generated for a device when one or more trigger phrases appear. The system can look for the text messages in the display and service fields, and examples of the messages are shown in FIGS. 44A and 44B (corresponding with the PrintFleet and FMAudit software).

Some trigger phrases that are searched for by system include the following text messages listed in Table 1 below. The asterisks in the text messages represent wildcard matches.

TABLE 1

| Trigger Phrases |
| --- |
| *toner* |
| *add ink* |
| *ink low* |
| *order black* |
| *order cyan* |
| *order magenta* |
| *order yellow* |
| *add black* |
| *add cyan* |
| *add magenta* |
| *add yellow* |
| *replace black* |
| *replace cyan* |
| *replace magenta* |
| *replace yellow* |
| *order cartridge* |
| *cartridge low* |

Note that devices which report supply levels could also display text that would match the trigger phrases. Text-based notifications are not sent when there is a recent numeric toner level reading from the device. Also, notifications are not sent when there is an unresolved notification for the device. In addition, the system allows for a notification review process in which experts can monitor the notifications automatically produced by the system void a text-based notification that is not justified based on a closer review and analysis.

Color names in the text do not need to be read by the system. All text-based notifications can initially show that they are for color "unknown" and can be provided in a queue of notifications that are "Pending Information". For text-based notifications, the system initially provides information about the particular device along with the two textual fields and a list of consumable part types (i.e. Black Toner, Cyan Toner, etc). With this information, a person reviewing the queue can choose the right part and then the system automatically identifies the corresponding SKU, and the notification is then sent with fully validated information just like the percentage-based notifications. The list of possible parts for a given device is limited to the parts that are known to work with the model. For instance, a black and white printer wouldn't have Cyan Toner as an option in the drop-down.

Figure 45:
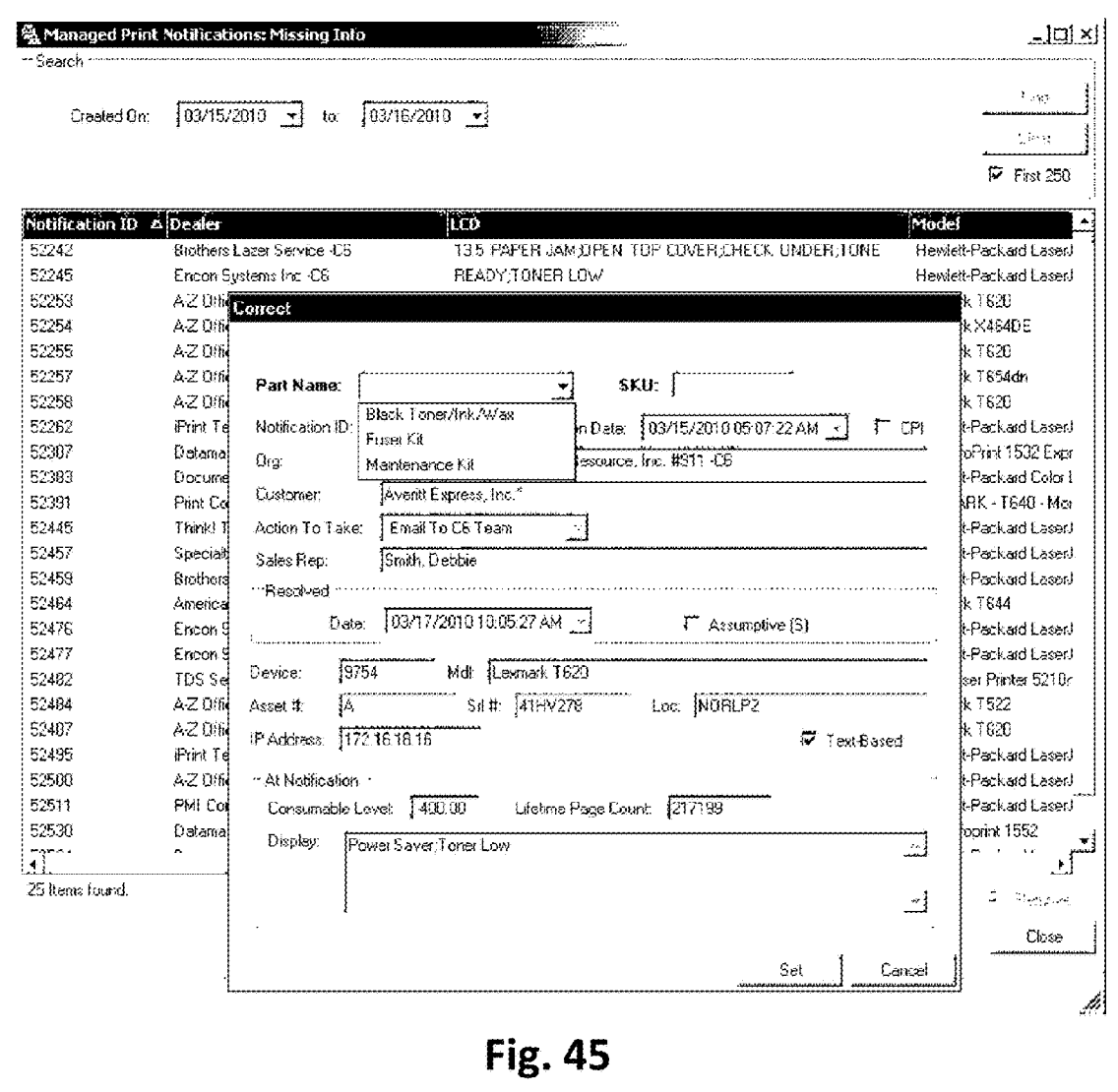

If supply data is inaccurate or corrupted, the system evaluates device data from other perspectives. For example, the system can search for and identify devices that show a replenishment (a transition from a low supply level to a high one) in a particular time period, such as the last 24 hours, but which do not have an unresolved notification. This may indicate that a shipment was missed. It may also indicate that the page volume is so high for the particular device that a significant amount of the toner is used up in the particular time period (a day for example). An example of a missing notification is shown in FIG. 45. As is also shown in FIG. 46 the system also tracks where notifications are sent.

The system also periodically runs a process that tries to adjust the low supply percentages on each device based on the current volume of pages being printed. The process preferably runs daily at night, except for holidays and weekends. In order for a device to be included in this process, several conditions must be satisfied: (1) the device's model name in the ERP is not "Undefined" or "Unknown" or some similar unidentified name; (2) there is a part number specified for a supply item, either for the specific device, or for the printer model (a part number for an ink supply or solid wax is also acceptable, if the device is not toner-based); (3) the supply item has a yield in Item Maintenance; and (4) there has been a numeric supply reading in the previous 24 hours (generally, the reading period).

The formula used to calculate the critical (lower) trigger percentage is provided in Equation 1 below.

$$\frac{ppd \times t_l}{y} \times 100 \qquad \text{Equation 1}$$

In Equation 1, the terms are defined as follows:
ppd=the higher of a) the average pages printed per day over the last 30 days, or b) the average pages over the last 7 days.
$t_l$=the critical reorder lead time (currently 10 days).
y=the supply yield.

The formula used to calculate the secondary (upper) trigger percentage is similar to Equation 1, with the difference being that $t_u$ used as the secondary reorder lead time is set at a longer time period (currently 20 days, doubling the critical lead time for the imminent lead time).

$$\frac{ppd \times t_u}{y} \times 100 \qquad \text{Equation 2}$$

In addition to these equations in the change threshold process 70, the system includes check logic 70 that is preferably run before making the changes to trigger threshold values based on the latest calculations. Whenever the system calculates the replenishment trigger threshold, if the value is close to the existing value, then the system makes the change. This proximity check 70a is preferably a low value, such as within 3%, although this could be changed depending on the fleet of machines or even particular devices. However, if the difference between the new calculated value and the existing value is larger than the proximity check allowance, or if there is no existing value, then the system will make the change only when the following back-up check 70b conditions are satisfied: (1) the device is produced by a manufacturer that is known to work well with the collators' software; (2) there hasn't been a questionable supply reading within a limited time period (such as the past 15 days); (3) the calculated percent is within a reasonable range (such as between 10%-60%); (4) the system has sufficient data history on the device (such as 30 days); (5) there is not a difference (within 25%) between the average pages printed per day over the longer evaluation period as compared with the pages per day over the shorter evaluation period (the last 7 days); and (6) the new calculated percent is higher than the allowed minimum. As discussed above, examples of the upper and lower trigger thresholds 68a, 68b and the minimum limit 68c that cannot be overridden are shown in FIG. 47. It will also be appreciated that the system could be allowed to make a change to the trigger threshold based on satisfying various combinations of less than all of the forgoing conditions. Accordingly, as discussed above and shown in FIG. 47, the present invention uses the proximity trigger threshold check 70a and the back-up trigger threshold check 70b to determine whether the trigger thresholds should be automatically changed.

Once a low-supply notification is generated for a device, the system will continue to monitor the device, looking for conditions that show that the supply item has been replaced. Once the conditions show that there has been a replacement, the system marks the notification as resolved (i.e., replenished supply). This completes the cycle, so that the device is once again eligible for a new low-supply notification.

There are three scenarios where the system resolves a low-supply notification. For most cases, there is are good numeric supply level readings from the device, and the system performs a supply level evaluation on a transition in the supply level between a very low value and a very high value, which is usually a good indicator of a replaced supply. However, printers and their users sometimes cause reading levels to fluctuate and so the system compensates for such situations. For example, a user can remove a supply that's reading low, shake it, and put it back in. The supply level goes up somewhat, but the slight increase should not be counted as a replenishment. In another situation, some printers occasionally provide misreads of 0% or 100%. Accordingly, the present invention includes some rules to avoid improperly resolving a low-supply notification: (1) the new, high reading is at least 75%, (2) the difference between the new, high reading & last low reading is 50% or more; (3) there are two consecutive high readings (avoids 100% misreads); and (4) there are two consecutive low readings before the new, high reading (avoids 0% misreads). If any one of these rules is not met, there may be a possible false-positive replacement indication and additional readings should be taken for further evaluation.

The other two scenarios are special situations rather than the typical scenario. A notification based on the LCD will be resolved by the system when 1,500 pages have been printed, and the display has been clear of any trigger keywords for a period of time (such as a time period between 24 hours-72 hours). The system can also resolve a notification based on assumptions about yield, coverage, and expected pages remaining. This process could be used by the system when a notification was based on a numeric supply level reading for a device, but the device has stopped reporting levels for some reason. These resolutions are sometimes called assumptive resolutions. On the notifications, these are denoted by the letter "S" in parentheses next to the resolution date. The formula for the resolution of a notification is provided in Equation 3 below.

$$p >= pn + (4 \times tn \times y)$$ Equation 3

In Equation 3, the terms are defined as follows:
p is the current lifetime page count.
pn is the lifetime page count at the time of notification.
tn is the supply level at the time of notification.
y is the supply yield.

In a situation where a notification was generated when the supply level hit 17%, where the page count at that time was 20389 pages and a supply item that has a nominal yield of 6,000 pages, the notification will be resolved by the system when the lifetime page count reaches 20389+(4×17%×6000) =24469 pages.

Web Interface Presenting Replenishment Information

Figure 48:
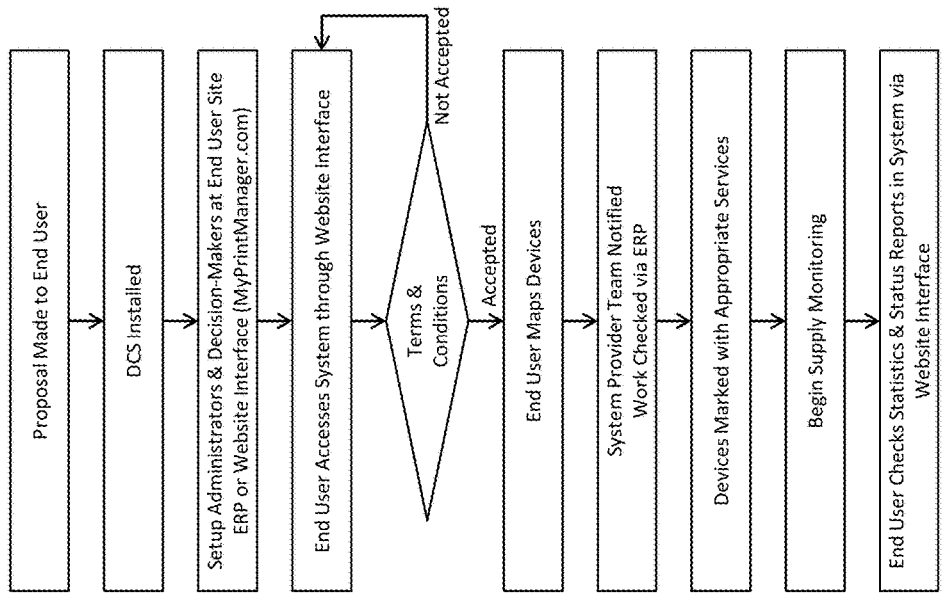
FIG. 48 is a flowchart of a user stepping through the process of the present inventive system.

Both MPS providers and end users are able to view the supply status of any output device via a web interface. Additionally, end users are also able to register to access their own device data in the system using the web interface. MPS providers and end users are also able to search for devices by serial number, asset ID, MAC address, and brand/model of the output device. Information displayed in response to the inquiry shows the estimated days remaining of each supply for the selected output device, along with an estimated delivery date of that supply replenishment to the end user. The display also shows previous shipment information, and includes any current UPS or FedEx tracking numbers for supplies in route to the end user. In addition, this information is made available for major ERP software solutions to pull into the back office, eliminating the need for MPS providers to type any information about the replenishment supply and end user delivery information. Finally, the web interface allows the MPS provider or end user to provide unique location/delivery information for replenishment supplies for each device, which is added to the supply routing labels, discussed below. A flow chart in FIG. 48 shows the steps performed by an end user when using the system through the web interface.

It will be appreciated that the web interface is not just used to track the physical delivery of ordered items. The web interface of the present invention allows MPS providers and end users to access the information which predicts the next supply replenishment for their device as well as tracking delivery of ordered items. In addition, the web interface of the present invention allows users and MPS providers to bypass the data collection service (the data collator) for the particular devices and enter device location/delivery information directly into the Interim Database. In addition, users can access the interactive knowledge base to diagnose document output device issues or initiate service requests. These service requests are processed by the system provider's service desk, and status of the service request can be reviewed by the end user at any time via the web interface.

Dealers who log on can see their entire list of devices that they have entered into the system for notifications, and end users can also self-register particular devices. In either case, the dealers and users can see various statistics and status reports about the devices within their user accounts, such as the level of each consumable (when the information is available through the DCS), the estimated delivery date of each consumable, and the last several shipments for the various devices. Also, some end users may also be able to enter into a contract with a dealer via the site when they are a designated decision-maker as well as map their device information (Asset #, Ship-To Address, Model). Dealers can also see their list of customers and individual end users registered for the site, request new installs and run a variety of reports about their end user environments.

Supply Routing Labels

Figure 49:
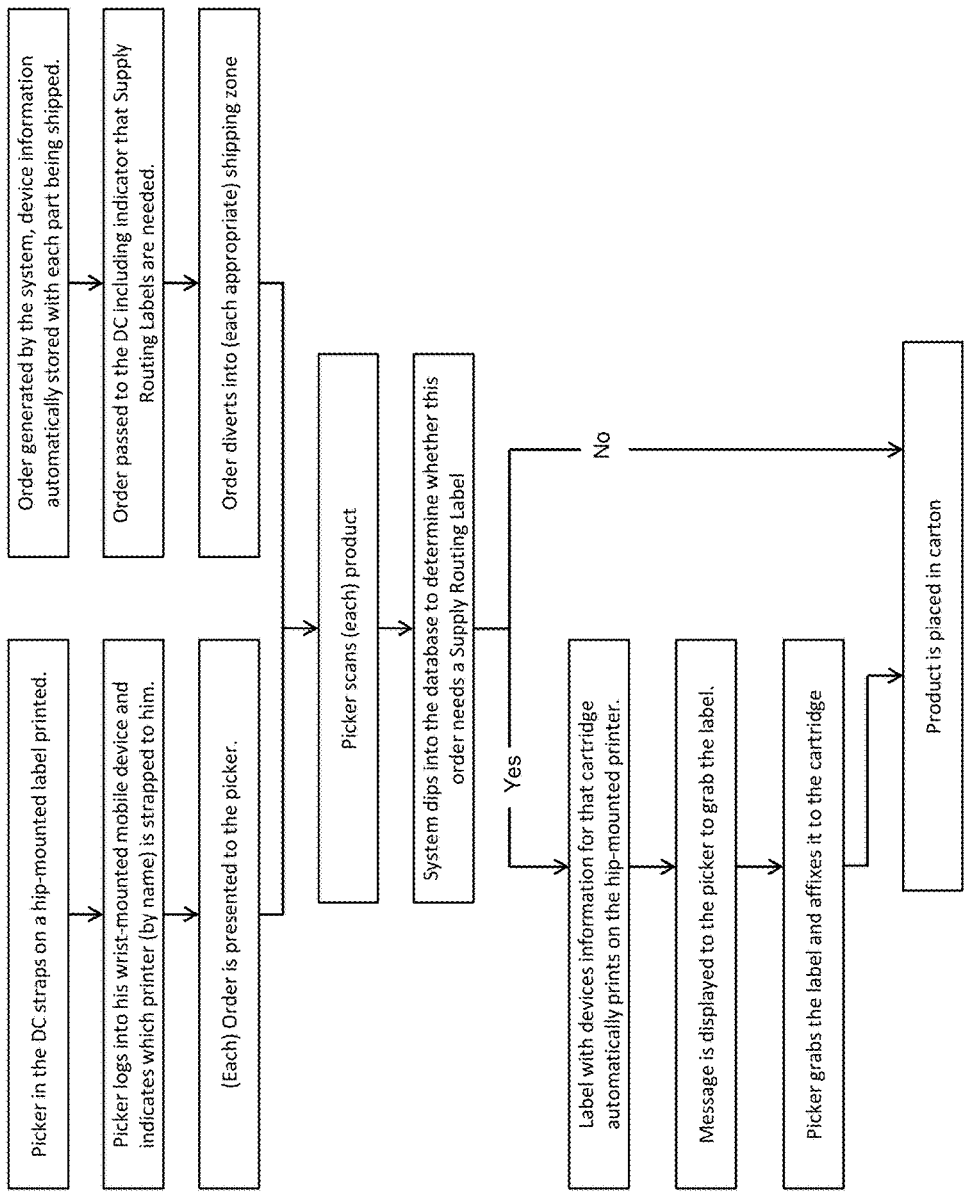
FIG. 49 is a flowchart of the supply routing label process according to the present invention.
Figure 50:
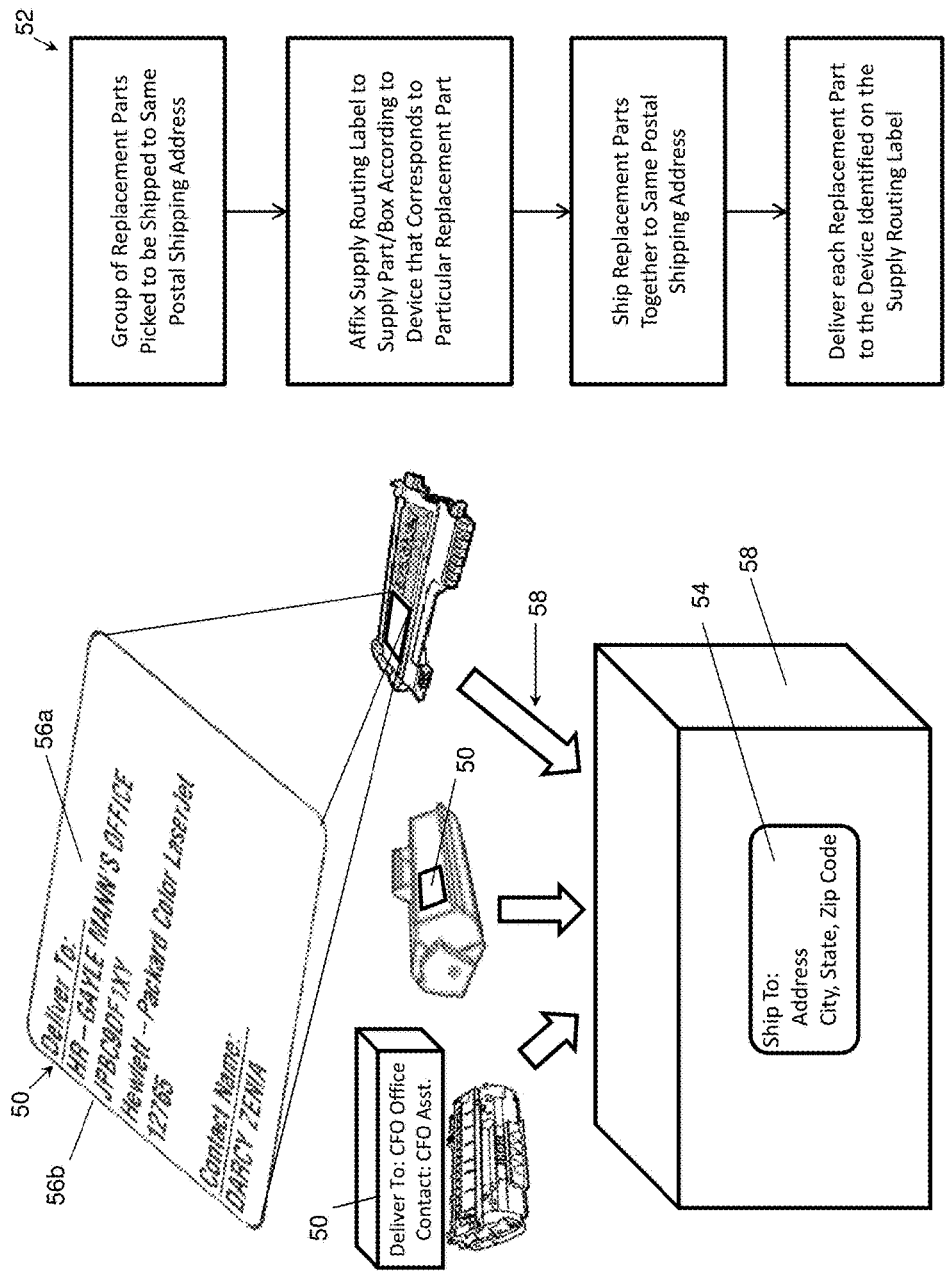
FIG. 50 is a diagram of the supply routing label and corresponding process according to the present invention.

A flow chart in FIG. 49 shows the steps to produce a supply routing label. In the distribution center, each of the supply "pickers" wears a hip-mounted printer. When the pickers log into their picking zone each day, they register their printer's name so the system knows what they are hooked up to. As they work the orders through the day, the system checks each of the orders for the supply routing label flag. When the picker scans a SKU on an order that is flagged, the device information that had been recorded is obtained from the database and a print job is automatically triggered for the printer on the picker's hip. The picker's screen pops up a notification to grab the label. The picker can acknowledge that they performed the task on their device, registering the fact that they grabbed the label and applied it on the top of the cartridge box. As shown in FIG. 50, the cartridge then gets placed in the shipping carton like any other product. This solution enables replacement supplies to quickly be routed to the intended output device, eliminating the need to determine which device the supply is intended for, which would require an analysis of the supplies part number, all output devices which might use this supplies part number, and which of those output devices actually currently have a need for supplies replenishment.

As shown in FIG. 50, the supply routing labels 50 are produced and affixed to the replacement parts according to the supply correlation logic 52 that in which supply parts for the devices are correlated with the actual location 56a of the respective devices as well as the corresponding shipping address 54. As indicated above, the supply correlation logic also provides instructions to the distribution center personnel for placing the supply routing labels on the proper supply parts or their boxes 58 which are grouped together in a single shipment container 60. The shipping address is provided on the exterior face of the shipping container, and the supply routing labels are provided on the supply part's exterior packaging. The packaging can be any type of receptacle for the supply, such as a box, a wrapper, or the supply cartridge itself, especially if it is an individually-sealed cartridge.

Generally, when the replenished supply has been pulled from stock in the appropriate system provider's distribution center, a Supplies Routing Label (SRL) is printed and affixed to the top of the box containing the supplies item. Supplies delivery information for a specific output device, including output device location, serial number, asset ID, and key operator, which has been previously loaded into either standard data collection software tools or the Interim Database via the system provider's dedicated website (by either end users or MPS providers) is placed on a 2" by 3" label, is affixed to the supply in the distribution center shipping process. Upon arrival at the designated end user shipping location, the information on the label is used to "route" the supply to the correct physical location within the end user's location.

The management of the supply routing labels can be authorized at a dealer-level (meaning all shipments for that dealer regardless of customer or destination or model), at the shipping address level (all shipments for a particular ship to) or at an end-user level (all shipments to all shipping locations of that end user). For any sales orders that get placed for one of these authorized entities, the order is flagged as needing an asset label when the order provided to distribution center for fulfillment. For any flagged order, the particular device that the supply is intended for is included in the sales order line. The flag is traceable in the system and can be reported on/analyzed extensively.

As suggested above, the MPS AIS process allows supplies to be labeled directly with their exact device destination which can be very helpful in a large end user environment. For example, when multiple cartridges are shipped in a box, the supply routing label of the present invention provides the receiving personnel with the information about which devices are intended for each one of the individual cartridges. Accordingly, regardless of whether the cartridges have the same or different SKUs, the supply routing label identifies each cartridge specifically for each device. This helps to ensure the supply is routed directly to the document output device that needs immediate replenishment. Previously known systems have been known to place shipping and device information on packing slips which. However, with multiple replacement devices for different types of machines in a single order, end user customers would need to match up the supply item with the intended output device. During the internal routing process, the packing slip may not be provided with the replacement supply and there could be a misrouting of certain items, in which case the end user customer has no way to match up the supply to the output device other than through a time-intensive review which would require an analysis of the supply items used for any given output device in the end user customer's environment and tracking back through the internal routing process. The present invention solves this problem by identifying the particular device to which a supply part is intended at the beginning of the shipping process and including the identifying information on the supply part throughout the shipping process.

Proactive Service Alert (PSA)

Traditionally printer service has been a reactionary response based on a device notifying, or actually shutting down on a user. The user then has to contact a service provider to perform service. This reactive method usually causes for a longer "down" time, which can sometimes be avoided all together by bypassing the need for the user to reach out to a provider. The proactive service alert process of the present invention actually evaluates the data from all of the devices being monitored through the Data Collection Software and searches the reported text in the Display, Errors, and Status information fields for key text that indicates a critical service issue, or preventative action that is pending. Examples of key text parameters are listed in Table 2 below.

TABLE 2

| Key Text for Service |
| --- |
| *Fatal* |
| *RIP* |
| *Lift* |
| *Firmware* |
| *Maintenance* |
| *failure* |
| *RAM* |
| *EIO* |
| *Waste* |
| *Memory* |
| *Perform* |
| *Card* |
| *PC* |
| *Drum* |
| *Transfer* |
| *Kit* |
| *Fuser* |

These Data points and key text searches are periodically evaluated, such as on a daily basis, and are used to generate a Keyword Text report that is reviewed by an authorized service technician to determine validity and severity of issue. The technician conducts further research in the Data Collection Software if necessary, and then enters and manages a service ticket within the system or forwards notification and recommendation to User/Dealer for action.

In addition to managing the efficient and effective replenishment of supply items used in the production of hardcopy output in the end user customer environment, service alerts are also gathered remotely via industry standard device data collection tools and pulled into the Interim Database. This process parses data collected from output devices to determine and classify severity of errors reported by the output device. This analysis is then evaluated further to understand relationships between various reported error patterns, then proactively provided via multiple methods to either the MPS provider or end user (and called Proactive Service Alerts), depending upon who has responsibility for the repair of said output devices.

The process of analyzing and categorizing errors is far more efficient than current available methods, which are limited to emails sent to the MPS provider directly from the data collection software tools each time an alert is generated by any device in the end customer's environment (which can number in the hundreds per day in a larger environment). This legacy process requires the MPS provider to have technical personnel read and evaluate each email alert to determine if the device may need on site service. This process simply passes raw data to the MPS provider, requiring the analysis, categorization, and ultimate response to this data be done by the MPS provider.

Break/Fix Service Ticketing Module

Figure 51A:
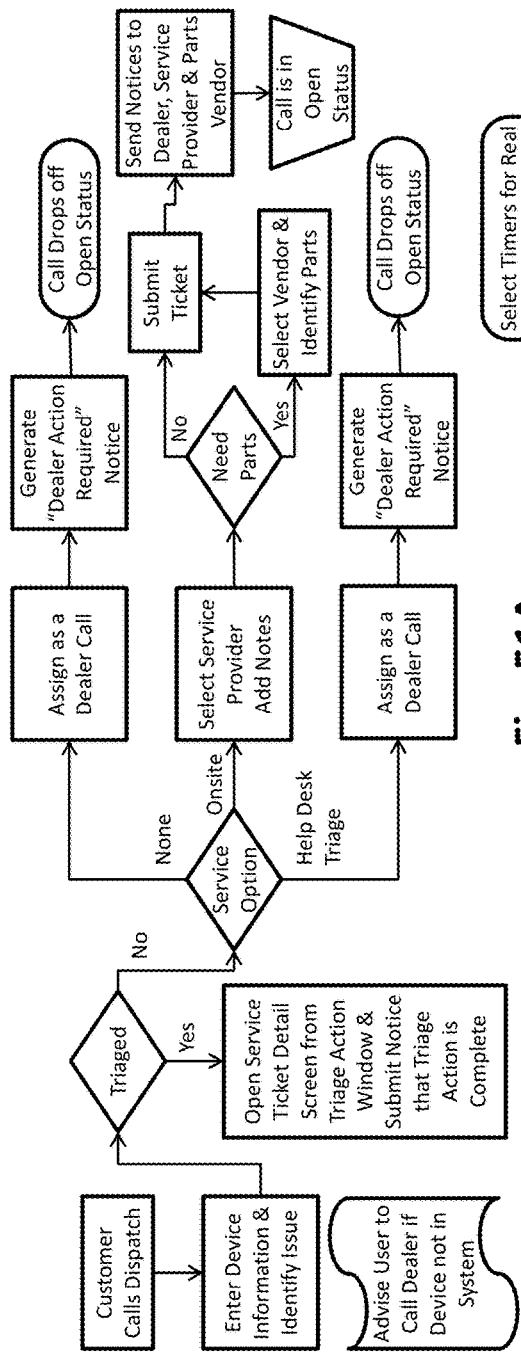
FIGS. 51A and 51B are flowcharts of the service intake and service tracking steps in the service ticket module.
Figure 51B:
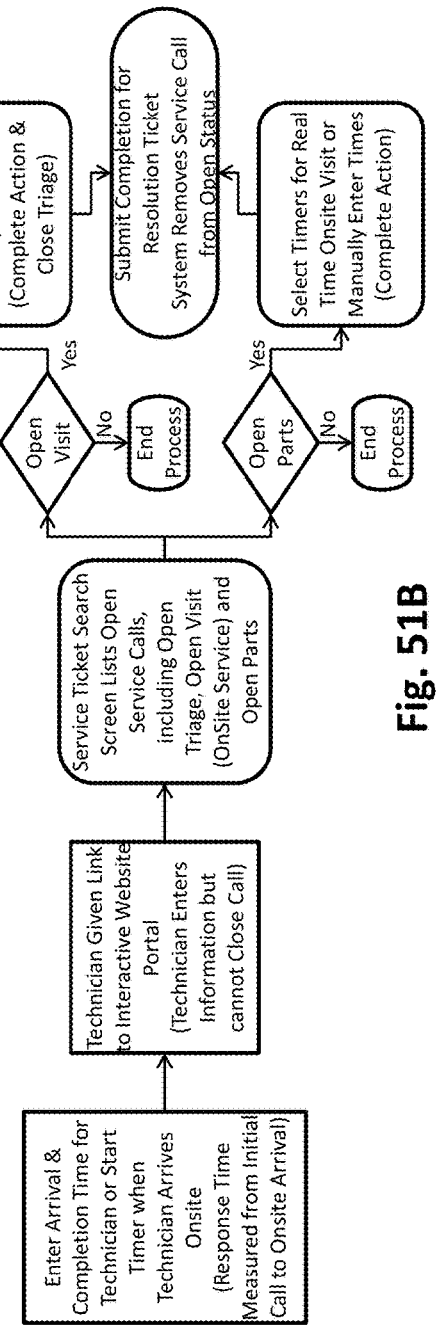
Figure 52:
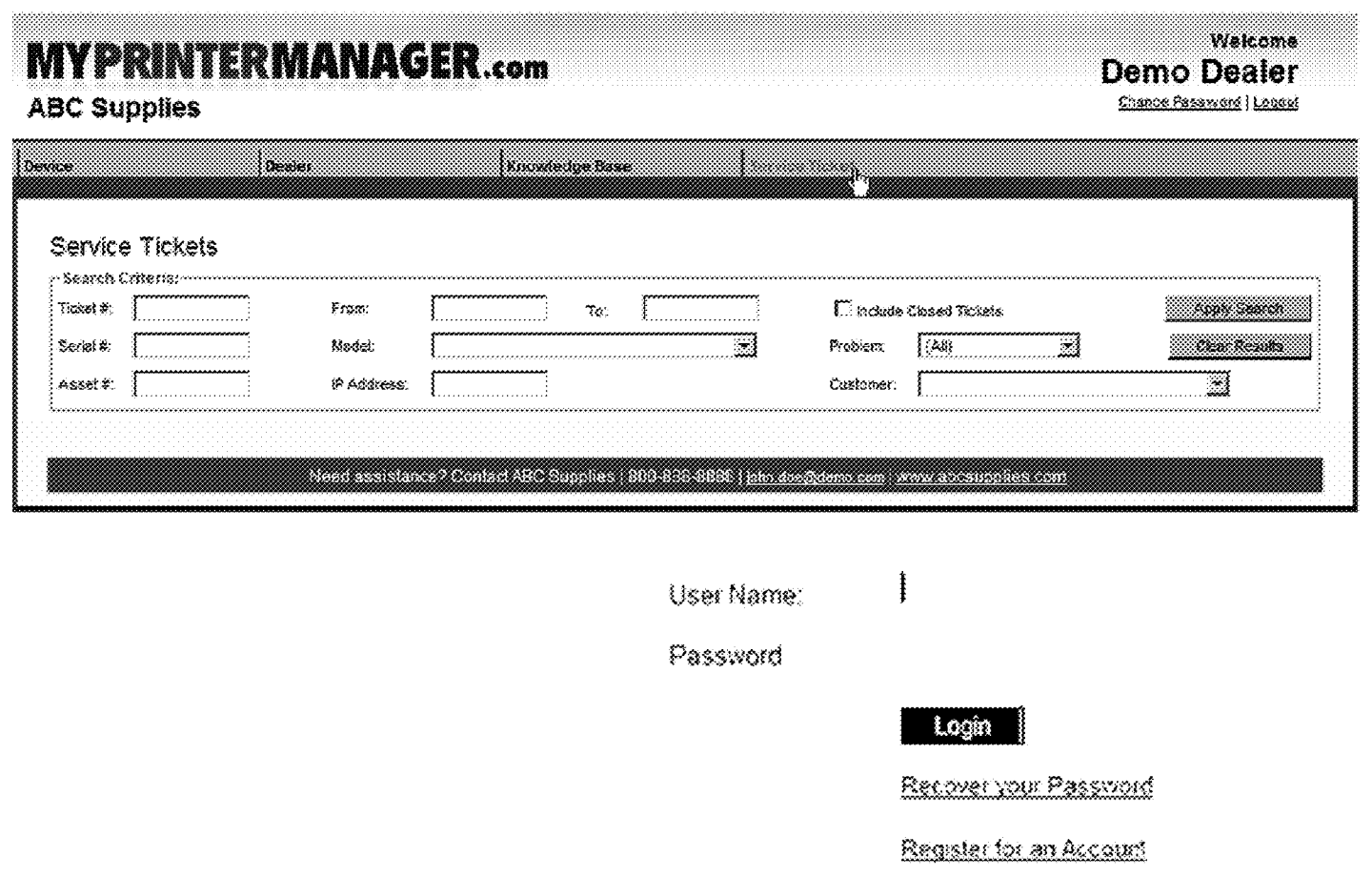
Figure 53:
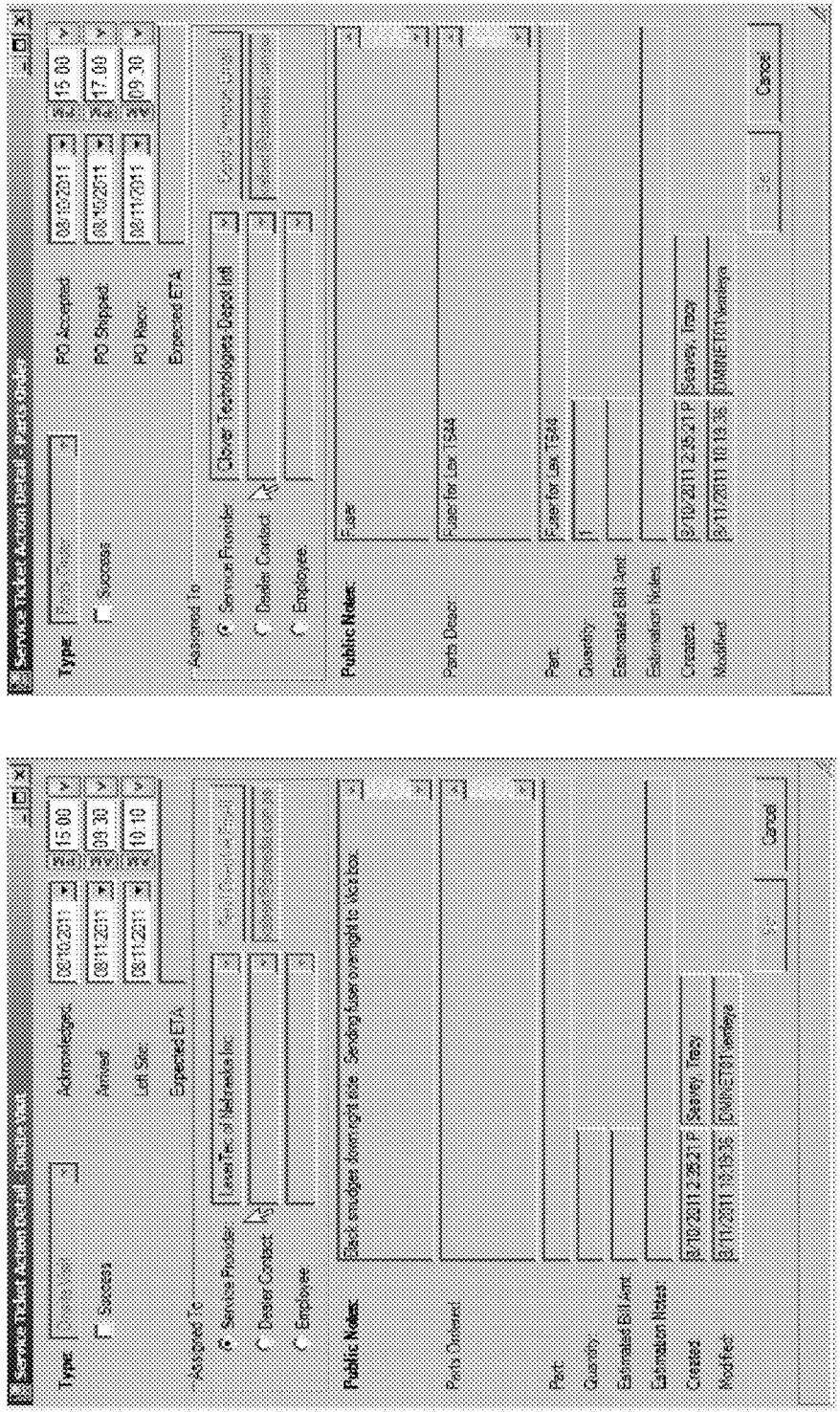
FIG. 53 is a listing of service ticket actions and parts.

The System allows tickets to be initiated internally by the system provider's service desk personnel responding to phoned in service requests, or externally by the Dealer or End User via the interactive website portal. The basic service ticket intake process through the module is shown in FIG. 51, and an example of login and welcome screens are shown in FIG. 52. The module has every Service provider vendor setup by manufacturer, model, and zip code they are capable of servicing. An example of service ticket viewing, including service provider/parts provider information, is shown by the screen shots in FIG. 53. Each end user account is set up with a primary and secondary servicing provider that will show when a ticket for that account is presented for further action. Parts providers are also displayed for selection when sourcing parts is required. Many of the on-site calls resulting from the service tickets are fully covered by monthly or annual fees, but the module also interacts with a generic services billing module that will bill service calls specifically designated for billing. The module may also be used to assign tickets for MPS provider to directly address break/fix service needs of end users if the MPS provider so chooses.

Figure 54:
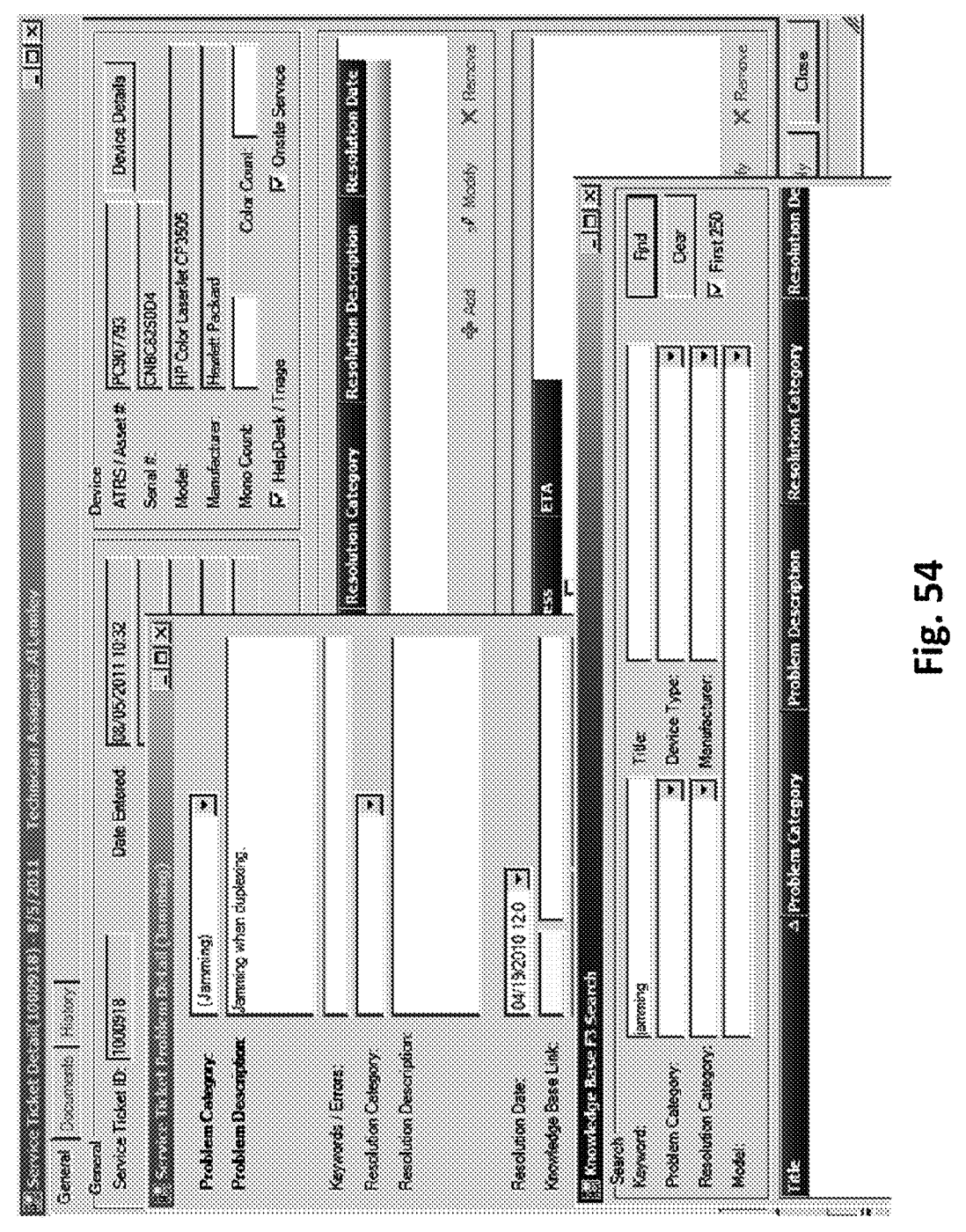

As shown in FIG. 54, the module also allows the Dealer, end user, or internal service desk personnel the ability to create trouble tickets in the module directly from the interactive web interface and assign existing articles that have helped to solve each trouble ticket submitted. If there is not an existing article associated with the solution, the internal service desk personnel create one around existing model data and post it in the knowledge base. As the articles are assigned, they continue to build the knowledge base portion of the interim database. Accordingly, the knowledge base provides troubleshooting recommendations to the dealers, end users, and service desk personnel through the interactive website.

The MPS AIS tool is used for evaluating device fleets for break/fix service coverage liability as well. Traditionally, a service company will require a physical inspection of a used device before accepting the liability of covering under a blanket break/fix service contract. An MP Model Database that reports each model seen in the system was designed, and contains model specific data that helps in the remote evaluation process of determining certain factors for acceptance, or failure, which would allow only coverage of the device via a time and materials billing agreement. Before a device can be considered for inclusion to the break/fix insurance coverage, the remote monitoring service must be installed for a minimum of 30 days. Five parameters are evaluated using the system: (1) the model is reviewed to confirm it is one that is acceptable under the offer break/fix servicing plan; (2) comparison of current life meter count and recommended life of the device as determined by Manufacturer, or the history of each model's life expectancy; (3) service errors seen via the remote monitoring (if repaired and cleared, device may be re-evaluated for coverage); (4) confirm the devices serial number—if the device doesn't display a serial number, it will fail the evaluation because there is no way to confirm the life-count of the device, and can only be covered via time and materials billing; and (5) current non-toner consumable levels must meet a minimum life level (25% for example) for a portion to be covered when the service includes on-site visits to replace the parts. When a life level is under the minimum required, a device may still be accepted for overall coverage, but a service call to replace any non-toner consumable under the 25% level would be billable under time and materials method.

Figure 55:
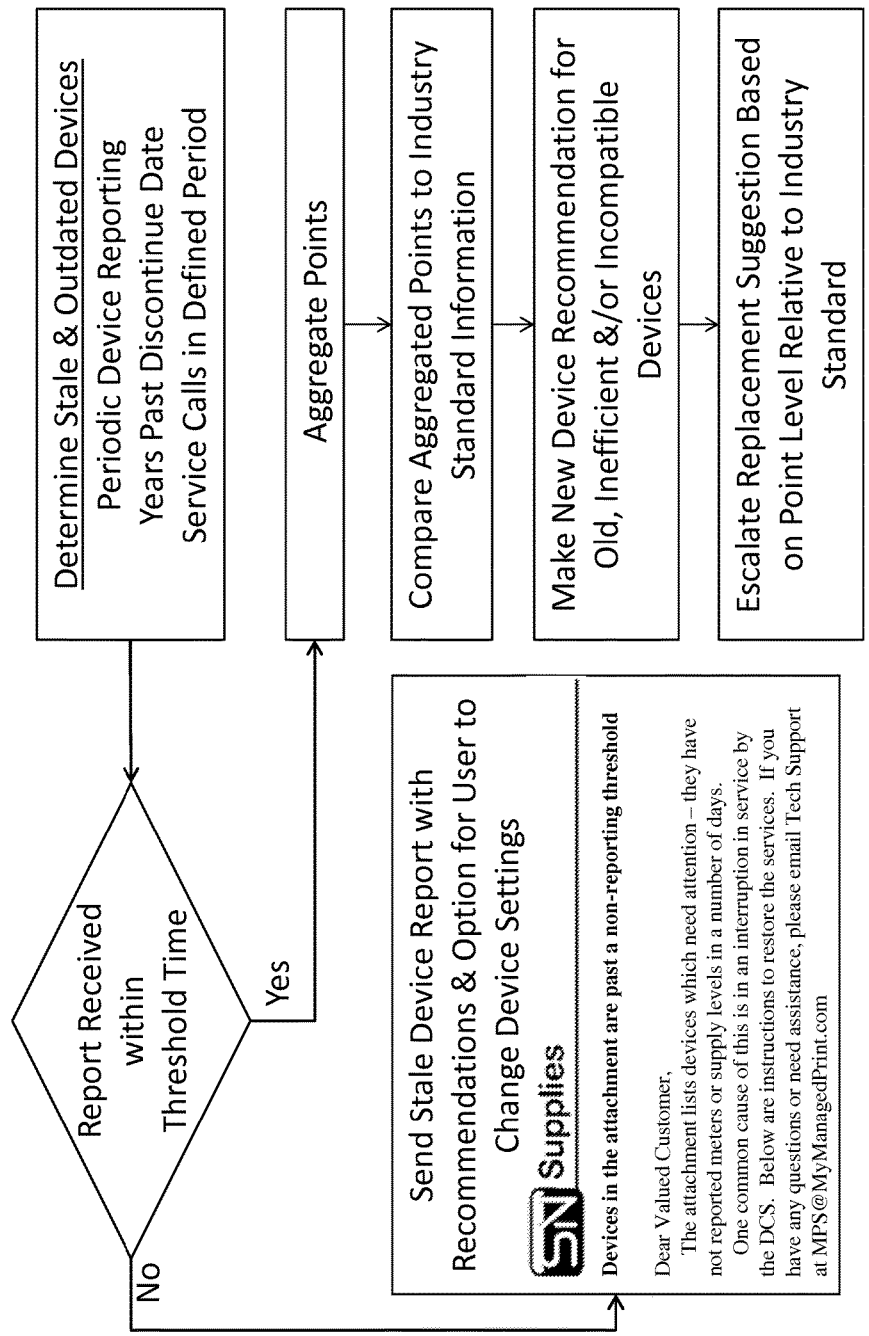
FIG. 55 is an example of a stale and outdated device evaluation process.

Auto alerting to the MPS providers of potential issues or situations is also accomplished via the MPS AIS tool. MPS providers are alerted of issues like stale and outdated devices in their accounts. An overview of the stale device and outdated device evaluations are shown in FIG. 55. Periodic reports are expected for devices that are being monitored, and when a device does not provide one or more reports within a threshold reporting period, the system will flag the device as being stale. A report is generated on stale devices with options for resolving the issue, and the MPS providers have the ability to expand thresholds of the stale device notices if they choose by changing settings on devices in the interactive website tool. To determine outdated devices, the system calculates and assigns data points for the devices. Algorithms generate a point value for each data point, i.e. number of years past discontinued date of a device (increasing points based on years past date), number of service calls received on a device over a period of time, etc. The points are aggregated and compared to the industry-standard information for device models in the database to make new device recommendations for replacing old, inefficient, or incompatible devices in an end user's environment. The higher the number of points that are determined for a device, the higher the escalation of replacement suggestion to the MPS provider/end user.

MPS providers are also alerted when new devices that are not setup for service appear in their end user's environments. An email is pushed to them with the device identification, and the proper data needed to set up the device up is requested. MPS providers are also alerted when a contract is within 6 months of its expiration date so that they may proactively work with the end user to extend.

The invention as described above greatly improves the efficiency and accuracy of the process of analyzing the costs associated with creating hardcopy on document output devices (printers, copiers, fax machines, etc.) in end user customer environments, developing proposals to optimize the placement and use of document output devices based on the end user customer's desired workflow, and managing the resulting optimized document output device fleet in the replenishment of supplies and maintain the uptime, or availability, of this fleet for document output needs.

Beginning with the AMP software, the system gives MPS providers a single, integrated tool to perform the assessment, modeling, and generation of proposals for end user customer environments. With the introduction of the present invention, MPS providers no longer need to manually pull in data from device-specific data collection software tools, determine industry-standard "assumptive" values for output device costs for devices that do not have actual cost records, or manually calculate all costs (break/fix service, supplies, new output devices, finance costs, etc.) in order to generate a proposal for the end user customer to manage their output device fleet. The MPS AIS tool could also allow users of the tool to dynamically place and manage output devices on a floor plan in a visually interactive manner.

The Predictive Supplies Replenishment process solves a number of problems with currently known supplies replenishment systems. First, most supplies replenishment processes require the end user to identify a supply needs to be replenished, determine the appropriate replacement supply part number, determine how to place the order, then manage a manual process of tracking the replenishment. Often, this means the output device "runs out" of the supply (or requires significant safety stock, which is subject to shrinkage), or the user re-orders the incorrect supply (which increases supply chain costs significantly). For MPS providers who offer to "manage" the end user's supplies replenishment remotely, they only have rudimentary supplies percentage information (and only on some brands and models) which is not an accurate way to determine when the supply is requiring replenishment. And, those MPS providers have no automated way to determine whether a supply truly needs to be replaced, because an increase in supplies "percent remaining" can vary based on user behavior (i.e., removing the supply, rocking it, and replacing it), which results in "double shipping" supply.

The PSR solution solves all of these problems. For the end user, supplies replenishment is triggered just when it is needed, alleviating the need to order manually. And, because the supply replacement information is always known, the right supply is sent every time, virtually eliminating incorrect supplies replenishment and greatly reducing the need for emergency stock. For the MPS provider, this solution ensures supplies do not run out, that too many supplies are not shipped, and the correct supply is shipped every time. Therefore, the present invention improves the predictability of supplies replenishment which reduces supplies inventory requirements, risk of inventory "shrinkage," and greatly reduces the risk that supplies will "run out." The present invention also greatly reduces the risk of erroneous orders of replacement supplies, since replacement supplies are particularly identified and can be tied to each output device and provided to MPS providers' back office ERP systems for "no touch" order replenishment. The present invention also improves the efficiency of MPS providers' abilities to remotely manage supplies replenishment of end user output devices, minimizing "double" replenishments and incorrect supplies replacements, while allowing the supplies status of end user's output devices to be monitored.

Analysis of existing solutions is more qualitative than quantitative in nature. However, these analyses show that using existing solutions, up to 5% of all supply orders are incorrect, resulting either in the cost of return and replacement or increased supplies inventory at the end user location. This invention virtually eliminates any mis-orders. Also, current supplies replenishment processes at the end user location involve multiple personnel to determine replenishment is required, determine appropriate supply replacement part numbers, and manually order replenishment. This invention eliminates the involvement of the end user to place an order, requiring only approval of the replenishment order in certain circumstances. Analysis of end user supplies inventory shows that 30 to 40% of all supplies inventory is for output devices the end user either no longer owns or never owned. This invention eliminates the replenishment of supplies for output devices no longer being used, and the virtual elimination of mis-ordering dramatically reduces the risk of any supplies in the end user's inventory for output devices they never have owned.

For MPS providers who monitor output devices for end users, the average number of personnel to monitor supplies email alerts (based on percent of supply remaining) are 3 to 4 per every 10,000 devices being monitored. This invention eliminates the need for personnel to monitor email alerts from output device monitoring software. Studies have also shown that given MPS providers who replenish based on percentage of supply remaining create duplicate shipments between 5 and 15% of the time. (This is due to the variability in reporting of percent of supplies remaining based on end user behaviors.) This invention virtually eliminates this risk.

The Web Interface, available to both end users and MPS providers, provides "real time" information on supplies replenishment status based on current usage patterns as well as the status of any service required for output devices. This Web Interface also enables either the end user customer or the MPS provider to load or update the output device location information used on the Supplies Routing Label. In addition, the web interface enables users to access an interactive knowledge base to diagnose document output device issues or initiate and learn the status of all documents output device service requests. Additional capabilities may be incorporated into the web interface to allow additional sharing of data with an MPS provider's ERP system, such as current costs for new output devices.

The Supplies Routing Label virtually eliminates the frustration and confusion of determining which supply item belongs to which output device when the supply is delivered to the end user customer environment. The label has all of the necessary information about the output device, including asset ID number, serial number, output device brand and model, and location information. The location information is described by the end user customer, which enables the supply item to be routed based on how the end user customer identifies the location of the output device.

The Proactive Service Alerts greatly improve on the ability of the MPS provider to manually sort through service alerts sent from remote data collection software tools. Today, MPS providers must sort through hundreds (often thousands) of emails per day to determine if any alerts are indicative of an output device failure that must be resolved. With PSA, the alerts provided by the remote data collection software tools are pulled into the Interim Database where the data is parsed and analyzed to determine and classify severity of errors. Only the resulting analysis (the PSA) is provided to the MPS provider, which dramatically lowers the resource requirements of the MPS provider to analyze and act upon output device service alerts.

The Break/Fix Service Ticketing Module allows for System integration of troble call management. It has allowed automation of service provider and parts provider selection, as well as providing step by step process to handle each ticket, and track progress throughout the process. It also allows for feeding Knowledgebase for arming dealers, end users, and service desk personnel with a more proactive means of addressing issues, and minimizing actual on site visits. The module also enables more robust reporting for dealers and internal resources to track service metrics and issues, thus enabling better response and resource allocation.

The embodiments were chosen and described to best explain the principles of the invention and its practical application to persons who are skilled in the art. As various modifications could be made to the exemplary embodiments, as described above with reference to the corresponding illustrations, without departing from the scope of the invention, it is intended that all matter contained in the foregoing description and shown in the accompanying drawings shall be interpreted as illustrative rather than limiting. Thus, the breadth and scope of the present invention should not be limited by any of the above-described exemplary embodiments, but should be defined only in accordance with the following claims appended hereto and their equivalents.

What is claimed is:

1. A system for analyzing, optimizing and managing a plurality of document output devices that are operatively connected to data collection systems over a communications network, comprising:

a communications interface for receiving device-specific data for the document output devices from the data collection systems through the communications network, wherein said device-specific data is comprised of a plurality of formats according to the respective data collection systems from which said device-specific data is received;

a computer processor in operative communication with said communications interface, wherein said computer processor comprises a reconciling module to transform said plurality of formats for said device-specific data into a standardized device-specific dataset, said computer processor further comprising at least one module selected from the group consisting of a service evaluation module, a supply replenishment module, a routing label module, a service monitoring module, a service ticketing module, and any combination thereof;

a database in operative communication with said computer processor, wherein said database comprises a logical correlation between a plurality of user accounts and corresponding sets of the document output devices and a memory storage containing said standardized device-specific dataset according to said logical correlation;

a replenishment supply part used in one of the document output devices; and a portable printer in networked communication with said computer processor and said database through said communications interface, wherein said computer processor queries said database, determines an in-service replenishment supply part is at a replacement level, and automatically communicates a print job to said portable printer through said communications interface for said replenishment supply part, wherein said print job instructs said portable printer to print a supply routing label having a unique device location identifier for one of the document output devices, and wherein said supply routing label is affixed to said replenishment supply part.

2. The invention of claim 1, wherein said database uniquely identifies the document output devices and categorizes the document output devices according to a plurality of manufacturer brands, a plurality of device models, a plurality of replenishment supply parts, and a plurality of shipping addresses, wherein said portable printer prints a plurality of supply routing labels with a set of unique device location identifiers corresponding to the document output devices that are uniquely identified by said database and are categorized according to said replenishment supply parts, and wherein said set of unique device location identifiers are respectively affixed to said plurality of replenishment supply parts for the corresponding document output devices.

3. The invention of claim 2, wherein said portable printer is further comprised of a scanner and a display, wherein said shipping addresses are comprised of postal addresses and corresponding device location identifiers, wherein a set of different document output devices uniquely correspond with a set of different device location identifiers for a particular one of said postal addresses, wherein at least one of said replenishment supply parts is flagged as an order for a corresponding one of the document output devices, wherein said order is identified on said display, wherein said scanner produces a selection of said flagged replenishment supply parts, wherein said selection is operatively communicated to said computer processor, wherein said computer processor retrieves said unique device location identifier from said database for the corresponding one of the document output devices and communicates said unique device location identifier to said portable printer in said print job, and wherein said supply routing label is applied to said flagged replenishment supply part.

4. The invention of claim 3, further comprising a shipping container, a selection of replenishment supply parts and a plurality of supply routing labels, wherein said particular postal address is shown on an exterior face of said shipping container, wherein said routing label module defines said selection of replenishment supply parts to be collected in said shipping container for said set of different document output devices, and wherein said routing label module defines said device identifiers printed on said supply routing labels by said portable printer and respectively applied to said selection of replenishment supply parts according to said set of different document output devices.

5. The invention of claim 2, wherein said database identifies a same device model for document output devices having different device model names in said data collection systems and categorizes usage information for the document output devices according said same device model.

6. The invention of claim 2, wherein said computer processor averages usage data according to said models for a plurality of document output devices, wherein the document output devices correspond to a particular user account or to a plurality of user accounts.

7. The invention of claim 2, wherein said computer processor comprises usage tracking logic for document output devices, wherein said usage tracking logic performs comparisons of periodic usage amounts for document output devices relative to lifetime usage amounts for corresponding document output device models and estimates phase out dates for the document output devices according to said comparisons.

8. The invention of claim 2, wherein said service evaluation module comprises a financial build logic and assumptive cost values, wherein said financial build logic comprises an importation of existing costs for document output device models from the standardized device-specific dataset and a selection of assumptive cost values, wherein said financial build logic provides a plurality of selection options for a plurality of managed print service evaluation factors and automatically creates a managed print services proposal using said existing costs and said selection of assumptive cost values.

9. The invention of claim 8, wherein said selection of assumptive cost values used in said financial build logic is performed automatically by said service evaluation module selecting values from said database and without any manual entry of said values into said financial build logic.

10. The invention of claim 2, wherein said supply replenishment module comprises shipping efficiency logic for said user accounts, replenishment-required limits for said replenishment supply parts corresponding with the document output devices, and replenishment-optional limits for said replenishment supply parts, wherein said replenishment-optional limit is higher than a replenishment-required limit for a particular replenishment supply part, wherein said shipping efficiency logic identifies document output devices of a particular user account which have reached said replenishment-optional limit when at least one document output device of said user account has reached said replenishment-required limit, wherein said supply replenishment module automatically identifies a set of said replenishment supply parts corresponding with said document output devices which have reached said replenishment-optional limit and said replenishment-required limit, and wherein said supply replenishment module produces a set of unique device location identifiers corresponding with said set of said replenishment supply parts.

11. The invention of claim 10, wherein said portable printer is further comprised of a scanner and a display, wherein said supply replenishment module automatically communicates said set of replenishment supply parts to said portable printer, wherein said display identifies said set of replenishment supply parts to be retrieved, wherein said scanner scans a replenishment supply part and produces a selection of said replenishment supply part, wherein said selection is operatively communicated from said portable printer to said supply replenishment module, wherein said supply replenishment module retrieves said unique device location identifier from said database for the corresponding one of the document output devices and communicates said unique device location identifier to said portable printer in said print job, wherein said supply routing label is applied to said selection of said replenishment supply part, and wherein a set of said supply routing labels are produced for said set of replenishment supply parts by said portable printer in operative communication with said supply replenishment module.

12. The invention of claim 2, wherein said supply replenishment module comprises usage patterns of the document output devices, a yield of said replenishment supply parts, a reorder lead time in days and a predictive supply logic for said user accounts, wherein said predictive supply logic evaluates said patterns and said reorder lead time relative to said yield to determine a replacement trigger threshold, wherein said supply replenishment module further comprises a trigger threshold check logic and a replacement monitoring logic, wherein said trigger threshold check logic comprises at least one of a proximity check and a back-up check, wherein said back-up check is a plurality of checks selected from the group of a manufacturer brand check, a supply reading check, a threshold range check, a device history check, a usage consistency check, and a minimum allowed check, and wherein said replacement monitoring logic comprises a supply level evaluation and a false-positive check.

13. The invention of claim 2, wherein said service monitoring module comprises a plurality of alert parameters, status information from the database corresponding with the document output devices and a service alert logic, wherein said service alert logic compares said status information with said alert parameters, determines a severity of errors from said status information and said alert parameters, an evaluates patterns of errors for a service alert report sent through the communications interface.

14. The invention of claim 2, wherein said service ticketing module comprises a plurality of trouble tickets identifying a plurality of technical issues with the document output devices, wherein said service ticketing module further comprises a plurality of articles on solutions to a plurality of known issues and a troubleshooting recommendation knowledge base whereby one or more of said articles are assigned to one or more trouble tickets.

15. The invention of claim 1, further comprising a web interface in operative communication with said database through said communications interface, wherein said web interface comprises an interactive module for access to said database, said service evaluation module, said supply replenishment module, said routing label module, said service monitoring module, and said service ticketing module by a print manager service group selected from a reseller, a distributor, an end user and any combination thereof, said interactive module communicating said standardized device-specific dataset with the user group without accessing the data collection systems.

16. A system for analyzing, optimizing and managing a plurality of document output devices that are operatively connected to data collection systems over a communications network, comprising:

a communications interface for receiving device-specific data for the document output devices from the data collection systems through the communications network, wherein said device-specific data is comprised of a plurality of formats according to the respective data collection systems from which said device-specific data is received;

a database comprising a logical correlation between a plurality of user accounts and corresponding sets of the document output devices and a memory storage containing a standardized device-specific dataset according to said logical correlation, wherein said database uniquely identifies each one of the document output devices and categorizes the document output devices according to a plurality of manufacturer brands, a plurality of device models, a plurality of replenishment supply parts, and a plurality of shipping addresses;

a computer processor in operative communication with said communications interface and said database, wherein said computer processor comprises a reconciling module, a service evaluation module and a supply replenishment module, wherein said reconciling module transforms said plurality of formats for said device-specific data into said standardized device-specific dataset, wherein said service evaluation module comprises a financial build logic and assumptive cost values, wherein said financial build logic comprises an importation of existing costs for document output device models from the standardized device-specific dataset and a selection of assumptive cost values, wherein said financial build logic provides a plurality of selection options for a plurality of managed print service evaluation factors and automatically creates a managed print services proposal using said existing costs and said selection of assumptive cost values, wherein said supply replenishment module comprises shipping efficiency logic for said user accounts, replenishment-required limits for said replenishment supply parts corresponding with the document output devices, and replenishment-optional limits for said replenishment supply parts, wherein said replenishment-optional limit is higher than a replenishment-required limit for a particular replenishment supply part, and wherein said shipping efficiency logic identifies document output devices of a particular user account which have reached said replenishment-optional limit when at least one document output device of said user account has reached said replenishment-required limit, wherein said supply replenishment module queries said database, determines at least one of said replenishment supply parts has reached said replenishment-required limit, and automatically identifies a set of said replenishment supply parts corresponding with said document output devices which have reached said replenishment-optional limit and said replenishment-required limit, and wherein said supply replenishment module produces a set of unique device location identifiers corresponding with said set of said replenishment supply parts; and a portable printer in networked communication with said computer processor and said database through said communications interface, wherein said portable printer is further comprised of a scanner and a display, wherein said supply replenishment module automatically communicates said set of replenishment supply parts to said portable printer, wherein said display identifies said set of replenishment supply parts to be retrieved, wherein said scanner scans a replenishment supply part and produces a selection of said replenishment supply part, wherein said selection is operatively communicated from said portable printer to said supply replenishment module, wherein said supply replenishment module retrieves said device location identifier from said database for the corresponding one of the document output devices and communicates said unique device location identifier to said portable printer to print a supply routing label having said unique device location identifier for one of the document output devices, wherein said supply routing label is applied to said selection of said replenishment supply part, and wherein a set of said supply routing labels are produced for said set of replenishment supply parts by said portable printer in operative communication with said supply replenishment module.

17. The invention of claim 16, wherein each of said shipping addresses is comprised of postal addresses and corresponding device location identifiers, wherein a set of different document output devices uniquely correspond with a set of different device location identifiers for a particular one of said postal addresses.

18. The invention of claim 17, further comprising a shipping container, a selection of replenishment supply parts and a plurality of supply routing labels, wherein said particular postal address is shown on an exterior face of said shipping container, wherein said selection of replenishment supply parts are held within said shipping container, wherein device identifiers corresponding with said set of different document output devices are provided on said supply routing labels, and wherein said supply routing labels are attached to said replenishment supply parts according to said set of different document output devices and said corresponding device identifiers.

19. The invention of claim 16, wherein said database identifies a same device model for document output devices having different device model names in said data collection systems and categorizes usage information for the document output devices according said same device model, wherein said computer processor averages usage data according to said models for a plurality of document output devices, and wherein said computer processor comprises usage tracking logic comparing periodic usage amounts for document output devices relative to lifetime usage amounts for corresponding document output device models and estimates phase out dates for the document output devices according to said comparisons.

20. A system for analyzing, optimizing and managing a plurality of document output devices that are operatively connected to data collection systems over a communications network, comprising:
a communications interface for receiving device-specific data for the document output devices from the data collection systems through the communications network, wherein said device-specific data is comprised of a plurality of formats according to the respective data collection systems from which said device-specific data is received;
a computer processor in operative communication with said communications interface, wherein said computer processor comprises a reconciling module and a supply replenishment module, wherein said reconciling module transforms said plurality of formats for said device-specific data into a standardized device-specific dataset;
a database in operative communication with said computer processor, wherein said database comprises a logical correlation between a plurality of user accounts and corresponding sets of the document output devices and a memory storage containing said standardized device-specific dataset according to said logical correlation, wherein said database uniquely identifies each one of the document output devices and categorizes the document output devices according to a plurality of manufacturer brands, a plurality of device models, a plurality of replenishment supply parts, a plurality of shipping addresses, and a plurality of unique device location identifiers respectively corresponding to multiple locations for the document output devices at a particular one of said shipping addresses;
a portable printer in networked communication with said computer processor and said database through said communications interface, wherein said portable printer is further comprised of a display and a scanner; and
wherein said supply replenishment module comprises a supply correlation logic, wherein said supply replenishment module queries said database, determines at least one of said replenishment supply parts is at a replacement level, and automatically communicates a set of replenishment supply parts to be retrieved to said portable printer, wherein said display identifies said set of replenishment supply parts to be retrieved, wherein said scanner scans said set of replenishment supply parts and produces a corresponding set of selections of said replenishment supply parts, wherein said selections are operatively communicated from said portable printer to said supply replenishment module, wherein said supply correlation logic retrieves said unique device location identifiers from said database for the corresponding document output devices and communicates said unique device location identifiers to said portable printer, wherein said portable printer produces a set of supply routing labels with said unique device location identifiers, and wherein said set of supply routing labels are affixed to said set of replenishment supply parts corresponding with the document output devices.

21. The invention of claim 20, wherein said computer processor further comprises a service evaluation module, wherein said service evaluation module comprises a financial build logic, said financial build logic replacing a plurality of missing device-specific data entries with industry-standard assumptive costs from said database without any manual entry of said industry-standard assumptive costs, performing a managed print service evaluation on a cost-per-image basis using said standardized device-specific dataset and said industry-standard assumptive costs, providing a comparison of current costs and proposed costs, and creating a managed print services proposal using said standardized device-specific dataset and said industry-standard assumptive costs.

22. The invention of claim 20, wherein said supply replenishment module further comprises a predictive supply logic and a shipping efficiency logic, said predictive supply logic evaluating usage patterns of the document output devices and a reorder lead time relative to a yield of said replacement supply parts to determine a replenishment limit, said shipping efficiency logic identifying document output devices of a particular user account which have reached a replenishment-optional limit when at least one document output device of said user account has reached a replenishment-required limit, wherein said replenishment-optional limit is higher than said replenishment-required limit.

* * * * *